United States Patent
Isa et al.

(10) Patent No.: US 7,635,889 B2
(45) Date of Patent: Dec. 22, 2009

(54) SEMICONDUCTOR DEVICE, ELECTRONIC DEVICE, AND METHOD OF MANUFACTURING SEMICONDUCTOR DEVICE

(75) Inventors: Toshiyuki Isa, Kanagawa (JP); Gen Fujii, Kanagawa (JP); Masafumi Morisue, Kanagawa (JP); Ikuko Kawamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 462 days.

(21) Appl. No.: 11/333,701

(22) Filed: Jan. 17, 2006

(65) Prior Publication Data

US 2006/0170111 A1    Aug. 3, 2006

(30) Foreign Application Priority Data

Jan. 28, 2005    (JP) .............................. 2005-022214

(51) Int. Cl.
*H01L 23/48* (2006.01)

(52) U.S. Cl. .......................... 257/309; 257/4; 257/249; 257/347

(58) Field of Classification Search ................ 257/347, 257/4, 249, 309, E29.12
See application file for complete search history.

(56) References Cited

U.S. PATENT DOCUMENTS

| | | | | |
|---|---|---|---|---|
| 5,612,565 A * | 3/1997 | Kusumoto | .................. | 257/401 |
| 5,753,942 A * | 5/1998 | Seok | .......................... | 257/133 |
| 6,040,609 A * | 3/2000 | Frisina et al. | ................ | 257/391 |
| 6,060,747 A * | 5/2000 | Okumura et al. | ............ | 257/331 |
| 6,344,379 B1 * | 2/2002 | Venkatraman et al. | ...... | 438/192 |
| 6,504,244 B2 | 1/2003 | Ichinose et al. | | |
| 6,651,281 B1 * | 11/2003 | Figiel | ............................ | 5/612 |
| 6,680,772 B2 * | 1/2004 | Lee | .............................. | 349/141 |
| 6,715,871 B2 | 4/2004 | Hashimoto et al. | .......... | 347/102 |
| 6,890,050 B2 * | 5/2005 | Ready et al. | .................. | 347/19 |
| 6,924,863 B2 * | 8/2005 | Nishida et al. | ............... | 349/141 |
| 6,994,414 B2 | 2/2006 | Hashimoto et al. | | |
| 7,092,049 B2 * | 8/2006 | Kadotani et al. | ............. | 349/110 |
| 7,199,033 B2 * | 4/2007 | Hirai et al. | .................. | 438/584 |
| 7,368,331 B2 * | 5/2008 | Hirai | .......................... | 438/149 |
| 2002/0024626 A1 * | 2/2002 | Lee et al. | ..................... | 349/141 |
| 2002/0131005 A1 * | 9/2002 | Yang | ........................... | 349/141 |
| 2003/0083203 A1 | 5/2003 | Hashimoto et al. | .......... | 505/100 |
| 2003/0232128 A1 | 12/2003 | Furusawa et al. | ............. | 427/58 |
| 2004/0226929 A1 | 11/2004 | Miura et al. | | |
| 2005/0141276 A1 * | 6/2005 | Takeuchi et al. | ....... | 365/185.18 |
| 2006/0169973 A1 | 8/2006 | Isa et al. | | |
| 2006/0170077 A1 | 8/2006 | Aoki et al. | | |

FOREIGN PATENT DOCUMENTS

JP        11-207959        8/1999

(Continued)

*Primary Examiner*—Eugene Lee
(74) *Attorney, Agent, or Firm*—Cook Alex Ltd.

(57) ABSTRACT

Conductive layers having knots are adjacently formed with uniform distance therebetween. Droplets of the conductive layers are discharged to stagger centers of the droplets in a length direction of wirings so that the centers of the discharged droplets are not on the same line in a line width direction between the adjacent conductive layers. Since the centers of the droplets are staggered, parts of the conductive layers each having a widest line width (the widest width of knot) are not connected to each other, and the conductive layers can be formed adjacently with a shorter distance therebetween.

15 Claims, 36 Drawing Sheets

FOREIGN PATENT DOCUMENTS

| | | |
|---|---|---|
| JP | 11-251259 | 9/1999 |
| JP | 2003-080694 | 3/2003 |
| JP | 2003-133691 | 5/2003 |
| JP | 2003-311196 | 11/2003 |
| JP | 2003-315813 | 11/2003 |
| JP | 2004-335849 | 11/2004 |
| JP | 2004-351305 | 12/2004 |
| JP | 2004-356321 | 12/2004 |

* cited by examiner

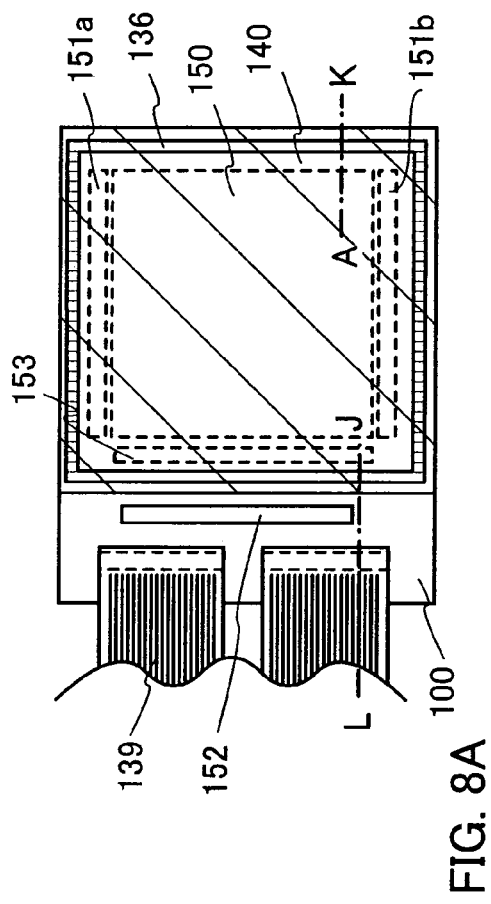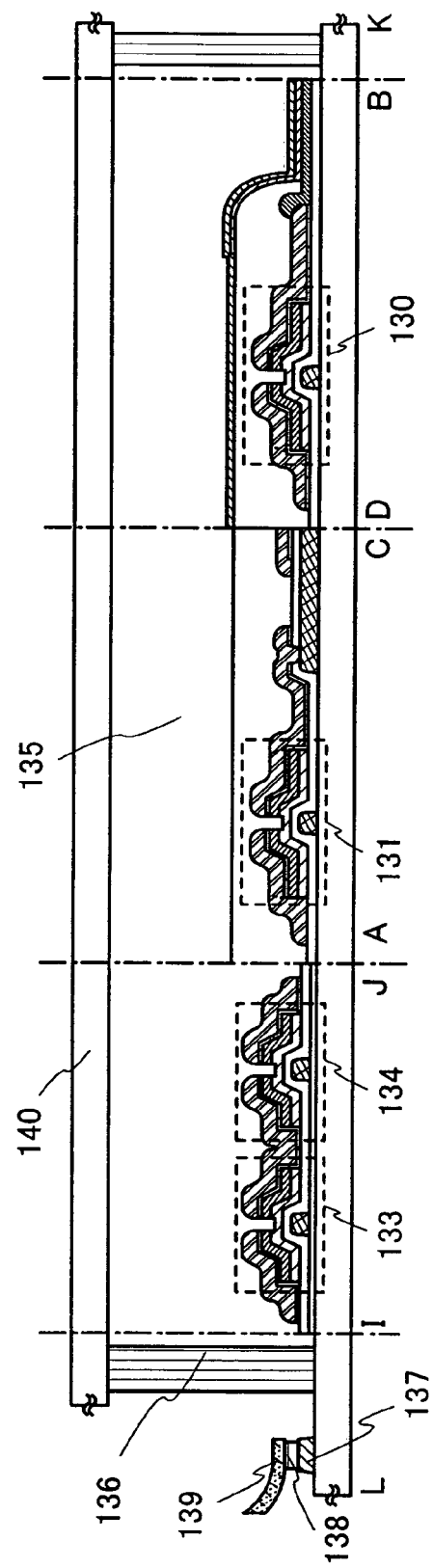
FIG. 8A
FIG. 8B

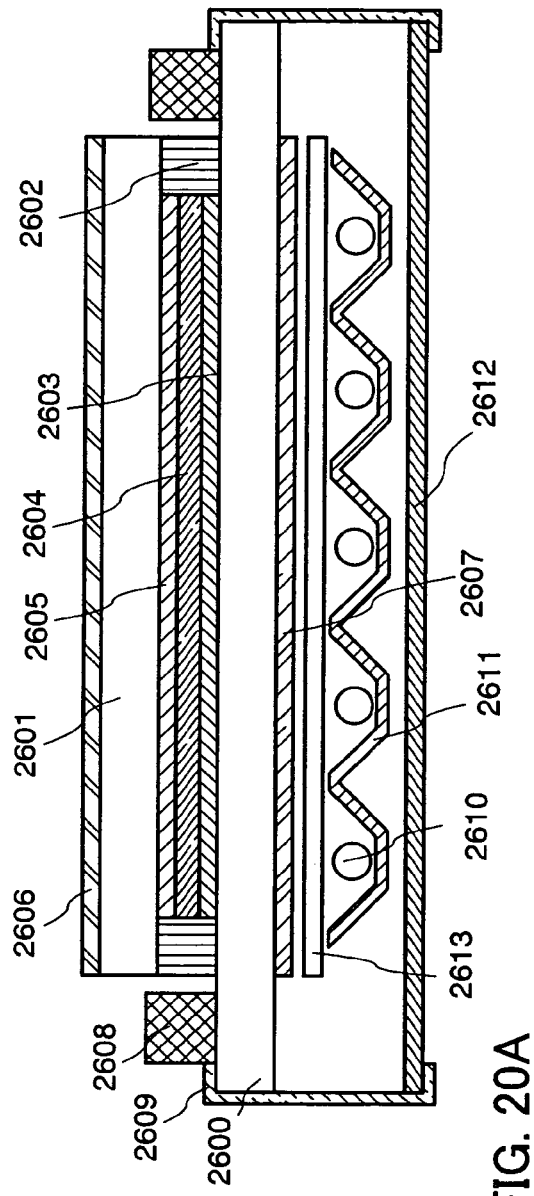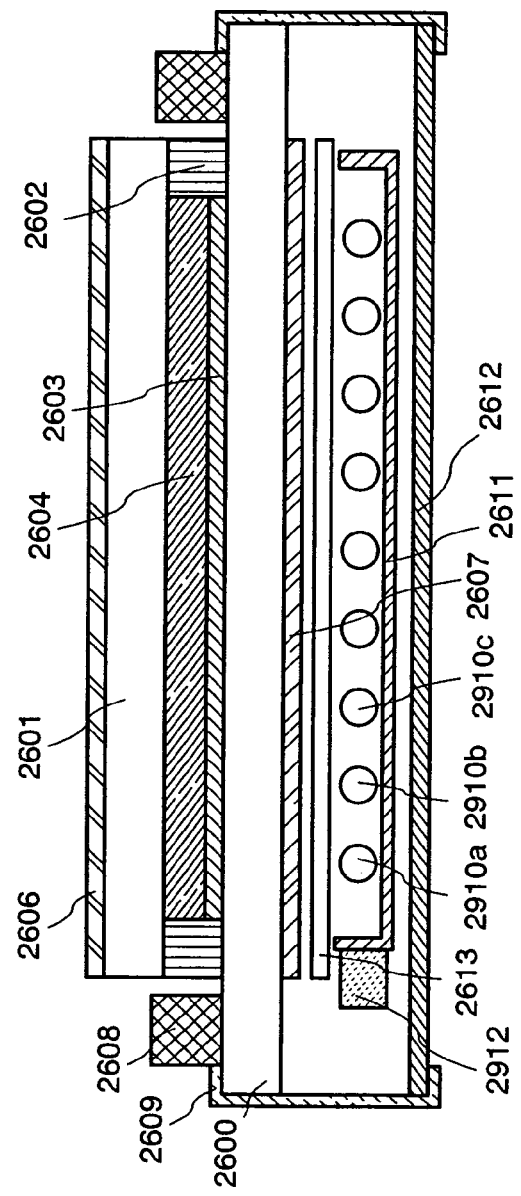
FIG. 20A
FIG. 20B

SEMICONDUCTOR DEVICE, ELECTRONIC DEVICE, AND METHOD OF MANUFACTURING SEMICONDUCTOR DEVICE

BACKGROUND OF THE INVENTION

1. Field of the Invention

The present invention relates to a semiconductor device, an electronic device, and a method of manufacturing a semiconductor device by using a printing method.

2. Description of the Related Art

In a thin film transistor (hereinafter also referred to as TFT) and an electronic circuit using the thin film transistor, various thin films of a semiconductor, an insulator, a conductor, and the like are laminated over a substrate, and they are appropriately processed into predetermined patterns by a photolithography technique. The photolithography technique is a technique in which a pattern of a circuit or the like which is formed using a material that does not transmit light over a transparent flat plate which is referred to as a photomask is transferred to an intended substrate by utilizing light. The photolithography technique is widely used in a process of manufacturing a semiconductor integrated circuit and the like.

The conventional manufacturing process using the photolithography technique requires multiple steps such as exposure, development, baking, and peeling only for treating a mask pattern formed by using a photosensitive organic resin material that is referred to as a photoresist. Therefore, the manufacturing cost is inevitably increased as the number of the photolithography steps is increased. In order to solve this problem, it has been attempted to manufacture TFTs with lower number of photolithography steps (Reference 1: Japanese Patent Laid-Open No. H 11-251259).

SUMMARY OF THE INVENTION

It is an object of the present invention to provide a technique of manufacturing a TFT, an electronic circuit using the TFT, a semiconductor device, or a display device formed using the TFT over a large size substrate having a side of 1 meter or more with high yield at low cost by reducing the number of photolithography steps and thereby simplifying the manufacturing process.

Further, it is an object of the present invention to provide a technique of stably forming a component such as a wiring included in the semiconductor device or the display device, with a desired shape.

In the present invention, a liquid composition is attached to a formation region, where wettability is controlled, in several separate dischargings, and adjacent conductive layers, an insulating layer used as a mask layer for forming the adjacent conductive layers, or the like is/are formed by solidifying the liquid composition by baking, drying, or the like. When the composition is discharged several separate times, a stable pattern shape can be obtained without disconnection due to aggregation of droplets or the like. In the conductive layer or the insulating layer formed in the above manner, a droplet discharged in a latter step does not stay in an aimed position because of difference in wettability of formation regions, and moves to a high wettability region to be stabilized. Therefore, the obtained conductive layer or the mask layer has a knotty shape with different line widths. In addition, the line widths change continuously, and a widest line width and a narrowest line width repeat regularly. Here, the widest line width is not necessarily constant all along the conductive layer or the mask layer, but strictly refers to a local maximal width of the conductive layer or the mask layer. Similarly, the narrowest line width is not necessarily constant all along the conductive layer or the mask layer, but strictly referes to a local minimal width of the conductive layer or the mask layer.

In the invention, conductive layers having knots are adjacently formed with a uniform distance therebetween. Droplets for the conductive layers are discharged to stagger centers of the droplets in a length direction between the adjacent conductive layers so that the centers of the discharged droplets are not on the same line in a line width direction between the adjacent conductive layers. That is, each droplet of a conductive layer is not directly aligned with each droplet of adjacent conductive layers in a line width direction. Since the centers of the droplets are staggered, parts of the respective conductive layers having a widest line width (the widest width of knot) are not adjacent to each other, and the conductive layers can be formed adjacently with a shorter distance therebetween.

Further, the conductive layer (wiring) or the insulating layer formed in the invention includes a plurality of thicknesses as well as side portions and has a projection and a depression on the surface, which reflects the droplets. This is because the conductive layer or the insulating layer is formed by solidifying a liquid composition containing a conductive or insulative material and by drying or baking after discharging. This applies to a mask layer which is formed by using the invention, and the mask layer includes a plurality of film thicknesses and a projection and a depression on the surface. Therefore, the shape of the conductive layer or the insulating layer which is processed by using such a mask layer reflects the mask shape. The shape of the projection and the depression on the surface and the size are varied depending on the viscosity of the liquid composition, a drying step for solidifying the liquid composition by removing a solvent, or the like.

Wettability of a surface of a solid object is affected by a state of the surface. When a substance having low wettability with respect to a liquid composition is formed, the surface becomes a region having low wettability with respect to the liquid composition (hereinafter, also referred to as a low wettability region). On the other hand, when a substance having high wettability with respect to a liquid composition is formed, the surface becomes a region having high wettability with respect to the liquid composition (hereinafter, also referred to as a high wettability region). In the invention, a treatment of controlling wettability of a surface means to form regions each having different wettability with respect to a liquid composition in a region to be attached with the liquid composition.

Regions having different wettability are those having different wettability with respect to a liquid composition and those having different contact angles of the liquid composition. A region having a large contact angle of a liquid composition is a low wettability region, whereas a region having a small contact angle is a high wettability region. In the case that the contact angle is large, a liquid composition having fluidity does not spread on a surface of a region, is repelled by the surface, and does not wet the surface. In the case that the contact angle is small, the liquid composition having fluidity spreads on the surface and wets the surface more. Therefore, regions having different wettability have different surface energy. A surface of a low wettability region has low surface energy, and a surface of a high wettability region has high surface energy.

In this specification, a semiconductor device indicates a device, which can operate by utilizing semiconductor characteristics. By using the present invention, a semiconductor device such as a multi-layered wiring, a chip including a processor circuit (hereinafter also referred to as a processor chip), or the like can be manufactured.

The invention can be applied to a display device which is a device having a display function. The display device using the present invention includes a light emitting display device in which a TFT is connected to a light emitting element in which a layer containing an organic material or a mixture of organic and inorganic materials which emit light, called electroluminescence (also referred to as EL) is interposed between electrodes, a liquid crystal display device using a liquid crystal element having a liquid crystal material as a display element, or the like.

One feature of a semiconductor device of the present invention is to include a first wiring having a plurality of line widths and curving in at least one portion and a second wiring having a plurality of line widths and curving in at least one portion, in which the first wiring is symmetrical along the centerline, the second wiring is symmetrical along the centerline, and a distance between the first and the second wirings is uniform.

One feature of a semiconductor device of the present invention is to include a first conductive layer in which the line width is continuously varied and a second conductive layer in which the line width is continuously varied, in which side portions of the first and the second conductive layers each have a continuous wave shape, and a distance between the first and the second conductive layers is uniform.

One feature of a semiconductor device of the present invention is to include a gate electrode layer, a gate insulating layer, a semiconductor layer, a source electrode layer, and a drain electrode layer, in which the source and the drain electrode layers have a plurality of line widths and curve in at least one portion, the source electrode layer is symmetrical along a centerline, the drain electrode layer is symmetrical along a centerline, and a distance between the source and the drain electrode layers is uniform.

One feature of a semiconductor device of the present invention is to include a gate electrode layer, a gate insulating layer, a semiconductor layer, a source electrode layer, and a drain electrode layer, in which line widths of the source and the drain electrode layers are continuously varied; side portions of the first and the second conductive layers each have a continuous wave shape; and a distance between the source and the drain electrode layers is uniform.

One feature of a method of manufacturing a semiconductor device of the present invention is to include the steps of discharging, over a substrate, first droplets having centers on a first line over the substrate and second droplets having centers on a second line parallel to the first line in a first discharging step of a plurality of droplets made of a composition containing a conductive material; discharging, in a second discharging step of the plurality of droplets, a third droplet having a center on the first line between the first droplets to form a first conductive layer which is line symmetrical along the first line and has a plurality of line widths; and discharging, in a second discharging step of the plurality of droplets, a fourth droplet having a center on the second line between the second droplets to form a second conductive layer which is line symmetrical along the second line and has a plurality of line widths, in which the first and the second conductive layers are formed with uniform distance therebetween.

One feature of the method of manufacturing the semiconductor device of the present invention is to include the steps of discharging, over a substrate, first droplets having centers on a first line over the substrate and second droplets having centers on a second line parallel to the first line in a first discharging step of a plurality of droplets made of a composition containing a conductive material; discharging, in a second discharging step of the plurality of droplets, a third droplet having a center on the first line between the first droplets to form a first conductive layer which has a continuous wave shape at a side portion and a continuously varying line width; discharging, in a second discharging step of the plurality of droplets, a fourth droplet having a center on the second line between the second droplets to form a second conductive layer which has a continuous wave shape at a side portion and a continuously varying line width, in which the first and the second conductive layers are formed with uniform distance therebetween.

One feature of the method of manufacturing the semiconductor device of the present invention is to include the steps of forming a conductive film over a substrate; discharging, over the conductive film, first droplets having centers on a first line over the substrate and second droplets having centers on a second line parallel to the first line in a first discharging step of a plurality of droplets made of a composition containing a mask layer material; discharging, in a second discharging step of the plurality of droplets, a third droplet having a center on the first line between the first droplets to form a first mask layer which is symmetrical along the first line and has a plurality of line widths; discharging, in a second discharging step of the plurality of droplets, a fourth droplet having a center on the second line between the second droplets to form a second mask layer which is symmetrical along the second line and has a plurality of line widths; and processing the conductive film using the first and the second mask layers to form first and second conductive layers with uniform distance therebetween.

One feature of the method of manufacturing the semiconductor device of the present invention is to include the steps of forming a conductive film over a substrate; discharging, over the conductive film, first droplets having centers on a first line over the substrate and second droplets having centers on a second line parallel to the first line in a first discharging step of a plurality of droplets made of a composition containing a mask layer material; discharging, in a second discharging step of the plurality of droplets, a third droplet having a center on the first line between the first droplets to form a first mask layer which has a continuous wave shape at a side portion and a continuously varying line width; discharging, in a second discharging step of the plurality of droplets, a fourth droplet having a center on the second line between the second droplets to form a second mask layer which has a continuous wave shape at a side portion and a continuously varying line width; and processing the conductive film using the first and second mask layers to form first and the second conductive layers with uniform distance therebetween.

In accordance with the present invention, a component such as a wiring or the like included in a semiconductor device, a display device, or the like can be stably formed with a desired shape. Further, material loss and cost can be reduced. Hence, a semiconductor device and a display device with high performance and high reliability can be manufactured with high yield.

BRIEF DESCRIPTION OF THE DRAWINGS

In the accompanying drawings:

FIGS. 8A and 8B show a display device of the present invention;

FIGS. 20A and 20B are sectional views showing structural examples of a liquid crystal display module of the present invention;

DETAILED DESCRIPTION OF THE INVENTION

Figure 1A:
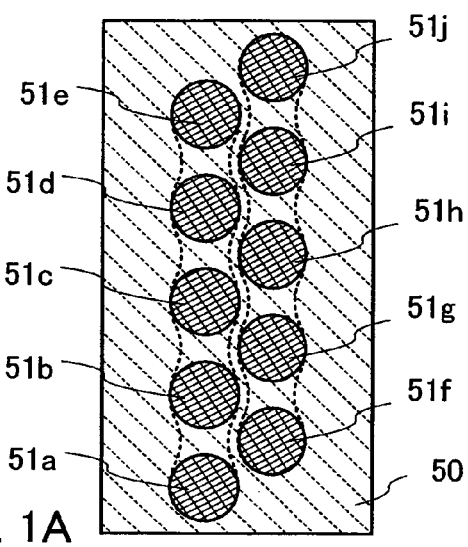
FIGS. 1A to 1C are schematic views of the present invention.

Embodiment mode of the invention will be described in detail with reference to the drawings. However, it is easily understood by those skilled in the art that the invention is not limited by the following descriptions and various changes may be made in forms and details without departing from the spirit and the scope of the invention. Therefore, the invention should not be limited to descriptions of Embodiment modes below. The same reference numerals are commonly given to the same components or components having the same function in the structure of the invention, and a repetitive explanation will be omitted.

Embodiment Mode 1

Embodiment Mode 1 of the present invention will be described with reference to FIGS. 1A to 1C.

One feature of the present invention is that at least one or more of components required to manufacture a semiconductor device or a display device, such as a conductive layer for forming a wiring layer or an electrode, or a mask layer for forming a predetermined pattern, is/are formed by a method capable of selectively forming a pattern into a desired shape to manufacture a semiconductor device or a display device. In the present invention, a component (also referred to as a pattern) refers to a conductive layer such as a wiring layer, a gate electrode layer, a source electrode layer, or a drain electrode layer; a semiconductor layer; a mask layer; an insulating layer; or the like, which is included in a thin film transistor or a display device, and includes all components that are formed to have a predetermined shape. A droplet discharge (ejection) method (also referred to as an ink-jet method, depending on its mode), that can form a conductive layer, an insulating layer, or the like into a predetermined pattern by selectively discharging (ejecting) a droplet of a composition mixed for a particular purpose, is employed as the method capable of selectively forming a substance to be formed into a desired pattern. In addition, a method capable of transferring or drawing a component into a desired pattern, for example, various printing methods (a method of forming a substance to be formed into the desired pattern, such as screen (mimeograph) printing, offset (planograph) printing, relief printing, gravure (intaglio) printing, or the like), a dispenser method, a selective-coating method, or the like can also be employed.

This embodiment mode uses a method of discharging (ejecting) a composition containing a component forming material, which is fluid, as a droplet to form the composition containing a component forming material into a desired pattern. A droplet containing the component forming material is discharged to a component formation region, and the composition is fixed by baking, drying, and the like to form a component having a desired pattern.

Figure 25:
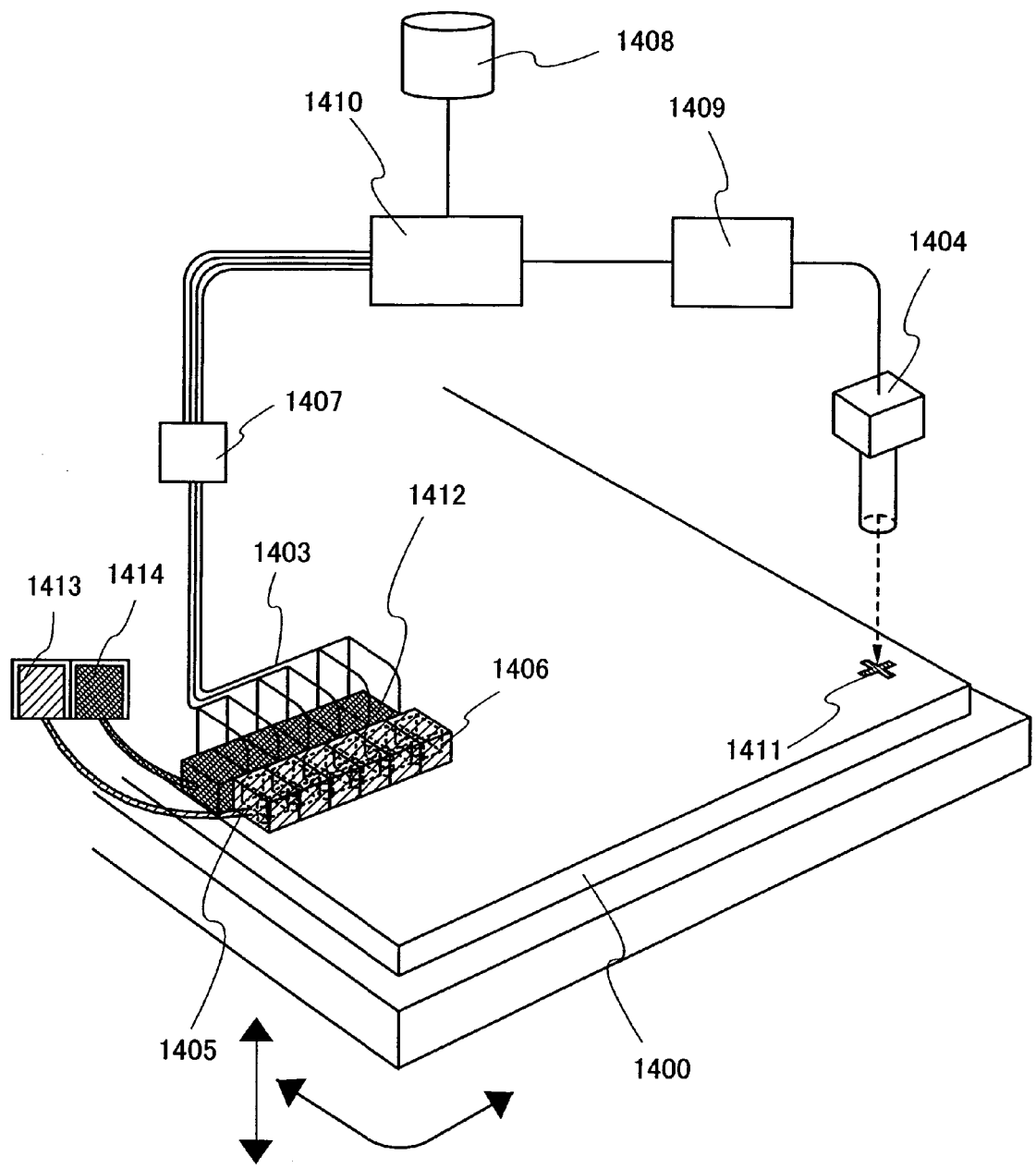
FIG. 25 shows a structure of a droplet discharge apparatus applicable to the present invention.

One mode of a droplet discharge apparatus used for a droplet discharge method is shown in FIG. 25. Each of heads 1405 and 1412 of a droplet discharge apparatus 1403 is connected to a control device 1407, and this control device 1407 is controlled by a computer 1410, so that a preprogrammed pattern can be formed. The formation position may be determined, for example, based on a marker 1411 that is formed over a substrate 1400. Alternatively, a reference point may be fixed based on an edge of the substrate 1400. The reference point is detected by an imaging device 1404, and changed into a digital signal by an image processing circuit 1409. Then, the digital signal is recognized by the computer 1410 to generate a control signal, and the control signal is transmitted to the control device 1407. An image sensor or the like using a charge coupled device (CCD) or a complementary metal oxide semiconductor can be used as the imaging device 1404. Naturally, information about a pattern to be formed over the substrate 1400 is stored in a storage medium 1408, and the control signal is transmitted to the control device 1407 based on the information, so that each head 1405 and 1412 of the droplet discharge apparatus 1403 can be individually controlled. The heads 1405 and 1412 are supplied with a material to be discharged from material supply sources 1413 and 1414 through pipes, respectively.

The head 1405 has an inside structure which has a space filled with a liquid material as shown by dotted lines 1406 and a nozzle which is a discharge opening. Although it is not shown, the inside structure of the head 1412 is similar to that of the head 1405. When the nozzle sizes of the heads 1405 and 1412 are different from each other, different materials with different widths can be discharged simultaneously. Also, a conductive material, an organic material, an inorganic material, or the like can be each discharged from one head. In a case of drawing over a wide area such as an interlayer film, one material can be simultaneously discharged from a plurality of nozzles to improve throughput, and thus, drawing can be performed. When a large-sized substrate is used, the heads 1405 and 1412 can freely scan over the substrate in a direction indicated by arrows in FIG. 25, and a region to be drawn can be freely set. Thus, a plurality of the same patterns can be drawn over one substrate.

In the case of forming a conductive layer by a droplet discharge method, a composition containing particles of a conductive material is discharged, and fused or welded by baking to solidify the composition. A conductive layer (or an insulating layer) formed by discharging and baking the composition containing a conductive material is, in many cases, a polycrystalline state with many grain boundaries whereas a conductive layer (or an insulating layer) formed by sputtering or the like has, in many cases, a columnar structure.

The general idea of the embodiment mode of the present invention will be described using a method of forming conductive layers with reference to FIGS. 1A to 1C. FIGS. 1A to 1C are top views of the conductive layers.

Figure 1B:
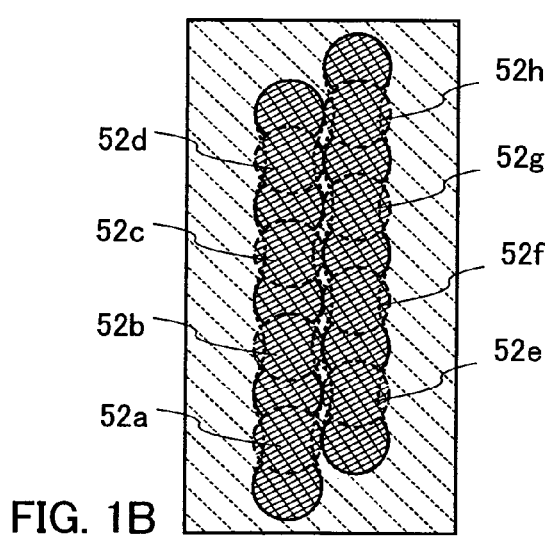
Figure 1C:
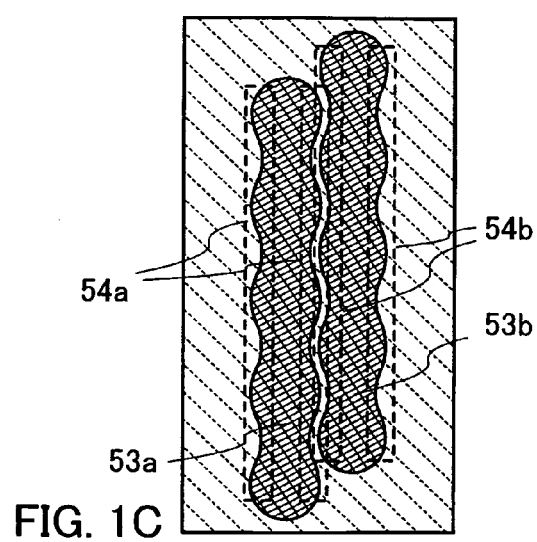

As shown in FIGS. 1A to 1C, conductive layers are formed over a substrate 50. Accordingly, wettability of a surface of the substrate 50, which is a formation region of the conductive layers, with respect to a liquid composition containing a conductive material which forms the conductive layers is necessarily controlled. The degree of wettability may be appropriately set depending on the width or the pattern shape of the conductive layer to be formed, and the wettability can be controlled by the following treatment. In this embodiment mode, in forming the conductive layers, the contact angle between the formation region and the composition containing a conductive material is preferably 20 degrees or more, more preferably from 20 degrees to 40 degrees.

First, a method of forming a substance having low wettability and controlling to reduce the wettability of a surface of the formation region is described. As the substance having low wettability, a substance containing a fluorocarbon group (fluorocarbon chain) or a substance containing a silane coupling agent can be used. The silane coupling agent is denoted by the chemical formula: $R_n$—Si—$X_{(4-n)}$ (n=1, 2, 3). In this chemical formula, R represents a substance containing a relatively inactive group such as an alkyl group. X represents a hydrolyzable group such as halogen, a methoxy group, an ethoxy group, or an acetoxy group that is bondable with a hydroxyl group or an adsorbed water on a substrate surface by a condensation.

As a representative example of the silane coupling agent, by using a fluorine-based silane coupling agent that has a fluoroalkyl group (such as fluoroalkylsilane (FAS)) for R, the wettability can be further reduced. R in FAS has a structure expressed by $(CF_3)(CF_2)_x(CH_2)_y$ (x is an integer in the range of 0 to 10, and y is an integer in the range of 0 to 4). When a plurality of Rs or Xs is bonded with Si, the Rs or Xs may be the same or different from one another. Typically, the following can be cited as FAS: fluoroalkylsilane such as, heptadecafluoro tetrahydrodecyl triethoxysilane, heptadecafluoro tetrahydrodecyl trichlorosilane, tridecafluoro tetrahydrooctyl trichlorosilane, or trifluoropropyl trimethoxysilane.

As the substance having low wettability, a substance that does not have a fluorocarbon chain but an alkyl group can be used as R of the silane coupling agent as well, for example, octadecyltrimethoxysilane or the like can be used as an organosilane.

As a solvent of a solution containing a low wettability substance, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene, or squalane; tetrahydrofuran; or the like is used.

As an example of a composition which reduces wettability and forms a low wettability region, a substance having fluorocarbon chain (e.g., fluorine-based resin) can be used. As the fluorine-based resin, the following can be used: a polytetrafluoroethylene (PTFE) resin; a perfluoroalkoxyalkane (PFA) or tetrafluoroethylene perfluoroalkylvinylether copolymer resin; a perfluoroethylene propene copolymer (PFEP) or tetrafluoroethylene-hexafluoropropylene copolymer resin; an ethylene-tetrafluoroethylene copolymer (ETFE) or tetrafluoroethylene-ethylene copolymer resin; a polyvinylidene fluoride (PVDF) resin; a polychlorotrifluoro ethylene (PCTFE) or polytrifluorochloroethylene resin; an ethylene-chlorotrifluoroethylene copolymer (ECTFE) or polytrifluorochloroethylene-ethylene copolymer resin; a polytetrafluoroethylene-perfluorodioxole copolymer (TFE/PDD); a polyvinyl fluoride (PVF) or vinyl fluoride resin; or the like.

Further, when a treatment by $CF_4$ plasma or the like is performed using an inorganic or organic material, wettability can be reduced. As the organic material, for instance, a material of a solvent such as $H_2O$ mixed with a water-soluble resin such as polyvinyl alcohol (PVA) can be used. In addition, a combination of PVA and another water-soluble resin can be used. An organic material (organic resin material) (polyimide or acryl) or a siloxane material may be used. Note that the siloxane material corresponds to a resin containing a Si—O—Si bond. Siloxane has a skeletal structure formed from a bond of silicon (Si) and oxygen (O). As a substituent, an organic group containing at least hydrogen (e.g. an alkyl group or aromatic hydrocarbon) is used. Alternatively, a fluoro group may be used as the substituent. An organic group containing at least hydrogen and a fluoro group may also be used as the substituent.

In this embodiment mode, FAS is formed over the substrate 50 by spin coating; thus wettability of the surface of the substrate 50 is adjusted. This wettability is with respect to a liquid composition containing a conductive material which is included in a conductive layer to be formed in a later step.

When the conductive layer is formed by one-time continuous discharging, droplets are aggregated, and a puddle of liquid called a bulge is caused. Accordingly, the conductive layer is sometimes disconnected. Therefore, in the invention, the conductive layer is formed by a plurality of dischargings. In other words, in a first discharging step, a liquid composition containing a conductive material is attached to dot the formation region so that droplets does not have contact with each other. Next, in a second discharging step, a composition containing a conductive material is discharged to fill a space between the droplets of the conductive material discharged in the first discharging step. Accordingly, a continuous conductive layer is formed. Since the time has passed, the composition containing a conductive material discharged in the first discharging step is solidified by drying. Therefore, aggregation between the conductive materials discharged in the first and second discharging steps does not occur. When a conductive layer is formed in such a manner, a stable conductive layer can be formed even when the layer has a fine line shape.

However, the conductive layer formed by a plurality of dischargings in the above manner does not have a uniform line width and has a shape having knots. Wettability with respect to the liquid composition containing a conductive material is different between a surface of the solidified conductive layer formed of the composition containing a conductive material discharged in the first discharging step and the surface of the substrate 50 whose wettability is controlled as previously described. The liquid composition containing a conductive material to be discharged in the second discharging step is discharged to both the conductive layer discharged in the first discharging step and the surface of the substrate 50 to bridge therebetween. The liquid composition containing a conductive material which is greatly affected by wettability of a surface moves to flow over the conductive layer having high wettability formed by the first discharging step. As a result, the line width of a portion of the conductive layer formed by the first discharging step is increased, and the line width of a portion of the conductive layer formed by the second discharging step is decreased. Accordingly, a conductive layer having knots regularly and having uneven line width is formed.

In the case of forming the conductive layers having knots to be adjacent to each other, if portions having large line widths of the respective conductive layers are formed adjacent to each other, a distance between the portions of the conductive layers becomes short, and if portions having small line widths of the respective conductive layers are formed adjacent to each other, a distance between the portions of the conductive layers becomes long. Thus, the distance between the conductive layers is varied and uneven. Further, a problem of defective formation in which conductive layers have contact with each other is caused, and it is difficult to form fine conductive or insulating layers with a stable distance.

In this embodiment mode, as shown in FIG. 1A, conductive layers 51a to 51e and conductive layers 51f to 51j are formed in a first discharging step. At this time, centers of droplets of the conductive layers 51a to 51e, which are portions of a first conductive layer, and centers of droplets of the conductive layers 51f to 51j, which are portions of a second conductive layers that is adjacent to the first conductive layer, are not on the same line in a line width direction. The center of the conductive layer 51f is set in a region which is within line width directions of a region between the centers of the conductive layers 51a and 51b. The center of the conductive layer 51f is more preferably set in a region which is within line width directions of a central region of three regions into which the length between the centers of the conductive layers 51a and 51b is divided. The widest widths of the conductive layers 51a to 51e and the conductive layers 51f to 51j formed in the first discharging step become the widest widths of the first conductive layer and the second conductive layer, respectively. Therefore, if the conductive layers 51a to 51e and the conductive layers 51f to 51j do not have contact in the step of FIG. 1A, there is no possibility that the first conductive layer and the second conductive layer have contact with each other and defective formation occurs.

Next, as shown in FIG. 1B, a first conductive layer 53a is formed by forming conductive layers 52a to 52d by discharging the composition containing a conductive material in a second discharging step to fill spaces between the conductive layers 51a to 51e formed in the first discharging step. Similarly, a second conductive layer 53b is formed by forming conductive layers 52e to 52h by discharging the composition containing a conductive material in the second discharging step to fill spaces between the conductive layers 51f to 51j.

As described above, due to difference of wettability in an attachment region, a part of the liquid composition containing a conductive material having fluidity, which is attached in the second discharging step, moves to the conductive layers 51a to 51j having high wettability to be stabilized. After that, the first conductive layer 53a and the second conductive layer 53b having knots regularly are formed as shown in FIG. 1C by solidifying with drying, baking, or the like. A side portion 54a of the first conductive layer 53a and a side portion 54b of the second conductive layer 53b have a continuous wave shape. The first conductive layer 53a and the second conductive layer 53b are formed by a discharging method of the present invention so that regions having the widest line widths of the first conductive layer 53a and the second conductive layer 53b do not have contact to each other. The distance between the first conductive layer 53a and the second conductive layer 53b can be shorter than the sum of: the half of the difference between widest line width and the narrowest line width of the first conductive layer 53a; and the half of the difference between the widest line width and the shortest line width of the second conductive layer 53b. Therefore, even when the distance between the first conductive layer 53a and the second conductive layer 53b is short, the first conductive layer 53a and the second conductive layer 53b can be formed stably. In addition, an insulating layer can be formed by discharging an insulative material in a similar manner. Since insulating layers can be formed to have uniform distance therebetween, when a mask layer formed in such a manner is used, fine processing with precision can be performed. Since a distance between the conductive layers can be reduced, when the conductive layers are used as source and drain electrode layers, the channel width can be reduced. Accordingly, a highly reliable semiconductor device, which can operate at high speed with high performance, can be manufactured. Since the number of faults due to defective formation is decreased in a manufacturing process, there are effects of improving yield and increasing productivity.

In this embodiment mode, the first conductive layer 53a and the second conductive layer 53b are formed by using a droplet discharge apparatus. The droplet discharge apparatus is a general term for an apparatus that discharges a droplet, including a nozzle having a discharge opening of a composition, a head equipped with a single or a plurality of nozzles, or the like. The diameter of the nozzle included in the droplet discharge apparatus is set in the range of 0.02 μm to 100 μm (preferably, 0.02 μm to 30 μm), and the amount of the composition to be discharged from the nozzle is set in the range of 0.001 pl to 100 pl (preferably, 0.1 pl to 40 pl, more preferably, 0.1 pl to 10 pl). The amount of the composition to be discharged increases in proportion to the size of the diameter of the nozzle. Further, it is preferable that the distance between an object to be processed and the discharge opening of the nozzle is as short as possible in order to drop a droplet on a desired position. Preferably, the distance is set within the approximate range of 0.1 mm to 3 mm (more preferably, 0.1 mm to 1 mm).

For the composition to be discharged from the discharge opening, a conductive material dissolved or dispersed in a solvent is used. The conductive material corresponds to fine particles or dispersed nanoparticle of one or a plurality of kinds of metal selected from Ag, Au, Cu, Ni, Pt, Pd, Ir, Rh, W, and Al, and may be mixed with a fine particle or dispersed nanoparticles of one or a plurality of kinds of sulfide of a metal such as Cd or Zn, an oxide of Fe, Ti, Si, Ge, Zr, Ba, or the like, silver halide, or the like. Also, the conductive material may correspond to indium tin oxide (ITO), indium tin oxide containing silicon oxide (ITSO), organoindium, organotin, zinc oxide, titanium nitride, or the like, which is used for a transparent conductive film. However, as for the composition to be discharged from the discharge opening, it is preferable to use one of the materials of gold, silver, or copper dissolved or dispersed in a solvent, taking into consideration a specific resistance value. It is more preferable to use silver or copper having low resistance values. However, when silver or copper is used, a barrier film may be additionally provided as a countermeasure against impurities. A silicon nitride film or nickel boron (NiB) can be used for the barrier film.

The composition to be discharged is a conductive material dissolved or dispersed in a solvent, and further contains a dispersant or a thermosetting resin called a binder. Especially, the binder has a function of preventing generation of a crack or uneven baked state during baking. Therefore, a conductive layer to be formed sometimes contains an organic material. The contained organic material varies depending on the heat temperature, the atmosphere, or time. The organic material refers to an organic resin or the like which functions as a binder of metal particles, a solvent, a dispersant, and a coating agent. Typically, an organic resin such as a polyimide resin, an acrylic resin, a novolac resin, a melamine resin, a phenol resin, an epoxy resin, a silicon-based resin, a furan resin, or a diallyl phthalate resin can be used.

In addition, a particle with a plurality of layers, in which a conductive material is coated with another conductive material, may be used. For example, a three-layer structure particle in which copper is coated with nickel boron (NiB), which is further coated with silver, may be used. As for the solvent, ester such as butyl acetate or ethyl acetate; alcohol such as isopropyl alcohol or ethyl alcohol; organic solvent such as methyl ethyl ketone or acetone; water, or the like is used. The viscosity of the composition is preferably 20 mPa·s or less. This prevents the composition from drying, and enables the composition to be discharged smoothly from the discharge opening. The surface tension of the composition is preferably 40 mN/m or less. However, the viscosity of the composition and the like may be appropriately controlled depending on a solvent to be used and an intended purpose. For example, the viscosity of a composition in which ITO, organic indium, or organotin is dissolved or dispersed in a solvent may be set from 5 mPa·s to 20 mPa·s, the viscosity of a composition in which silver is dissolved or dispersed in a solvent may be set from 5 mPa·s to 20 mPa·s, and the viscosity of a composition in which gold is dissolved or dispersed in a solvent may be set from 5 mPa·s to 20 mPa·s.

The conductive layer may be formed by laminating a plurality of conductive materials. In addition, the conductive layer may be formed first by a droplet discharge method using silver as a conductive material, and a plating with copper or the like may be performed thereafter. Plating may be performed by an electroplating or chemical (electroless) plating method. Plating may be performed by soaking a substrate surface into a container filled with a solution containing a plating material; alternatively, the solution containing a plating material may be applied by placing the substrate in an oblique (or perpendicular) position, and pouring the solution over the substrate surface. When the plating is performed by applying a solution with the substrate placed obliquely or perpendicularly, there is an advantage that an apparatus used for the process can be downsized even with a large-sized substrate.

Although it depends on the diameter of each nozzle, a desired shape of a pattern, and the like, the diameter of a particle of the conductive material is preferably as small as possible, for the purpose of preventing nozzles from being clogged and for manufacturing a fine pattern. Preferably, the diameter of the particle of the conductive material is 0.1 μm or less. The composition is formed by a method such as an electrolyzing method, an atomizing method, or a wet reduction method, and the particle size to be obtained is typically about 0.01 μm to 10 μm. However, when a gas evaporation method is employed, nanoparticles protected by a dispersant are minute, about 7 nm. When the surface of each particle is covered with a coating, the nanoparticles do not aggregate in the solvent, are uniformly dispersed in the solvent at room temperature, and behave similarly to a liquid. Accordingly, it is preferable to use a coating.

When using a difference of wettability between a composition having fluidity and the vicinity of a formation region, the composition needs to have fluidity even when the composition is attached to the object to be processed in order to process into a desired pattern. However, as long as the fluidity is not lost, the step of discharging the composition may be performed under reduced pressure. In addition, when the process is performed under reduced pressure, an oxide film or the like is not formed over the surface of the conductive material, which is preferable. After discharging the composition, either or both steps of drying and baking is/are performed. Both the drying and baking steps are heat treatments. For example, drying may be performed for three minutes at 100° C. and baking may be performed for 15 minutes to 60 minutes at a temperature of 200° C. to 550° C., and treatment temperatures and treatment period may be changed corresponding to purposes. The steps of drying and baking are performed under normal pressure or reduced pressure, by laser light irradiation, rapid thermal annealing, heating using a heating furnace, or the like. Note that the timing of the heat treatment and the number of times of the heat treatment is not particularly limited. The substrate may be heated in advance to perform the steps of drying and baking well, and although the temperature of the substrate at the time depends on the material of the substrate or the like, it is typically 100° C. to 800° C. (preferably, 200° C. to 550° C.). Through these steps, nanoparticles are made in contact with each other and fusion and welding are accelerated by a hardening and shrinking of a peripheral resin, while the solvent in the composition is volatilized or the dispersant is chemically removed.

A gas laser or a solid-state laser of a continuous oscillation or pulsed oscillation may be used for laser light irradiation. An excimer laser, a YAG laser, or the like can be used as the former gas laser. A laser or the like using a crystal of YAG, $YVO_4$, $GdVO_4$, or the like which is doped with Cr, Nd, or the like can be used as the latter solid-state laser. Note that it is preferable to use a continuous wave laser in consideration of the absorption rate of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes using an infrared lamp or a halogen lamp which emits light of ultraviolet to infrared light in an inert gas atmosphere. Since the treatment is performed instantaneously, only a thin film on a top surface can be actually heated and the lower layer of the film is not affected. In other words, even a substrate having low heat resistance such as a plastic substrate is not affected.

After forming a conductive layer, an insulating layer, or the like by discharging a composition by a droplet discharge method, the surface thereof may be planarized by pressing with pressure to enhance the flatness. As a pressing method, an asperity of the surface may be smoothed and reduced by moving a roller-shaped object over the surface, or the surface may be perpendicularly pressed with a flat plate-shaped object. A heating step may be performed at the time of pressing. Alternatively, the asperity of the surface may be eliminated with an air knife after softening or melting the surface with a solvent or the like. CMP may be also used for polishing the surface. This step may be applied for planarizing a surface when the asperity is caused by a droplet discharge method.

By using the invention, even when wirings or the like are designed to be close to each other with complexity as the result of downsizing or thinning of a film, they can be formed stably into desired patterns with good shapes, which improves reliability and productivity. Further, material loss and cost can be reduced. Hence, a semiconductor device or a display device with high performance and high reliability can be manufactured with high yield.

Embodiment Mode 2

Figure 26A:
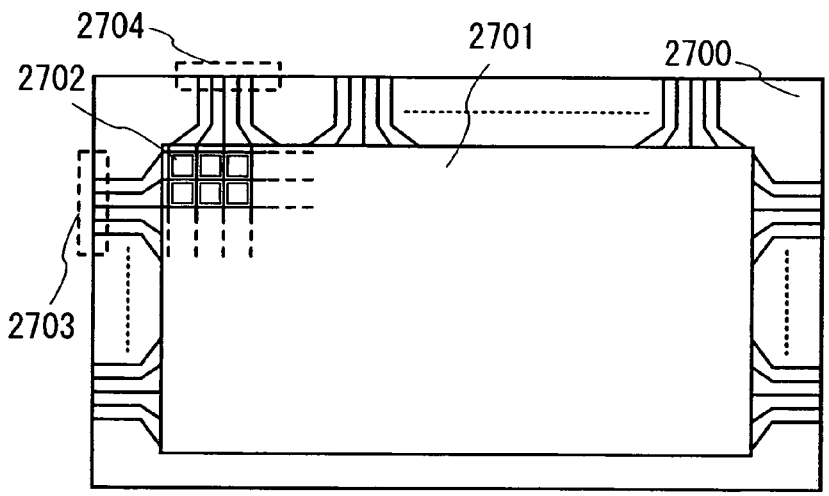
FIGS. 26A to 26C are top views of a display device of the present invention.

FIG. 26A is a top view showing a structure of a display panel using the present invention. A pixel portion 2701 in which pixels 2702 are arranged in matrix, a scanning line input terminal 2703, and a signal line input terminal 2704 are formed over a substrate 2700 having an insulating surface. The number of the pixels may be determined in accordance with various standards. In the case of XGA and RGB display, the number of the pixels may be 1024×768×3 (RGB). Similarly, in the case of UXGA and RGB display, the number of the pixels may be 1600×1200×3 (RGB), and in the case of a full-spec high vision and RGB display, it may be 1920×1080×3 (RGB).

The pixels 2702 are formed in matrix at intersections of scanning lines extended from the scanning line input terminal 2703 and signal lines extended from the signal line input terminal 2704. Each pixel 2702 is provided with a switching element and a pixel electrode connected thereto. A typical example of the switching element is a TFT. The gate electrode of the TFT is connected to the scanning line, and a source or a drain electrode of the TFT is connected to the signal line, which enables each pixel to be independently controlled by a signal inputted from the outside.

As main components of a TFT, a semiconductor layer, a gate insulating layer, and a gate electrode layer are given, and a wiring layer connected to source and drain regions which are formed in the semiconductor layer accompanies thereto. In terms of a structure, a top gate type in which a semiconductor layer, a gate insulating layer, and a gate electrode layer are provided from the substrate side; a bottom gate type in which a gate electrode layer, a gate insulating layer, and a semiconductor layer are provided from the substrate side; and the like are typically known. Any of the structures may be applied to the present invention.

Figure 27A:
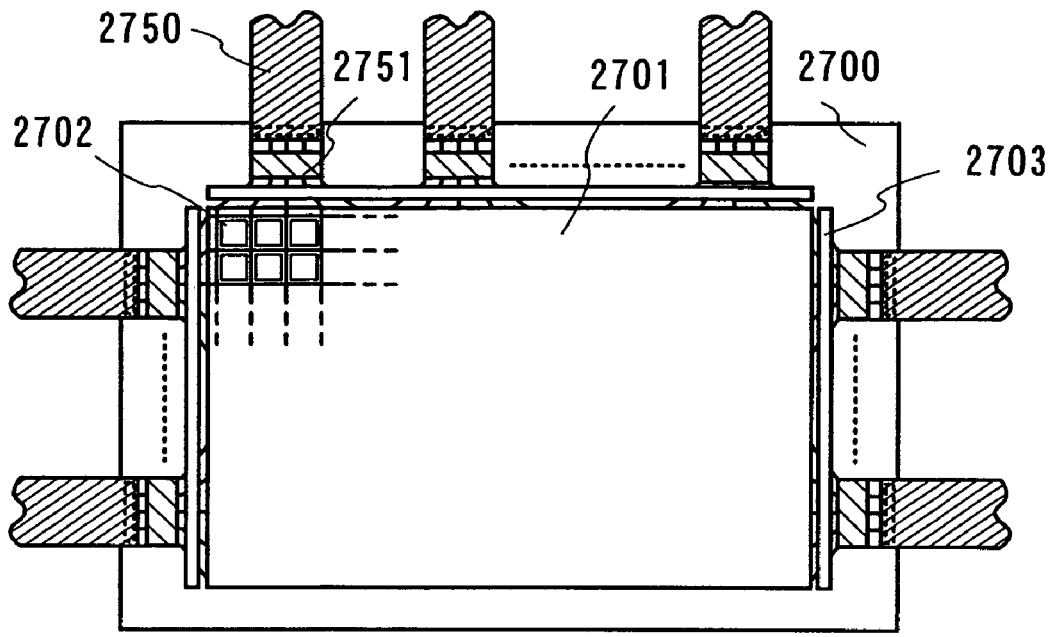
FIGS. 27A and 27B are top views of a display device of the present invention.
Figure 27B:
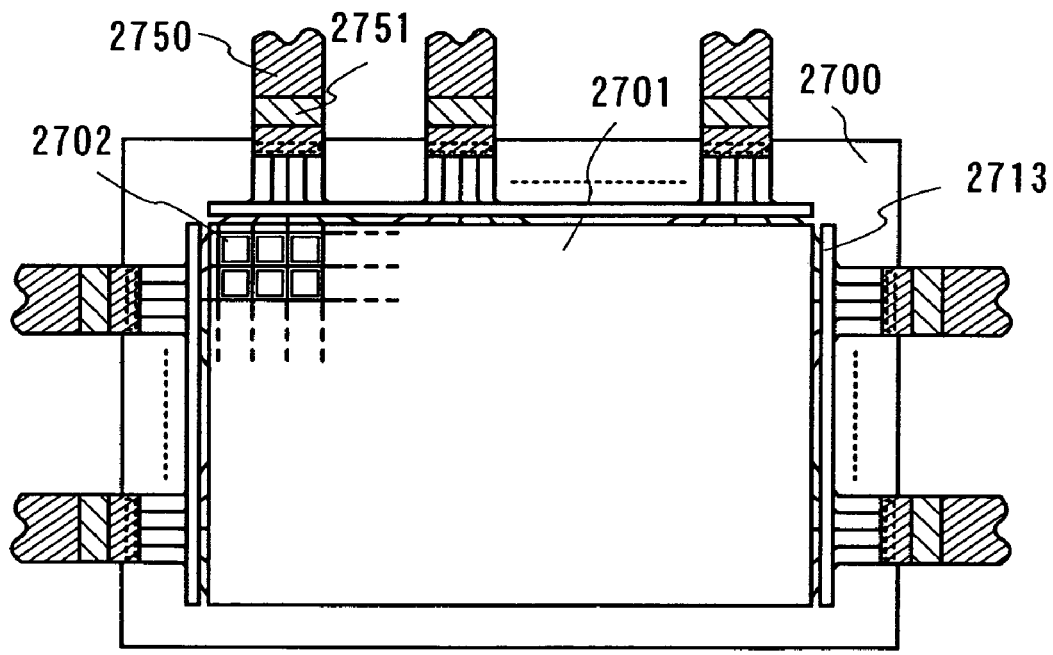

FIG. 26A shows a structure of a display panel in which a signal to be input to a scanning line and a signal line is controlled by an external driver circuit. Alternatively, a driver IC 2751 may be mounted on a substrate 2700 by a COG (Chip on Glass) method as shown in FIG. 27A. As another mounting mode, a TAB (Tape Automated Bonding) method may also be used as shown in FIG. 27B. The driver IC may be formed over a single crystal semiconductor substrate or may be formed of a TFT over a glass substrate. In FIGS. 27A and 27B, the driver IC 2751 is connected to an FPC (Flexible Printed Circuit) 2750.

Figure 26B:
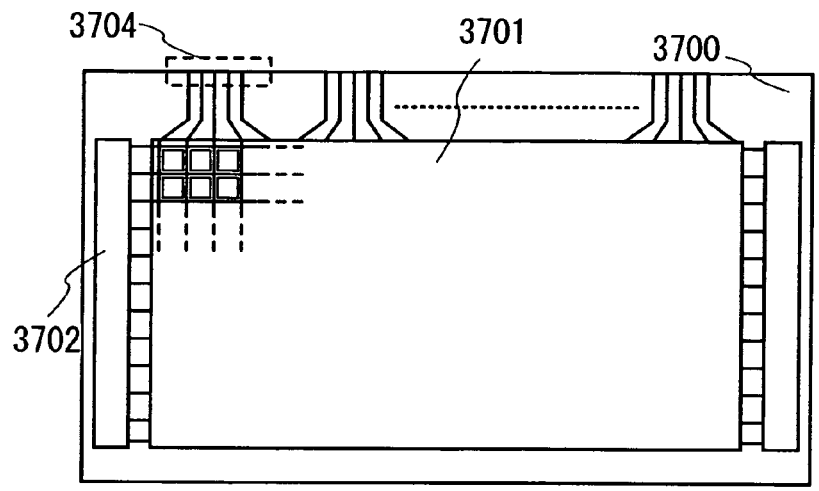
Figure 26C:
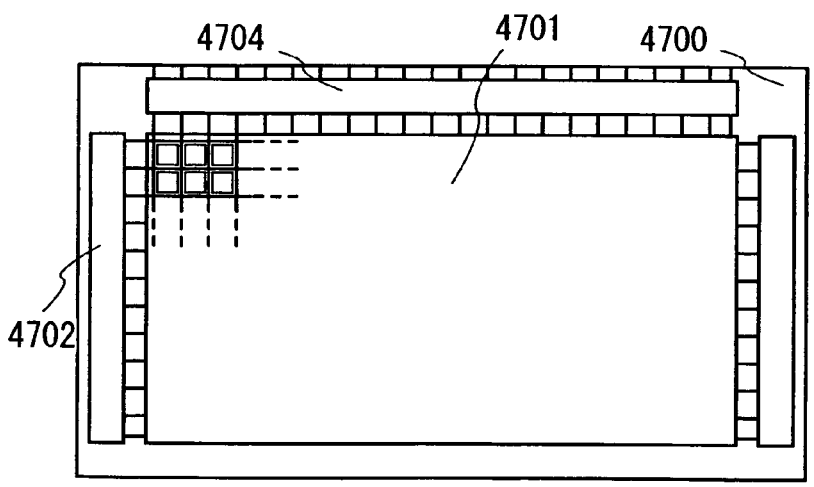

When a TFT provided in a pixel is formed of a polycrystalline (microcrystalline) semiconductor having high crystallinity, a scanning line driver circuit 3702 can be formed over a substrate 3700 as shown in FIG. 26B. In FIG. 26B, reference numeral 3701 denotes a pixel portion, and a signal line driver circuit is controlled by an external driver circuit in the same manner as in FIG. 26A. Reference numeral 3704 denotes a signal line input terminal. As well as the TFT formed in the present invention, when the TFT provided in a pixel is formed by using a polycrystalline (microcrystalline) semiconductor, a single crystal semiconductor, or the like having high electron mobility, a pixel portion 4701, a scanning line driver circuit 4702 and a signal line driver circuit 4704 can be integrated with a glass substrate 4700 as shown in FIG. 26C.

The embodiment mode of the present invention will be described with reference to FIGS. 2A to 8B. Specifically, a method of manufacturing a display device having an inversely staggered thin film transistor using the invention will be described. FIGS. 2A, 3A, 4A, 5A, and 6A are top views of pixel regions of a display device. FIGS. 2B, 3B, 4B, 5B, and 6B are sectional views taken along lines A-C in FIGS. 2A, 3A, 4A, 5A, and 6A, respectively. FIGS. 2C, 3C, 4C, 5C, and 6C are sectional views taken along lines B-D in FIGS. 2A, 3A, 4A, 5A, and 6A, respectively. FIGS. 7A and 7B are sectional views of a display device. FIG. 8A is a top view, and FIG. 8B is a sectional view taken along line L-K (including line I-J) in FIG. 8A.

A glass substrate made of barium borosilicate glass, alumino borosilicate glass, or the like; a quartz substrate; a metal substrate; or a plastic substrate which can withstand the process temperature of the manufacturing process is used as a substrate 100. A surface of the substrate 100 may be polished by CMP or the like to be planarized. In addition, an insulating layer may be formed over the substrate 100. The insulating layer is formed of a single layer or a laminated layer of an oxide material or a nitride material containing silicon by a method such as CVD, plasma CVD, sputtering, or spin coating. Although the insulating layer is not necessarily formed, it has an effect of blocking contaminants or the like from the substrate 100.

A gate electrode layer 103 and a gate electrode layer 104 are formed over the substrate 100. The gate electrode layers 103 and 104 can be formed by CVD, sputtering, a droplet discharge method, or the like. The gate electrode layers 103 and 104 may be formed from an element selected from Ag, Au, Ni, Pt, Pd, Ir, Rh, Ta, W, Ti, Mo, Al, and Cu, an alloy material or a compound material containing the element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (WN) film and a molybdenum (Mo) film or a three-layer structure in which a tungsten film having a thickness of 50 nm, an alloy (Al—Si) film of aluminum and silicon having a thickness of 500 nm, and a titanium nitride film having a thickness of 30 nm are laminated in order may be used. Further, in the case of the three-layer structure, tungsten nitride may be used instead of the tungsten of the first conductive film, an alloy (Al—Ti) film of aluminum and titanium may be used instead of the alloy (Al—Si) film of aluminum and silicon of the second conductive film, and a titanium film may be used instead of the titanium nitride film of the third conductive film.

In the case where the gate electrode layers 103 and 104 are required to be processed into certain shapes, they may be processed into a desired shape by dry etching or wet etching after forming a mask. The electrode layers can be etched to a tapered shape by ICP (Inductively Coupled Plasma) etching appropriately controlling the etching condition (the amount of electric power applied to a coiled electrode, the amount of electric power applied to an electrode of a substrate side, the temperature of the electrode of the substrate side, or the like). Note that a chlorine-based gas typified by $Cl_2$, $BCl_3$, $SiCl_4$, $CCl_4$ or the like; a fluorine-based gas typified by $CF_4$, $SF_6$, $NF_3$, or the like; or $O_2$ can be appropriately used for the etching gas.

A mask for processing into a desired shape can be formed by selectively discharging a composition. When the mask is selectively formed in such a way, it becomes possible to simplify the step of processing. A resin material such as an epoxy resin, a phenol resin, a novolac resin, an acrylic resin, a melamine resin, or an urethane resin is used for the mask. In addition, the mask may be formed by a droplet discharge method using an organic material such as benzocyclobutene, parylene, fluorinated-arylene-ether, or permeable polyimide; a compound material made by the polymerization of a siloxane-based polymer or the like; a composition material containing a water-soluble homopolymer and a water-soluble copolymer; or the like. Alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. In using whichever material, the surface tension and the viscosity are appropriately controlled by arranging the concentration of a solvent or adding a surfactant or the like.

Figure 2A:
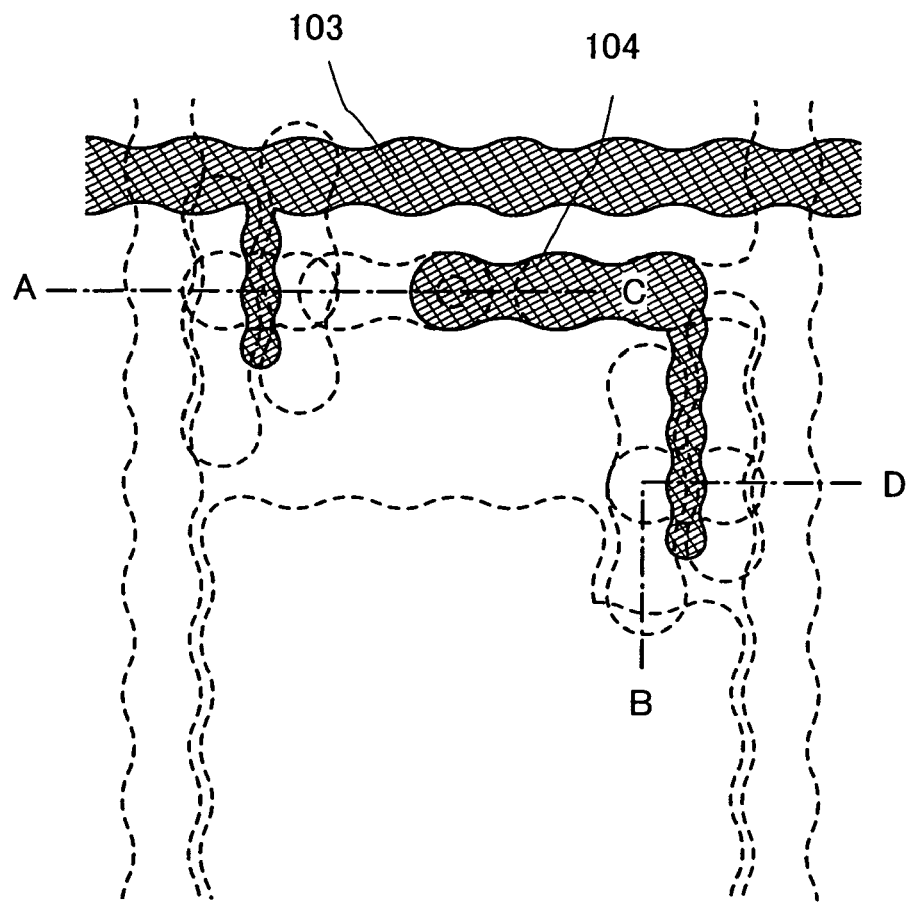
FIGS. 2A to 2C show a method of manufacturing a display device of the present invention.
Figure 2B:
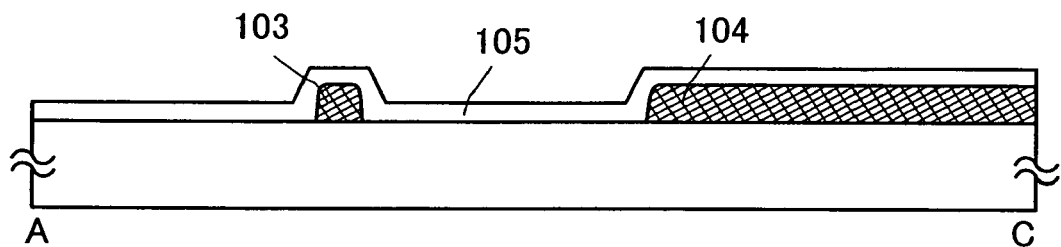
Figure 2C:
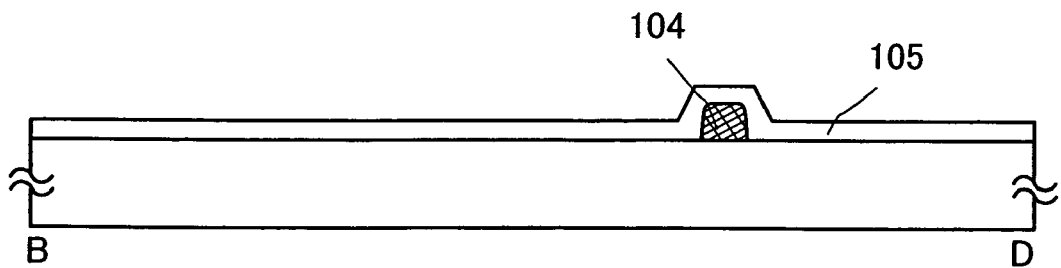

In this embodiment mode, the gate electrode layers 103 and 104 are formed by forming a conductive film and processing the conductive film into a desired shape using mask layers. Wettability can be controlled by forming FAS over a surface of the conductive film, and mask layers are formed by a droplet discharge method. Since the mask layers are formed by a droplet discharge method as described in Embodiment Mode 1, the mask layers have shapes having knots, and the shapes are reflected in shapes of the gate electrode layers 103 and 104 which can be obtained by processing using the mask layers (FIGS. 2A and 2B).

Subsequently, a gate insulating layer 105 is formed over the gate electrode layers 103 and 104. The gate insulating layer 105 can be formed by using a material such as a silicon oxide material or a silicon nitride material and be a single layer or a laminated layer. In this embodiment mode, a two-layer structure of a silicon nitride film and a silicon oxide film is used. Alternatively, the gate insulating layer 105 may have a single layer of a silicon oxynitride film or three or more layers of a silicon oxynitride film, a silicon nitride film, and a silicon oxide film. Preferably, a dense silicon nitride film is used. When using silver, copper or the like for the conductive layers formed by a droplet discharge method, diffusion of an impurity is prevented and surfaces are planarized by forming a silicon nitride film or an NiB film thereover as a barrier film. In order to form a dense insulating film with less gate leakage current at a low temperature, a reactive gas containing a rare gas element such as argon may be used to mix the rare gas element into the insulating film to be formed.

Next, a semiconductor layer is formed. The semiconductor layer having one conductivity type may be formed if necessary. An NMOS structure of an n-channel TFT provided with an n-type semiconductor layer, a PMOS structure of a p-channel TFT provided with a p-type semiconductor layer, and a CMOS structure of an n-channel TFT and a p-channel TFT can be manufactured. An n-channel TFT or a p-channel TFT can be formed by making an impurity region into a semiconductor layer by adding an element which imparts conductivity by doping to impart conductivity. The conductivity may be imparted to a semiconductor layer by a plasma treatment using a $PH_3$ gas instead of forming the n-type semiconductor layer.

An amorphous semiconductor (hereinafter also referred to as an "AS") manufactured by a vapor phase growth method or sputtering using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer. The semiconductor layer can be formed by a means of various methods (sputtering, LPCVD, plasma CVD, or the like).

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of 0.5 nm to 20 m can be observed in at least a part of the film. When silicon is contained as the main component, a Raman spectrum is shifted to a lower wavenumber than 520 $cm^{-1}$. A diffraction peak of (111) or (220) to be caused by a silicon crystal lattice is observed in X-ray diffraction. Hydrogen or halogen of at least 1 atomic % or more is contained to terminate a dangling bond. The SAS is formed by glow discharge decomposition (plasma CVD) of a silicon source gas. $SiH_4$ is used as a silicon source gas. Alternatively, $Si_2H_6$, $SiH_2Cl_2$, $SiHCl_3$, $SiCl_4$, $SiF_4$, or the like can also be used as the silicon source gas. Further, $F_2$ or $GeF_4$ may be mixed. This silicon source gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can still be formed at a temperature from 100° C. to 200° C. It is desirable that an atmospheric constituent impurity such as oxygen, nitrogen, or carbon is $1\times10^{20}$ $cm^{-3}$ or less as an impurity element taken in the film forming step; specifically, the oxygen concentration is $5\times10^{19}$ $cm^{-3}$ or less, preferably $1\times10^{19}$ $cm^{-3}$ or less. A favorable SAS can be obtained by further promoting lattice distortion by adding a rare gas element such as helium, argon, krypton, or neon to enhance stability. Additionally, as a semiconductor layer, a SAS layer formed using a hydrogen-based gas may be formed over a SAS layer formed using a fluorine-based gas.

An amorphous semiconductor is typified by hydrogenated amorphous silicon, and a crystalline semiconductor is typified by polysilicon or the like. Polysilicon (polycrystalline silicon) includes a high-temperature polysilicon which contains polysilicon that is formed under a process temperature of 800° C. or more as the main component, a low-temperature polysilicon which contains polysilicon that is formed under a process temperature of 600° C. or less as the main component, a polysilicon which is crystallized by adding an element or the like which promotes crystallization, or the like. Naturally, as described above, a semiamorphous semiconductor layer or a semiconductor which includes a crystalline phase in a portion of a semiconductor layer may be used.

As a material of the semiconductor, as well as an element of silicon (Si), germanium (Ge), or the like, a compound semiconductor such as GaAs, InP, SiC, ZnSe, GaN, or SiGe can be used. In addition, zinc oxide (ZnO) can also be used. In the case of using ZnO for the semiconductor layer, a single layer or a laminated layer of $Y_2O_x$, $Al_2O_3$, or $TiO_2$ is preferably used as the gate insulating layer, and ITO, Au, Ti, or the like is preferably used for the gate electrode layer, a source electrode layer, or a drain electrode layer. In addition, In, Ga, or the like can be added into ZnO.

In the case where a crystalline semiconductor layer is used as the semiconductor layer, various methods (a laser crystallization method, a thermal crystallization method, a thermal crystallization method using an element promoting crystallization such as nickel, or the like) may be employed as a method of manufacturing the crystalline semiconductor layer. A microcrystalline semiconductor, which is a SAS, can be crystallized by being irradiated with laser light to improve the crystallinity. In the case where an element promoting crystallization is not introduced, hydrogen is released until hydrogen concentration contained in an amorphous semiconductor film becomes $1 \times 10^{20}$ atoms/cm$^3$ or less by heating the amorphous semiconductor film at a temperature of 500° C. for one hour in a nitrogen atmosphere before irradiating the amorphous semiconductor film with laser light. This is because the amorphous semiconductor film containing much hydrogen is damaged when the film is irradiated with laser light.

Any method can be used for introducing a metal element into the amorphous semiconductor layer as long as the method is capable of making the metal element exist on the surface of or inside the amorphous semiconductor layer. For example, sputtering, CVD, a plasma treatment method (including plasma CVD), an adsorption method, or a method for applying a metal salt solution can be employed. Among them, the method using a solution is simple, easy, and advantageous in terms of concentration control of the metal element. It is preferable to form an oxide film by UV light irradiation in an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer.

Heat treatment and laser light irradiation may be combined to crystallize the amorphous semiconductor layer. Alternatively, one of the heat treatment and the laser light irradiation may be performed plural times.

In addition, a crystalline semiconductor layer may be directly formed over the substrate by a linear plasma method. Alternatively, a crystalline semiconductor layer may be selectively formed over the substrate by using the linear plasma method.

A semiconductor layer can be formed by a printing method, a dispenser method, a spray method, a spin coating method, a droplet discharge method, or the like using an organic semiconductor material. In this case, since the above etching step is not required, the number of steps can be reduced. A low molecular weight material, a high molecular weight material, or the like is used for the organic semiconductor, and in addition, a material such as an organic pigment or a conductive high molecular weight material can be used. A π-electron conjugated high molecular weight material having a skeleton constituted by conjugated double bonds is preferably used as the organic semiconductor material used in the present invention. Typically, a soluble high molecular weight material such as polythiophene, polyfluoren, poly(3-alkylthiophene), a polythiophene derivative, or pentacene can be used.

There is a material, which can be treated after the deposition of a soluble precursor to form a semiconductor layer, as the organic semiconductor material applicable to the present invention. Note that polythienylenevinylene, poly(2,5-thienylenevinylene), polyacetyrene, a polyacetyrene derivative, polyallylenevinylene, or the like can be used as such an organic semiconductor material.

In converting the precursor into an organic semiconductor, a reaction catalyst such as a hydrogen chloride gas is added in addition to performing a heat treatment. The following can be employed as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

A semiconductor layer 107 and a semiconductor layer 108 are formed over the gate insulating layer 105. In this embodiment mode, amorphous semiconductor layers are crystallized as the semiconductor layers 107 and 108 to form crystalline semiconductor layers. In the crystallizing step, the amorphous semiconductor layers are added with an element which promotes crystallization (also referred to as a catalytic element or a metal element), and a heat treatment (at a temperature of 550° C. to 750° C. for 3 minutes to 24 hours) is performed to crystallize the amorphous semiconductor layer. As the element promoting the crystallization, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment mode, nickel is used.

Figure 3A:
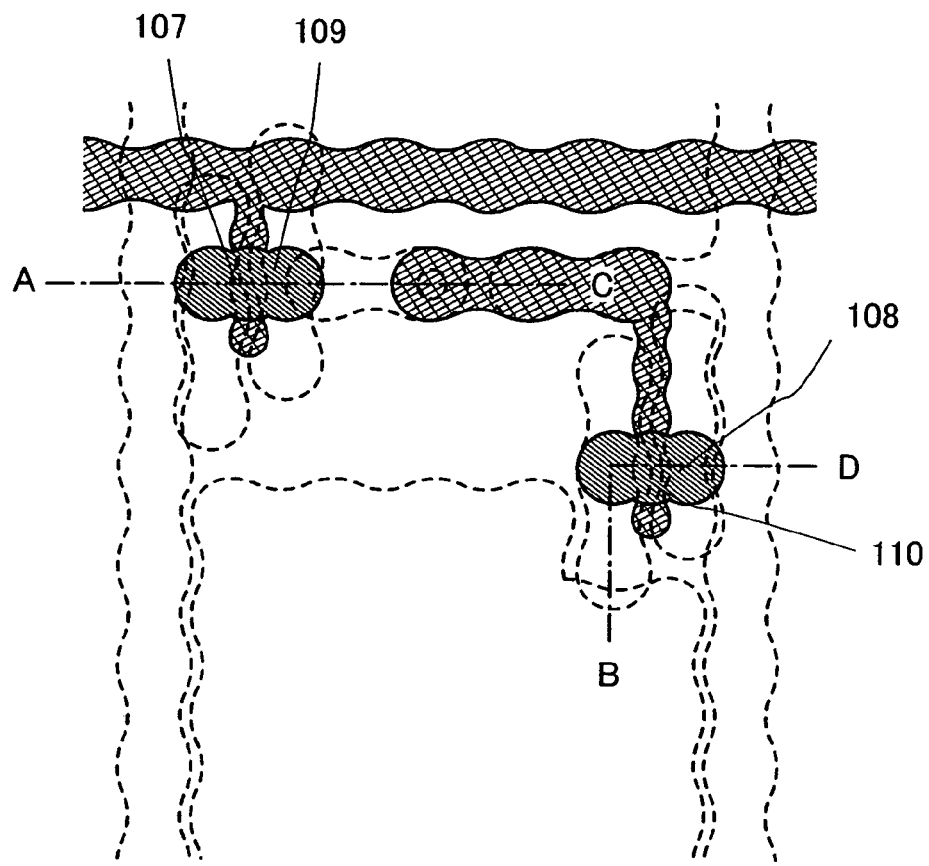
FIGS. 3A to 3C show a method of manufacturing a display device of the present invention.
Figure 3B:
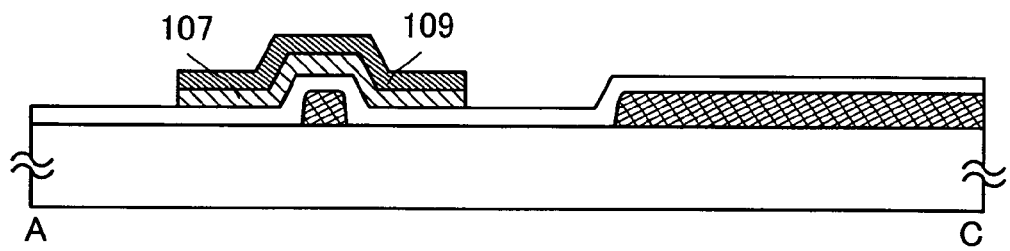
Figure 3C:
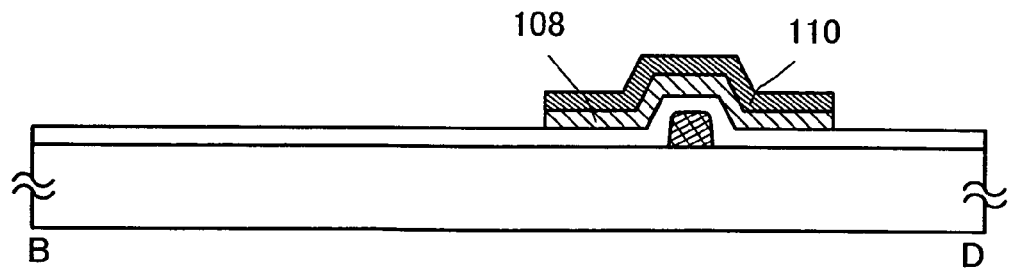

In order to remove or reduce the element which promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, a semiconductor layer containing argon is formed as the semiconductor layer containing the impurity element which functions as a gettering sink. The semiconductor layer containing argon is formed over the crystalline semiconductor layer containing the element which promotes crystallization, and a heat treatment (at a temperature of 550° C. to 750° C. for 3 minutes to 24 hours) is performed. The element promoting crystallization in the crystalline semiconductor layer moves into the semiconductor layer containing argon, and the element promoting crystallization in the crystalline semiconductor layer is removed or reduced. Then, the semiconductor layer containing argon, which functions as a gettering sink, is removed. An n-type semiconductor layer containing phosphorus (P), which is an impurity element imparting n-type conductivity, is formed over the crystalline semiconductor layer. The n-type semiconductor layer functions as a source or drain region. In this embodiment mode, the n-type semiconductor layer is formed by using a semi-amorphous semiconductor. The semiconductor layer and the n-type semiconductor layer formed by the above steps are processed into desired shapes to form the semiconductor layers 107 and 108 and n-type semiconductor layers 109 and 110 (FIGS. 3A to 3C). In this embodiment mode, since the mask layers used in processing the semiconductor layers and the n-type semiconductor layers are formed by a droplet discharge method, the shape having knots is reflected in a shape of the semiconductor layers.

Wettability of surfaces of the n-type semiconductor layers 109 and 110 and the gate insulating layer 105 is controlled. In this embodiment mode, a low wettability substance 102 is formed in order to reduce of the wettability of the surfaces. As the low wettability substance, a substance containing a fluorocarbon chain or a substance containing a silane coupling agent can be used. In this embodiment mode, FAS is used as the low wettability substance 102 and a FAS film is formed by a coating method. This wettability is with respect to a liquid composition containing a conductive material which is included in a source or drain electrode layer to be formed in a later step.

Figure 4A:
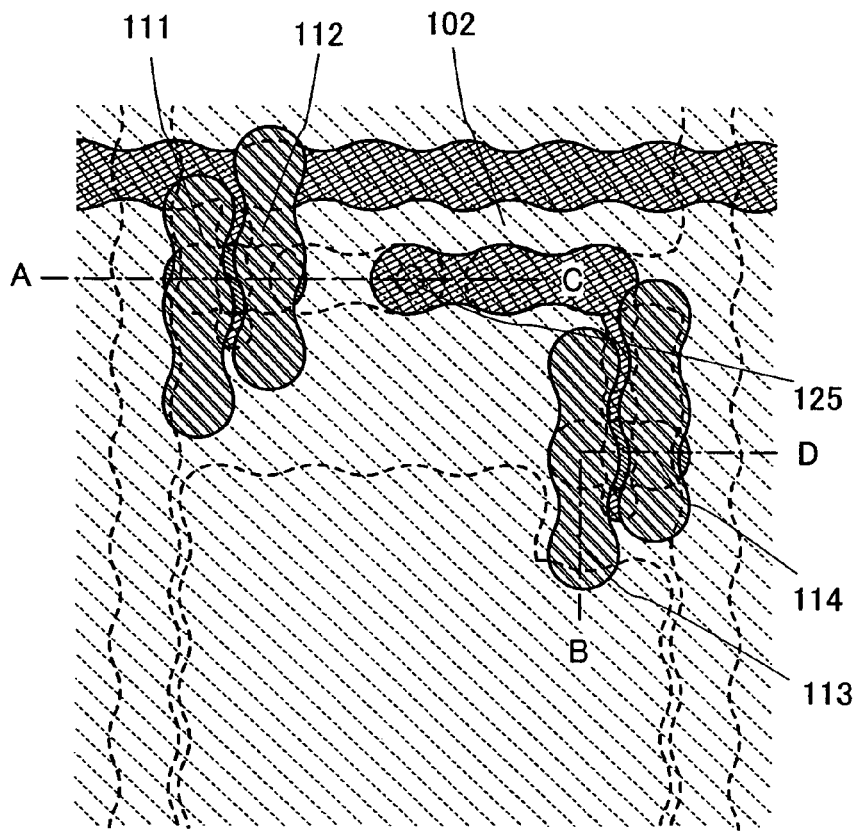
FIGS. 4A to 4C show a method of manufacturing a display device of the present invention.
Figure 4B:
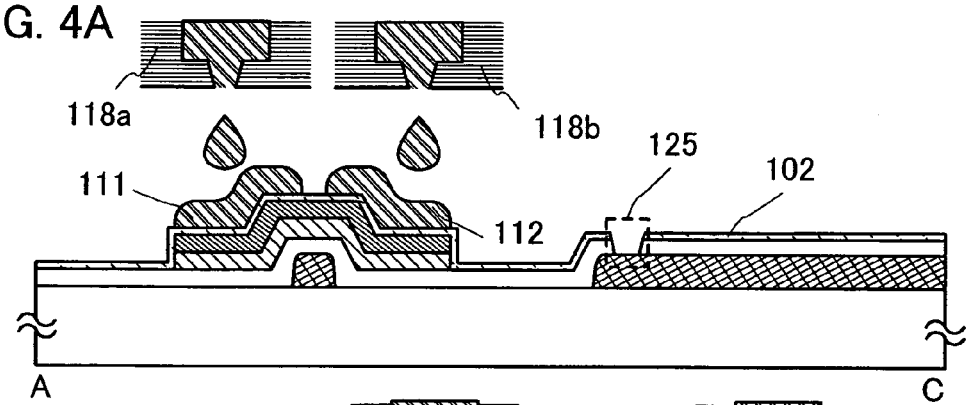
Figure 4C:
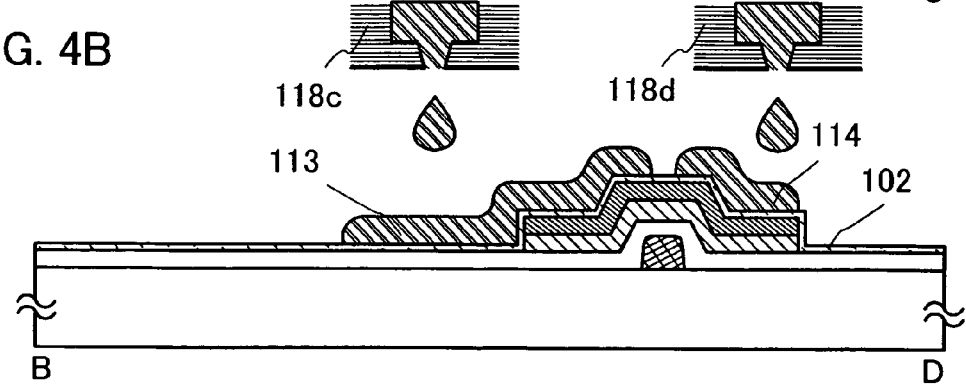

A mask made of an insulating material such as a resist or polyimide is formed by a droplet discharge method. By using the mask, a through hole 125 is formed in a portion of the gate insulating layer 105 by etching to expose a part of the gate electrode layer 104 which is formed below the gate insulating layer 105 (FIGS. 4A to 4C). By this step, the low wettability substance existing in the through hole 125 is removed as well. The etching process may be performed either by plasma etching (dry etching) or wet etching; however, plasma etching is suitable for processing a large-sized substrate. As an etching gas, a fluorine-based gas or a chlorine-based gas such as $CF_4$, $NF_3$, $Cl_2$, or $BCl_3$ is employed, to which an inert gas such as He or Ar may be appropriately added. Alternatively, electric discharge machining may be performed locally when the etching process is performed using atmospheric pressure discharge, in which case a mask layer is not required to be formed over the whole surface.

A mask for processing into a desired shape to form the through hole 125 can be formed by selectively discharging a composition. When the mask is selectively formed in such a way, it becomes possible to simplify the step of processing. A resin material such as an epoxy resin, a phenol resin, a novolac resin, an acrylic resin, a melamine resin, or an urethane resin is used for the mask. In addition, the mask may be formed by a droplet discharge method using an organic material such as benzocyclobutene, parylene, fluorinated-arylene-ether, or permeable polyimide; a compound material made by the polymerization of a siloxane-based polymer or the like; a composition material containing a water-soluble homopolymer and a water-soluble copolymer; or the like. Alternatively, a commercial resist material containing a photosensitizing agent may be used. For example, a typical positive type resist such as a novolac resin or a naphthoquinone diazide compound that is a photosensitizer, or a negative type resist such as a base resin, diphenylsilanediol, or an acid generator may be used. In using whichever material, the surface tension and the viscosity are appropriately controlled by arranging the concentration of a solvent or adding a surfactant or the like.

Further, in this embodiment mode, in forming a mask for processing by a droplet discharge method, wettability of the formation region is preferably controlled in a pretreatment. The wettability and the diameter of a droplet are controlled; thus, a desired shape (line width or the like) can be stably obtained. This step can be employed, in the case of using a liquid material, as a pretreatment for any formed component (such as an insulating layer, a conductive layer, a mask layer, or a wiring layer).

A liquid composition containing a conductive material is discharged as described in Embodiment Mode 1 over the n-type semiconductor layers 109 and 110 by droplet discharge apparatuses 118a, 118b, 118c, and 118d to form source or drain electrode layers 111, 112, 113, and 114 (FIGS. 4A to 4C). By staggering centers of discharged droplets of adjacent source or drain electrode layers formed to have a shape having knots by two-time dischargings, the adjacent source or drain electrode layers can be formed to have uniform distance therebetween without contact. Therefore, even when the distance between the source or drain electrode layers is set short, the source or drain electrode layers can be formed without contacting with each other due to defective formation. Since the channel width is determined depending on the distance between the source or drain electrode layers, a thin film transistor having such source or drain electrode layers can operate at high speed with high reliability.

Similarly, each of wiring layers 115, 116, and 117 is formed to contact with the source or drain electrode layer 111, 112, 113, or 114 by a droplet discharge method.

Figure 5A:
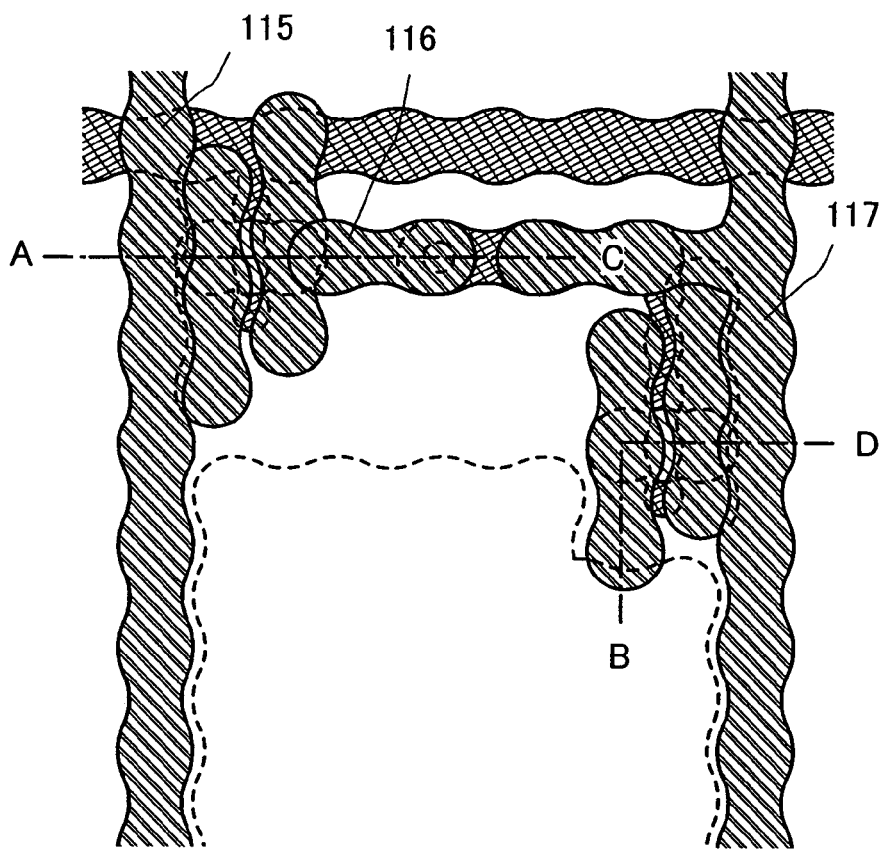
FIGS. 5A to 5C show a method of manufacturing a display device of the present invention.
Figure 5B:
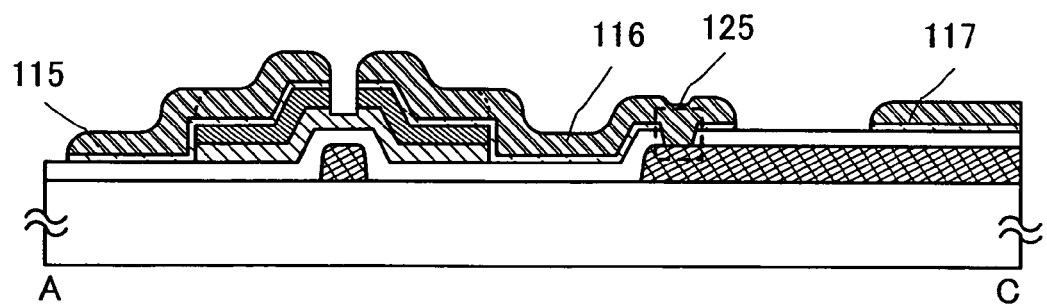
Figure 5C:
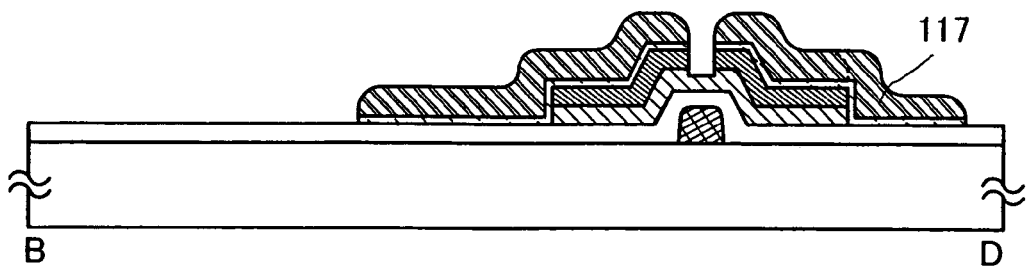

After forming the source or drain electrode layers 111, 112, 113, and 114 and wiring layers 115, 116, and 117 with desired patterns, the remained low wettability substance may be kept intact or an unnecessary part may be removed. The removal can be carried out by ashing using oxygen or the like, etching, or the like. The source or drain electrode layers can be used as masks. In this embodiment mode, after forming the source or drain electrode layers 111, 112, 113, and 114 and wiring layers 115, 116, and 117, ultraviolet irradiation is performed to decompose and remove the remained low wettability substance (FIGS. 5A to 5C).

The wiring layer 115 also functions as a source wiring layer, and the wiring layer 117 also functions as a power source line. After forming the source or drain electrode layers 111, 112, 113, and 114, the semiconductor layers 107 and 108 and the n-type semiconductor layers 109 and 110 are processed into desired shapes. In this embodiment mode, a mask is formed by a droplet discharge method, and processing is performed. Alternatively, the semiconductor layers and the n-type semiconductor layers may be processed by etching using the source or drain electrode layers as masks.

As the conductive material for forming the source or drain electrode layers 111, 112, 113, and 114 and the wiring layers 115, 116, and 117, a composition containing a metal particle such as Ag (silver), Au (gold), Cu (copper), W (tungsten), Al (aluminum), or Mo (molybdenum) as a main component can be used. Further, indium tin oxide (ITO), ITSO composed of indium tin oxide and silicon oxide, organoindium, organotin, zinc oxide, or titanium nitride which has a light-transmitting property may be combined.

In the through hole 125 formed in the gate insulating layer 105, the wiring layer 116 and the gate electrode layer 104 are electrically connected to each other. The wiring layer 117 partially constitutes a capacitor element.

By using a droplet discharge method several times, material loss and cost can be reduced more, as compared with coating over an entire surface by spin coating or the like. By using the invention, even when wirings or the like are designed to be close to each other with complexity as the result of downsizing or thinning of a film, they can be stably formed.

Figure 6A:
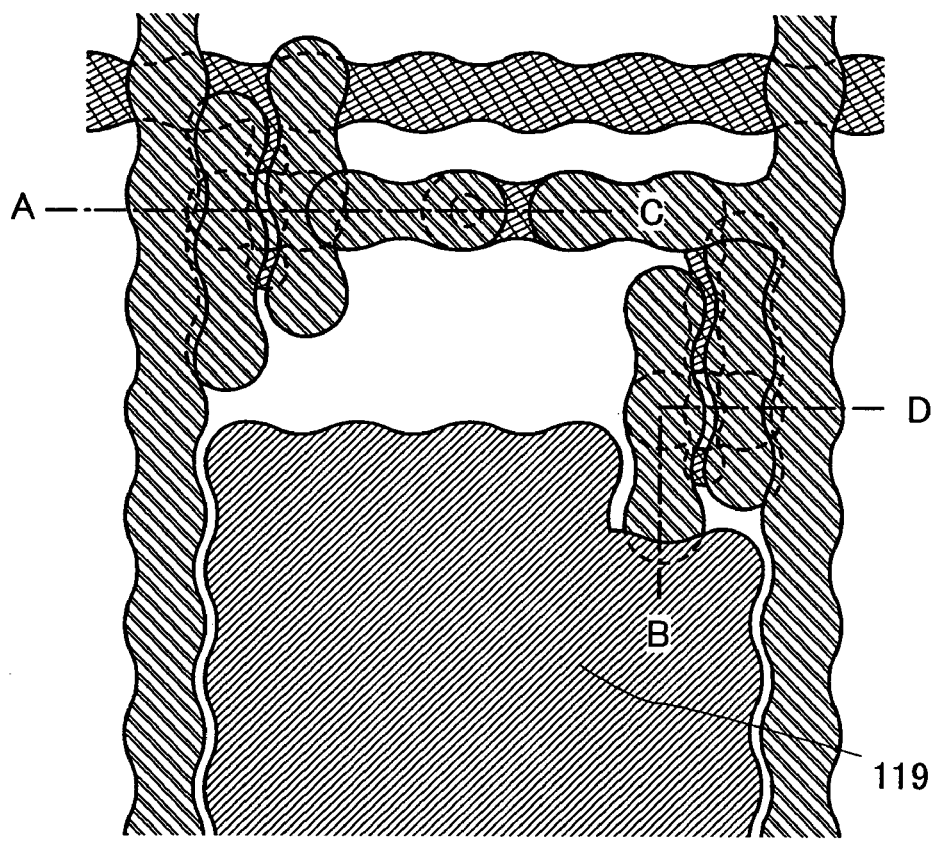
FIGS. 6A to 6C show a method of manufacturing a display device of the present invention.
Figure 6B:
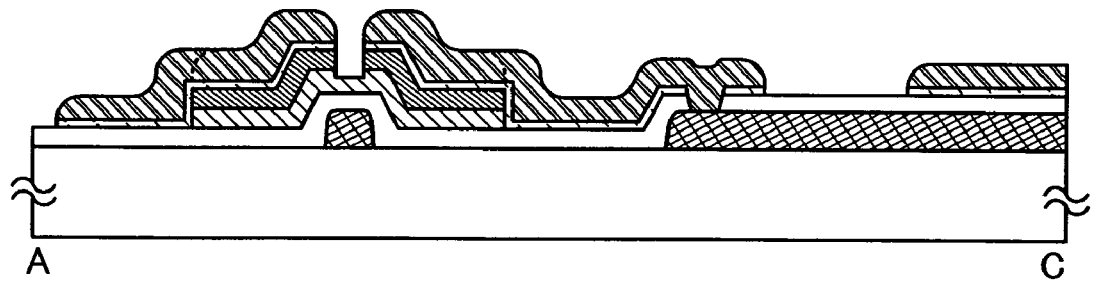
Figure 6C:
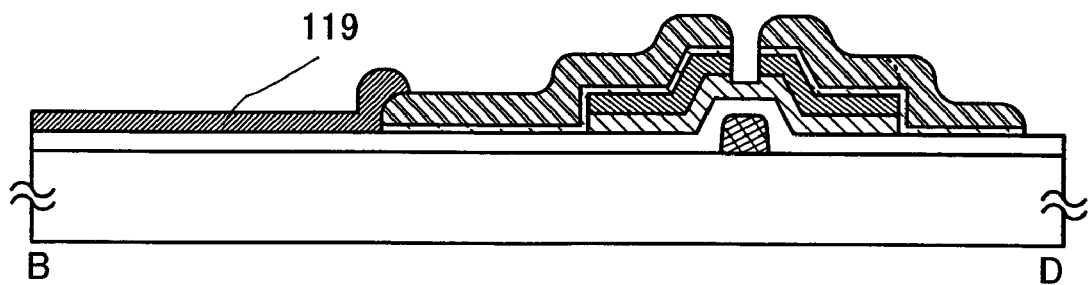
Figure 7A:
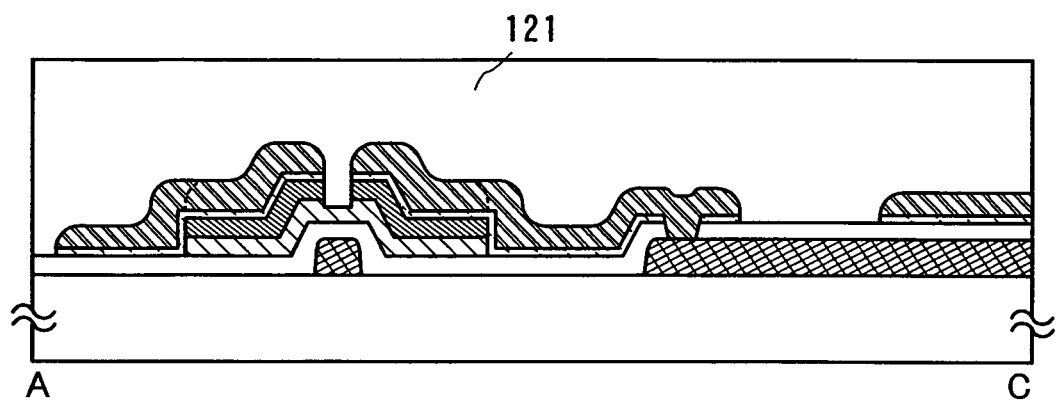
FIGS. 7A and 7B show a method of manufacturing a display device of the present invention.
Figure 7B:
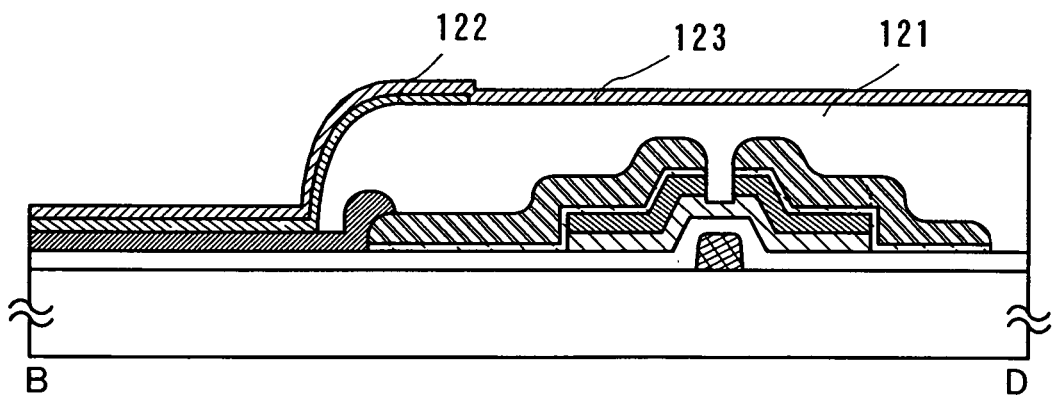

Subsequently, a first electrode layer 119 is formed by selectively discharging a composition containing a conductive material over the gate insulating layer 105 (FIGS. 6A to 6C). When light is emitted from a substrate 100 side, the first electrode layer 119 may be formed by forming a predetermined pattern using a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), or the like, and by baking the pattern.

Preferably, the first electrode layer 119 is formed of indium tin oxide (ITO), indium tin oxide containing silicon oxide (ITSO), zinc oxide (ZnO), or the like by sputtering. It is more preferable to use indium tin oxide containing silicon oxide formed by sputtering using a target of ITO containing silicon oxide of 2 wt % to 10 wt %. In addition, a conductive material in which ZnO is doped with gallium (Ga), or indium zinc oxide (IZO) formed by using a target containing silicon oxide, in which indium oxide is mixed with zinc oxide (ZnO) of 2 wt % to 20 wt %, may be used. After the first electrode layer 119 is formed by sputtering, a mask layer may be formed by a droplet discharge method, and the desired pattern may be formed by etching. In this embodiment mode, the first electrode layer 119 is formed of a light-transmitting conductive material by a droplet discharge method. Specifically, it is formed by using indium tin oxide or ITSO made of ITO and silicon oxide.

In this embodiment mode, an example in which the gate electrode layer, the semiconductor layer, the source or drain electrode layer, and a first electrode layer are directly formed by a plurality of discharging steps or in which those layers are formed by using mask layers formed to have a shape having knots by a plurality of discharging steps are described in detail. Accordingly, as shown in FIG. 6A, the shape of droplets is reflected in shapes of the gate electrode layer, the semiconductor layer, the source or drain electrode layer, and the first electrode layer, which have non-linear shapes and have shapes having knots with uneven line width.

Figure 34:
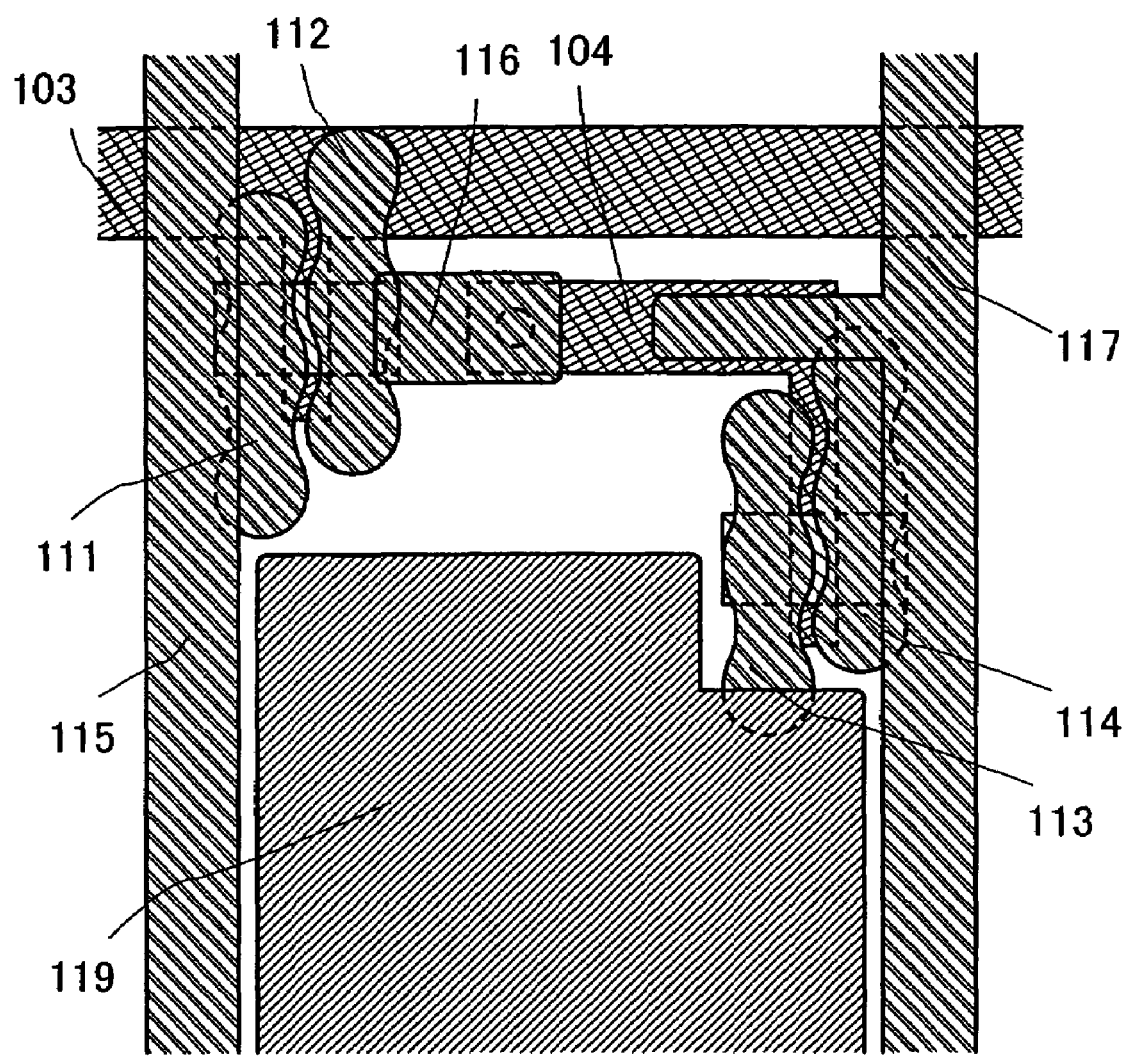
FIG. 34 is a top view of a display device of the present invention.

The present invention may be used particularly in order to form the source electrode layer and the drain electrode layer with stability, and processing of the gate electrode layer, the semiconductor layer, or the like may be performed by using a resist mask or the like. An example of such a case is shown in FIG. 34. In FIG. 34, since the source or drain electrode layers 111 and 112 are formed by using the present invention, they can be formed with stability even when a distance therebetween is short. The same applies to the case of the source or drain electrode layers 113 and 114.

Before forming the source or drain electrode layer 113, the first electrode layer 119 can be selectively formed over the gate insulating layer 105. In this case, differently from the embodiment mode, the first electrode layer 119 and the source or drain electrode layer 113 has a connection structure in which a part of the source or drain electrode layer 113 overlaps a part of the first electrode layer 119. When the first electrode layer 119 is formed ahead of the source or drain electrode layer 113, the first electrode layer 119 can be formed over a flat formation region. Therefore, the first electrode layer 119 can be formed with high planarity and good coverage since a polishing treatment such as CMP can be carried out sufficiently.

In addition, an insulating layer to be an interlayer insulating layer may be further formed over the source or drain electrode layer 113 and electrically connected to the first electrode layer 119 through a wiring layer. In this case, the opening portion (contact hole) can be formed by removing the insulating layer. Alternatively, a low wettability substance with respect to the insulating layer can be formed over the source or drain electrode layer 113. Then, a composition containing an insulating material is formed by a coating method, and an insulating layer is formed in a region except for a region where the low wettability substance is formed.

After the insulating layer is solidified by heating or drying, the low wettability substance is removed to form an opening portion. A wiring layer is formed so as to fill the opening portion, and the first electrode layer 119 is formed so as to be in contact with the wiring layer. In this manner, etching is not required to form the opening portion, which is effective in simplifying the manufacturing process.

In the case of having a structure in which generated light is emitted to a side opposite to the substrate 100 side or when a top emission type EL display panel is manufactured, a composition which contains metal particles of Ag (silver), Au (gold), Cu (copper), W (tungsten), Al (aluminum), or the like as a main component can be used. Alternatively, the first electrode layer 119 may be formed by forming a transparent conductive film or a light-reflective conductive film by sputtering, forming a mask pattern by a droplet discharge method, and then combining with etching processing.

The first electrode layer 119 may be polished by CMP or by cleaning with a polyvinyl alcohol-based porous body so that a surface of the first electrode layer 119 is planarized. In addition, after polishing by CMP, ultraviolet irradiation, an oxygen plasma treatment, or the like may be performed on the surface of the first electrode layer 119.

By the above steps, a TFT substrate for a display panel, in which a bottom gate type TFT is connected to the first electrode layer 119 over the substrate 100, is completed. The TFT in this embodiment mode is an inverted staggered type.

Subsequently, an insulating layer (also referred to as a partition wall) 121 is selectively formed. The insulating layer 121 is formed to have an opening portion over the first electrode layer 119. In this embodiment mode, the insulating layer 121 is formed over the entire surface, and etched and processed into a desired shape by using a mask of a resist or the like. When the insulating layer 121 is formed by a droplet discharge method, a printing method, a dispenser method, or the like by which the insulating layer 121 can be formed directly and selectively, processing using etching is not necessarily required. The insulating layer 121 can also be formed to have a desired shape by a pretreatment of the present invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant high molecular weight material such as polyimide, aromatic polyamide, or polybenzimidazole; or a siloxane-based material. The insulating layer 121 may also be formed by using a photosensitive material or a non-photosensitive material such as acrylic or polyimide. The insulating layer 121 preferably has a shape in which a curvature radius changes continuously. Accordingly, the coverage of an electroluminescent layer 122 and a second electrode layer 123 which are formed over the insulating layer 121 is improved.

After forming the insulating layer 121 by discharging a composition by a droplet discharge method, a surface of the insulating layer 121 may be pressed with pressure to be planarized in order to improve its planarity. As a pressing method, an asperity may be smoothed by moving a roller-shaped object over the surface, or the surface may be perpendicularly pressed with a flat plate-shaped object. Alternatively, the asperity portion on the surface may be eliminated with an air knife after softening or melting the surface with a solvent or the like. CMP may be also used for polishing the surface. This step may be applied for planarizing a surface when an asperity is caused by a droplet discharge method. When the planarity is improved through the step, display unevenness or the like of the display panel can be prevented; therefore, a high-definition image can be displayed.

A light emitting element is formed over the substrate 100 which is a TFT substrate for a display panel (FIGS. 7A and 7B).

Before forming the electroluminescent layer 122, moisture in the first electrode layer 119 and the insulating layer 121 or moisture adsorbed to the surface is removed by performing a heat treatment at a temperature of 200° C. under atmospheric pressure. It is preferable to perform the heat treatment at a temperature of 200° C. to 400° C., preferably 250° C. to 350° C. under reduced pressure, and to form the electroluminescent layer 122 without exposure to atmospheric air by vacuum deposition or a droplet discharge method which is performed under reduced pressure.

As the electroluminescent layer 122, materials exhibiting light emission of red (R), green (G), and blue (B) are selectively formed by an evaporation method using respective evaporation masks, or the like. The materials exhibiting light emission of red (R), green (G), and blue (B) (low molecular weight materials, high molecular weight materials, and the like) can be formed by a droplet discharge method as in the case of a color filter. The droplet discharge method is preferable since the materials exhibiting R, G, and B light can be separately applied without using a mask. The second electrode layer 123 is formed to laminate the electroluminescent layer 122, and a display device having a display function using a light emitting element is completed.

Although it is not shown, it is effective to provide a passivation film so as to cover the second electrode layer 123. The passivation film which is provided at the time of forming a display device may have a single layer structure or a multi-layered structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond like carbon (DLC), or a nitrogen-containing carbon film (CN$_x$), or a laminate in which the insulating films are combined can be used. For example, a laminate of a nitrogen-containing carbon film (CN$_x$) and silicon nitride (SiN) can be used. Alternatively, an organic material can be used, for example, a laminate of high molecular weight material such as a styrene polymer. Further, a siloxane-based material may be also used.

At this time, it is preferable to use a film having good coverage for the passivation film. A carbon film, especially a DLC film, is effective. The DLC film can be formed at a temperature ranging from room temperature to 100° C.; therefore, the DLC film can be easily formed over an electroluminescent layer having low heat resistance. The DLC film can be formed by plasma CVD (typically, RF plasma CVD, microwave CVD, electron cyclotron resonance (ECR) CVD, heat filament CVD, or the like), a combustion flame method, sputtering, an ion beam deposition method, a laser deposition method, or the like. A hydrogen gas and a hydrocarbon-based gas (for example, CH$_4$, C$_2$H$_2$, C$_6$H$_6$, or the like) are used as a reaction gas which is used for forming the passivation film. The reaction gas is ionized by glow discharge, and the ions are accelerated to collide with a cathode with negative self bias; accordingly, the passivation film is formed. A CN film may be formed by using a C$_2$H$_4$ gas and an N$_2$ gas as the reaction gas. The DLC film has a high blocking effect on oxygen and can suppress the oxidation of the electroluminescent layer. Accordingly, the electroluminescent layer can be prevented from oxidizing during the subsequent sealing step.

As shown in FIG. 8B, a sealant 136 is formed and sealing is performed with a sealing substrate 140. Then, a flexible wiring substrate may be connected to a gate wiring layer which is formed so as to be electrically connected to the gate electrode layer 103 to electrically connect to the outside. The same applies to a source wiring layer which is formed so as to be electrically connected to the wiring layer 115 which also functions as a source wiring layer.

The substrate 100 having an element is sealed using a sealing substrate 140 with a filling agent 135 enclosed therebetween. The filling agent may be enclosed using dripping in the same manner as a liquid crystal material. Instead of the filling agent 135, the space may be filled with an inert gas such as nitrogen. In addition, by providing a drying agent in the display device, deterioration of a light emitting element due to moisture can be prevented. The position of the drying agent may be either on the sealing substrate 140 side or on the substrate 100 side over which elements are formed. Alternatively, the drying agent may be provided in a depression portion formed in the substrate, which is also the region provided with the sealant 136. When the drying agent is provided in an area which does not contribute to displaying such as a driver circuit region of the sealing substrate 140 or a wiring region, the aperture ratio is not decreased even when the drying agent is opaque. Alternatively, the filling agent 135 may be formed to contain an absorbent material to have a function as a drying agent. Accordingly, a display device having a display function using the light emitting element is completed (FIGS. 8A and 8B).

An FPC 139 is attached to a terminal electrode layer 137 for electrically connecting the inside of the display device to the outside thereof with an anisotropic conductive film 138 so as to be electrically connected to the terminal electrode layer 137.

FIG. 8A is a top view of a display device. As shown in FIG. 8A, a pixel region 150, scanning line driver regions 151a and 151b, and a connecting region 153 are sealed between the substrate 100 and the sealing substrate 140 with the sealant 136 therebetween, and a signal line driver circuit 152 formed with a driver IC is formed over the substrate 100. Thin film transistors 133 and 134 are provided in a driver circuit region, and thin film transistors 131 and 130 are provided in a pixel region severally.

In this embodiment mode, the case where a light emitting element is sealed with a glass substrate is described. Sealing is a treatment for protecting the light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capabilities, can be used. As for the cover material, glass, ceramics, plastics, or metal can be used. However, when light is emitted to the cover material side, the cover material needs to have light-transmitting properties. The cover material is attached to the substrate over which the above-mentioned light emitting element is formed with a sealant such as a thermosetting resin or an ultraviolet curable resin, and a sealed space is formed by curing the resin with a heat treatment or an ultraviolet irradiation treatment. It is also effective to provide an absorbent material typified by barium oxide in the sealed space. The absorbent material may be provided over the sealant or over a partition wall or a peripheral part so as not to block light emitted from the light emitting element. Further, it is also possible to fill the space between the cover material and the substrate over which the light emitting element is formed with a thermosetting resin or an ultraviolet curable resin. In this case, it is effective to add an absorbent material typified by barium oxide in the thermosetting resin or the ultraviolet curable resin.

Figure 36A:
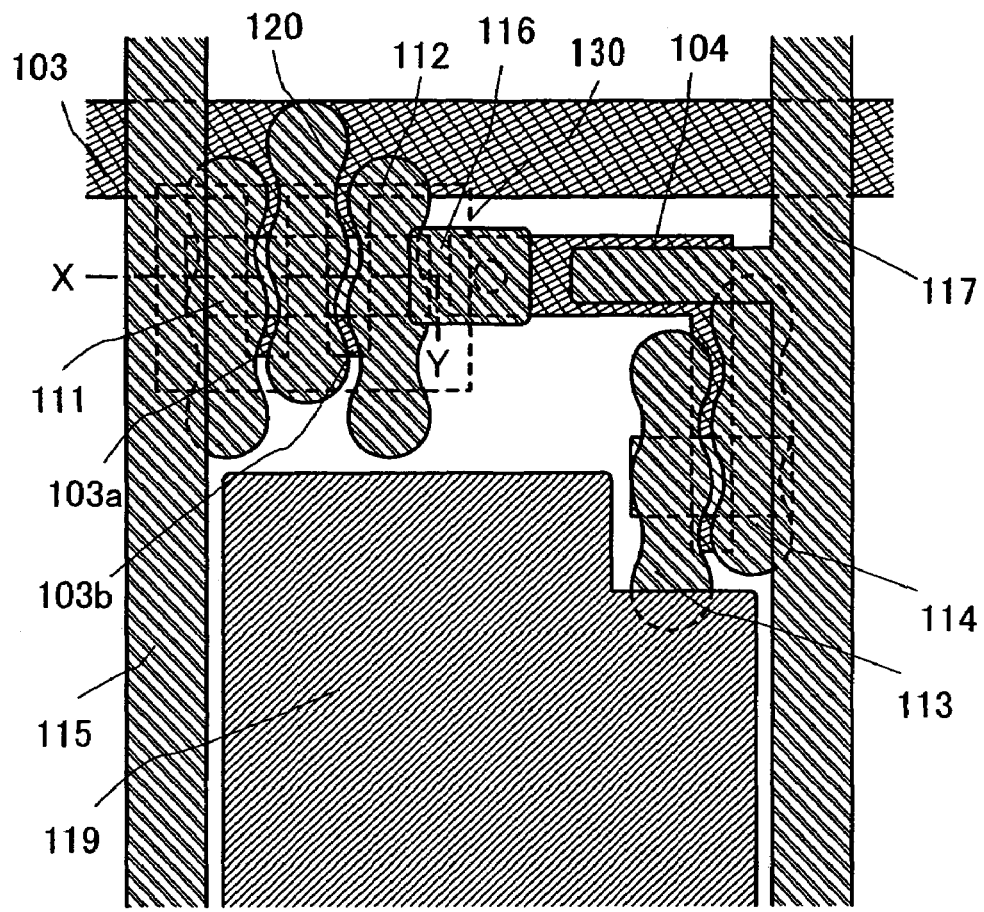
FIGS. 36A and 36B show a display device of the present invention.
Figure 36B:
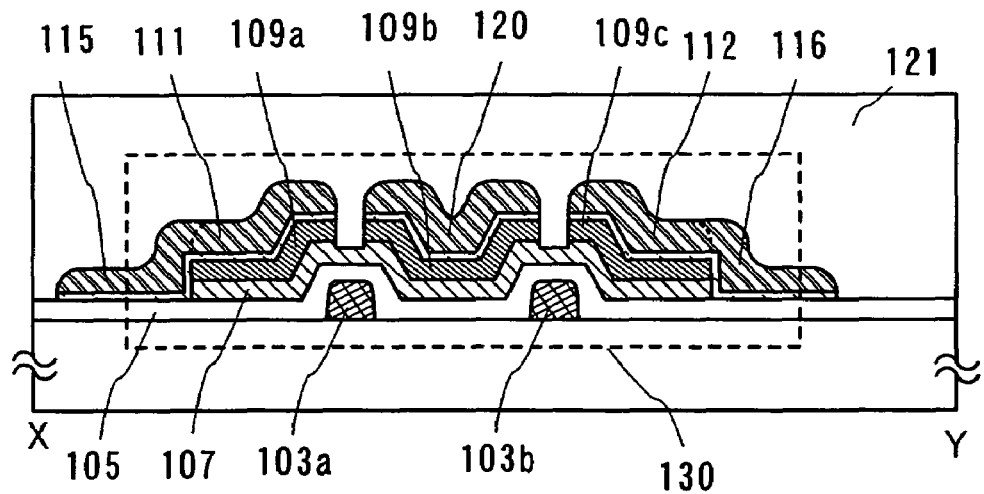

In this embodiment mode, although a single gate structure of a switching TFT is described in detail, a multi-gate structure such as a double gate structure may also be employed. FIGS. 36A and 36B show examples in which a thin film transistor 130 has a double gate structure. FIG. 36A is a top view of a pixel, and FIG. 36B is a sectional view taken along line X-Y in FIG. 36A. The thin film transistor 130 includes gate electrode layers 103a and 103b, a semiconductor layer 107, source or drain electrode layers 111, 120, and 112 which are in contact with n-type semiconductor layers 109a, 109b, and 109c, respectively. In this way, when there are three or more source or drain electrode layers adjacent to each other, they can be stably formed with uniform distances therebetween by using the present invention.

In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which is overlapped with a gate electrode layer, and a high concentration impurity region outside thereof.

As described above, a display panel can be easily manufactured using a glass substrate of the fifth generation or later having a side of 1,000 mm or more in this embodiment mode, by forming various kinds of patterns directly over a substrate using a droplet discharge method.

In accordance with the present invention, a desired pattern can be stably formed. Further, material loss and cost can be reduced. Hence, a display device with high performance and high reliability can be manufactured with high yield.

Embodiment Mode 3

Figure 18A:
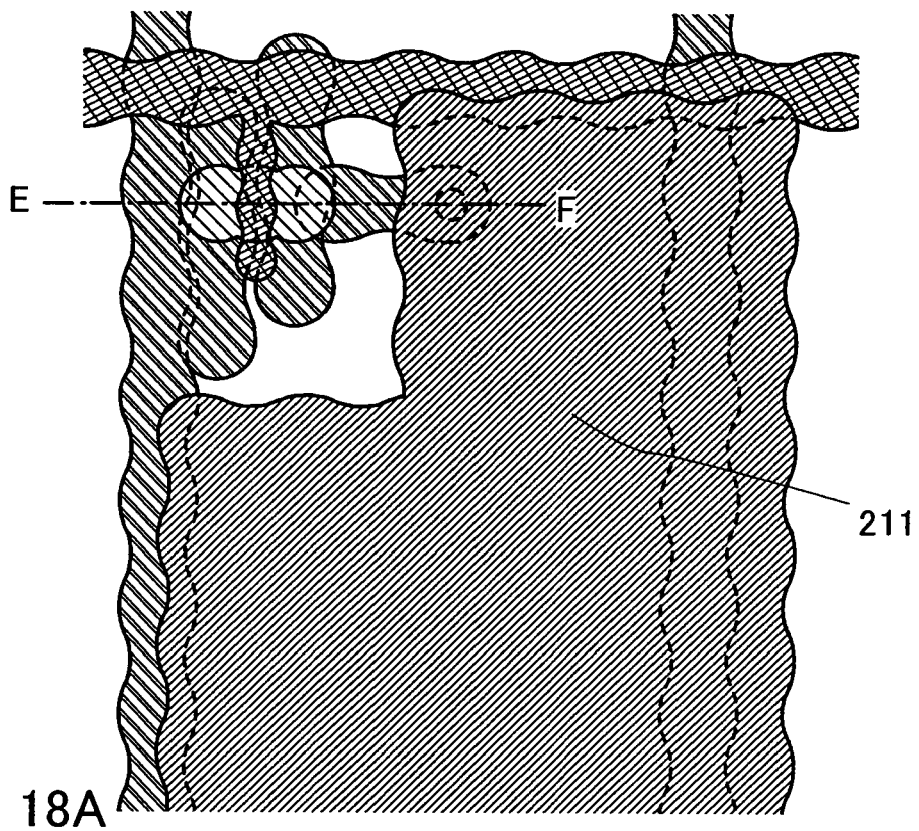
FIGS. 18A and 18B show a display device of the present invention.
Figure 18B:
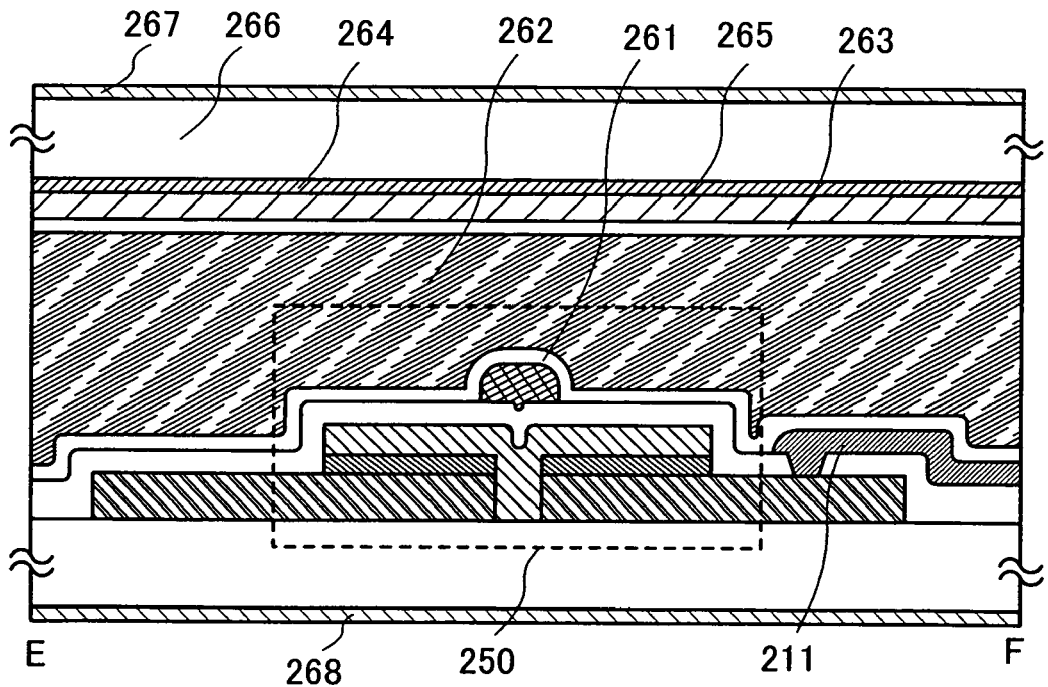
Figure 19A:
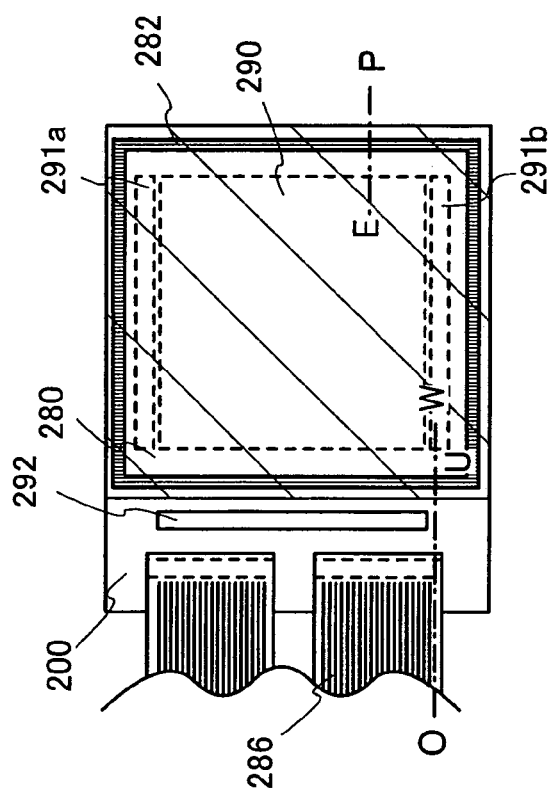
FIGS. 19A and 19B show a display device of the present invention.
Figure 19B:
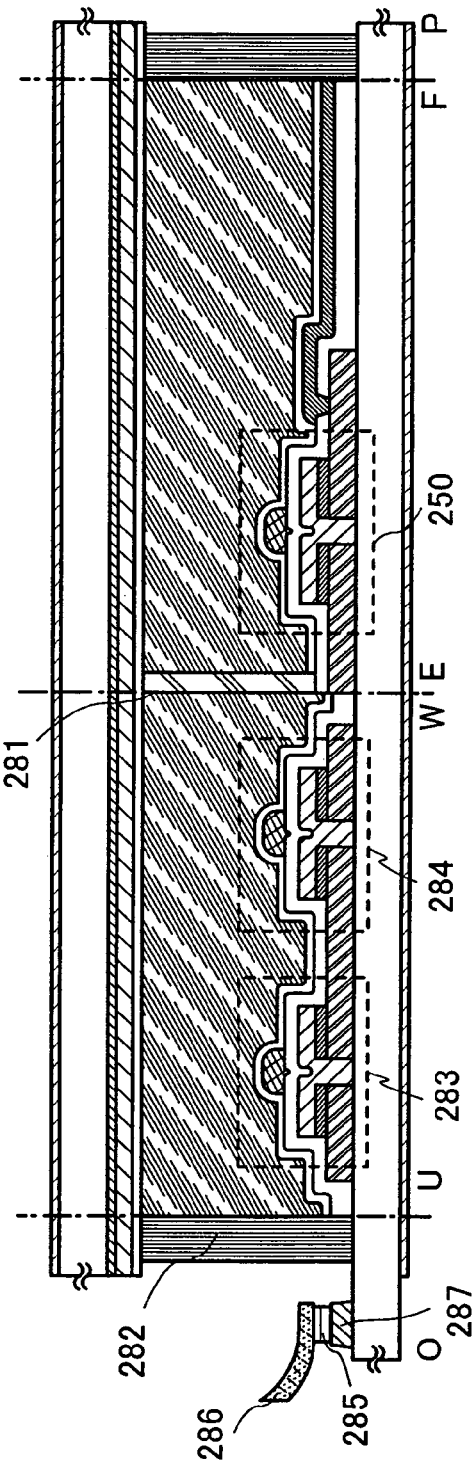

Embodiment Mode 3 of the present invention is described with reference to FIG. 13A to FIG. 19B. In more detail, a method of manufacturing a display device including a thin film transistor of a top gate planar structure using the present invention is described. FIGS. 13A, 14A, 15A, 16A, 17A, and 18A show a top view of a pixel portion of a display device. FIGS. 13B, 14B, 15B, 16B, 17B, and 18B show a sectional view taken along line E-F. FIG. 19A is also a top view of a display device, and FIG. 19B shows a sectional view taken along line O-W and line E-P in FIG. 19A. In addition, an example of a liquid crystal display device using a liquid crystal material for a display element is described. Repetitive explanations of the same portion and the portion having the same function are omitted.

A glass substrate made of barium borosilicate glass, alumino borosilicate glass, or the like; a quartz substrate; a metal substrate; or a plastic substrate which can withstand the process temperature of the manufacturing process is used as a substrate 200. In addition, an insulating layer may be formed over the substrate 200. The insulating layer is formed of a single layer or a laminated layer of an oxide material or a nitride material containing silicon by CVD, plasma CVD, sputtering, spin coating, or the like. Although the insulating layer is not necessarily formed, it has an effect of blocking contaminants or the like from the substrate 200.

A conductive film 201 is formed over the substrate 200. The conductive film 201 is formed by CVD, sputtering, a droplet discharge method, or the like. The conductive film 201 may be formed from an element selected from Ag, Au, Ni, Pt, Pd, Ir, Rh, Ta, W, Ti, Mo, Al, and Cu, an alloy material or a compound material containing the element as its main component. Alternatively, a semiconductor film typified by a polycrystalline silicon film doped with an impurity element such as phosphorus, or an AgPdCu alloy may be used. Either a single layer structure or a layered structure may be used. For example, a two-layer structure of a tungsten nitride (WN) film and a molybdenum (Mo) film or a three-layer structure in which a tungsten film, an alloy (Al—Si) film of aluminum and silicon, and a titanium nitride film are laminated in order may be used. In this embodiment, Al is used for the conductive film 201.

Figure 13A:
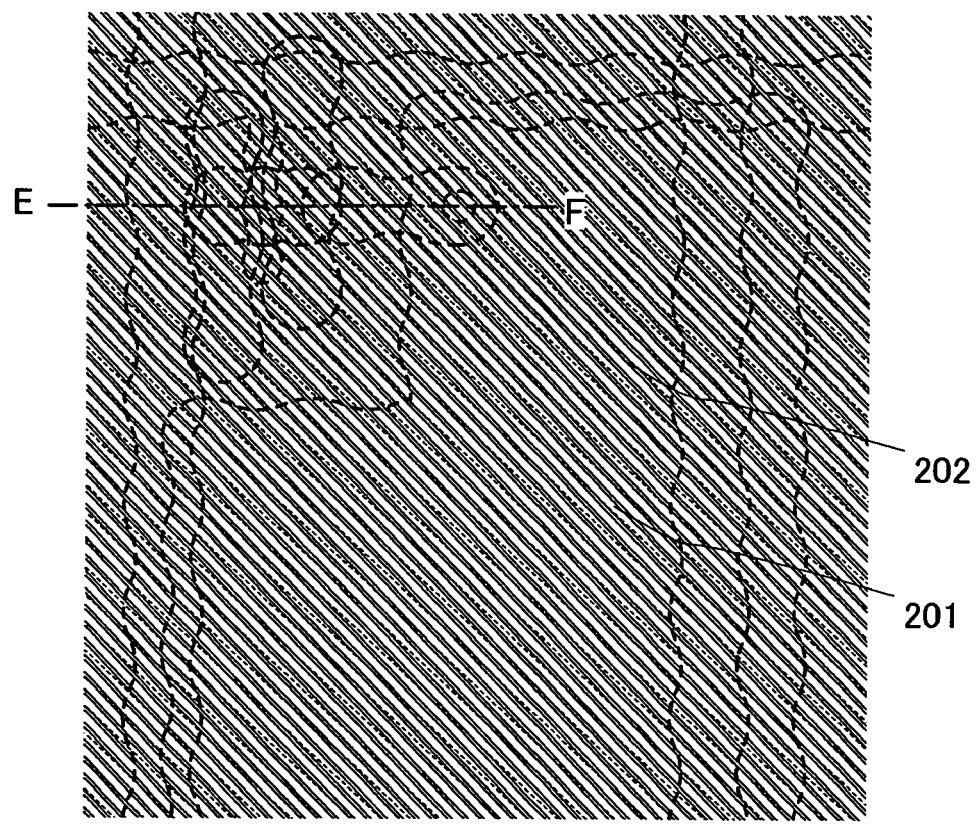
FIGS. 13A and 13B show a method of manufacturing a display device of the present invention.
Figure 13B:
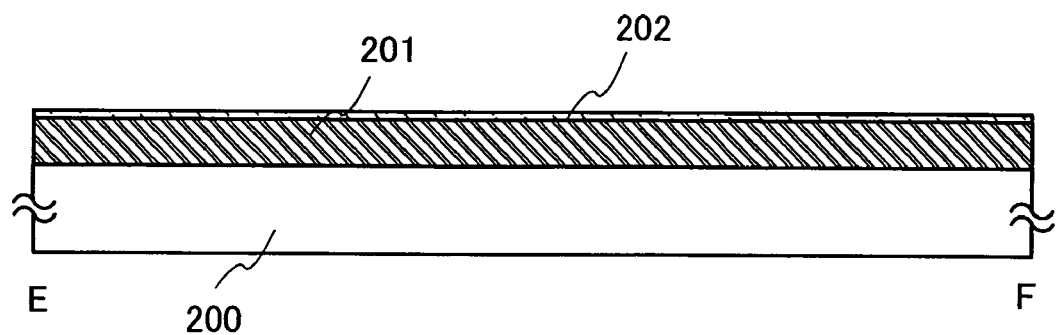

In this embodiment mode, mask layers are formed over the conductive film 201 by a droplet discharge method. Then, the conductive film 201 is processed into a desired shape to form a source or drain electrode layer. In order to form the source or drain electrode layer, which determines the channel width, with good controllability, mask layers are formed as described in Embodiment Mode 1. Wettability of a surface of the conductive film 201 with respect to a composition containing a mask layer forming material is controlled. In the embodiment mode, the source or drain electrode layer is necessarily formed with a thin line width in order to form a pixel region with a fine design. Therefore, in this embodiment mode, a treatment of reducing wettability of the surface of the conductive film 201 is carried out so that a droplet does not spread on the surface. Specifically, a low wettability substance 202 is formed over the conductive film 201 (FIGS. 13A and 13B).

As the low wettability substance, a substance containing a fluorocarbon chain or a substance containing a silane coupling agent can be used. In this embodiment mode, FAS is used as the low wettability substance 202 and a FAS film is formed by a coating method. This wettability is with respect to a liquid composition containing a mask layer forming material to be formed in a later step. In this embodiment mode, when mask layers are formed, the contact angle between a formation region and the composition containing a mask layer forming material is preferably 20 degrees or more, more preferably in the range of 20 degrees to 40 degrees.

Figure 14A:
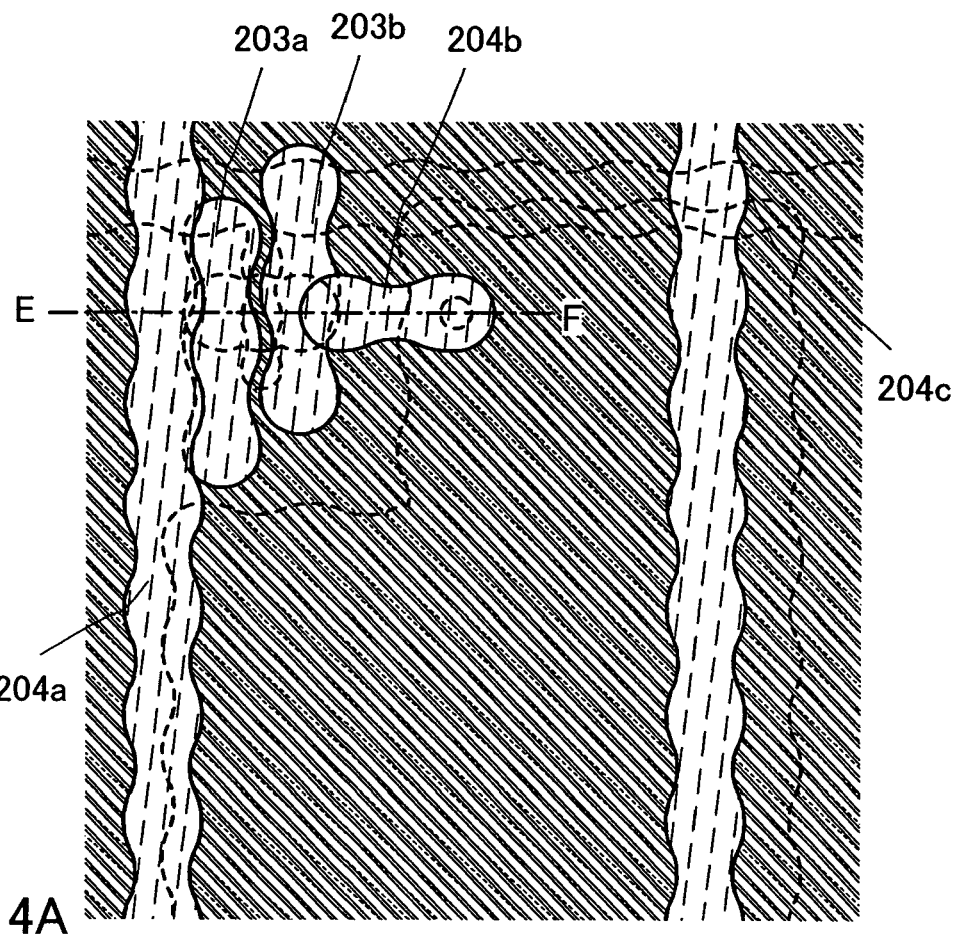
FIGS. 14A and 14B show a method of manufacturing a display device of the present invention.
Figure 14B:
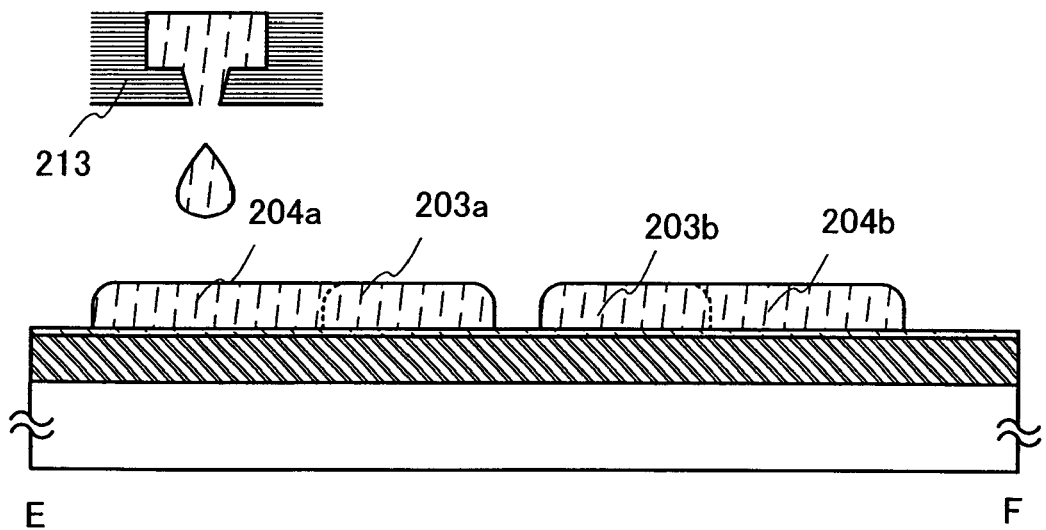

The composition containing a mask layer forming material is discharged over the low wettability substance 202 by a droplet discharge apparatus 213 in two separate steps to form mask layers 203a and 203b. The adjacent mask layers 203a and 203b are formed by staggering centers of droplets so that the centers of the droplets do not aligned in a line width direction and the mask layers formed in the same step are not adjacent to each other. The respective mask layers 203a and 203b have continuous shapes by discharging droplets of a plurality of steps so that droplets overlap each other. Therefore, the shapes include knots as shown in FIG. 14A, that has an uneven line width. In a discharging step of this embodiment mode, since positions of the droplets to be discharged is controlled, parts of the adjacent mask layers 203a and 203b each having a widest line width are not connected to each other, and the mask layers 203a and 203b can be formed adjacently with a shorter distance therebetween with stability. Mask layers 204a, 204b, and 204c are formed with continuous shapes by a droplet discharge method, in which droplets are discharged through a plurality of steps (FIGS. 14A and 14B).

Figure 15A:
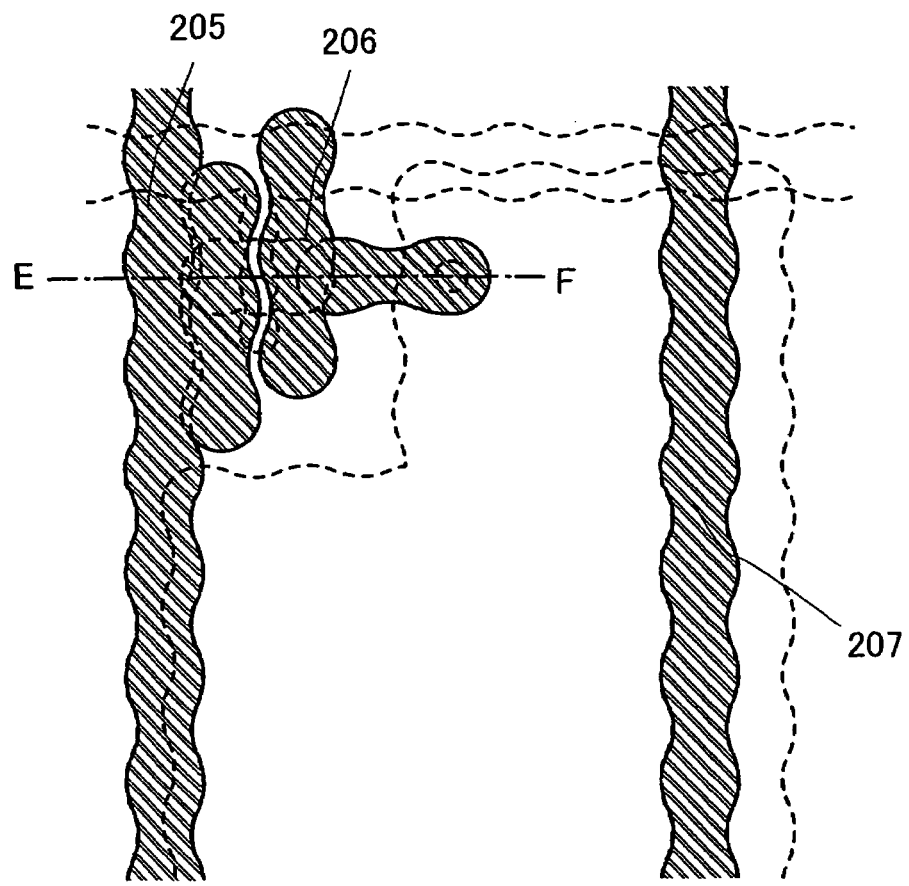
FIGS. 15A and 15B show a method of manufacturing a display device of the present invention.
Figure 15B:
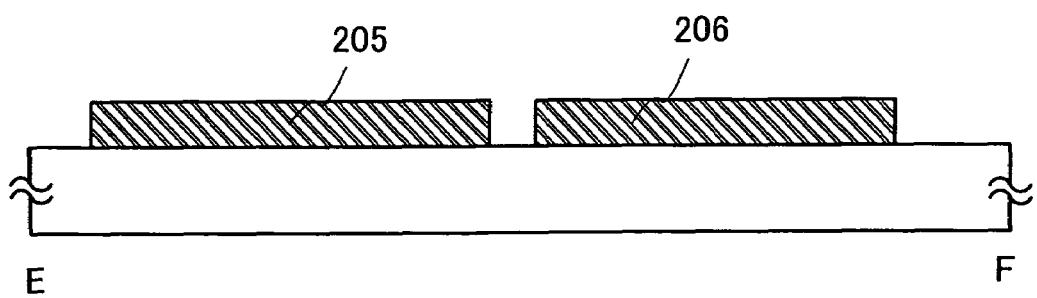

The conductive film 201 is processed into a desired shape by using the mask layers 203a, 203b, 204a, 204b, and 204c to form source or drain electrode layers 205 and 206 and a capacitor wiring layer 207 (FIGS. 15A and 15B). The source or drain electrode layers 205 and 206 can be formed to have a stable distance therebetween with desired shapes without defective formation. Since the distance between conductive layers can be reduced, the channel width can be reduced when using the conductive layers as a source electrode layer and a drain electrode layer. Accordingly, a semiconductor device which can operate at high speed can be manufactured with high performance and reliability. Since defective formation is reduced in a manufacturing process, there are effects of improving yield and increasing productivity.

In this embodiment mode, after forming the source or drain electrode layers 205 and 206 and the capacitor wiring layer 207, the mask layers are removed, ultraviolet irradiation is performed, and the low wettability substance 202 is decomposed and removed.

Figure 16A:
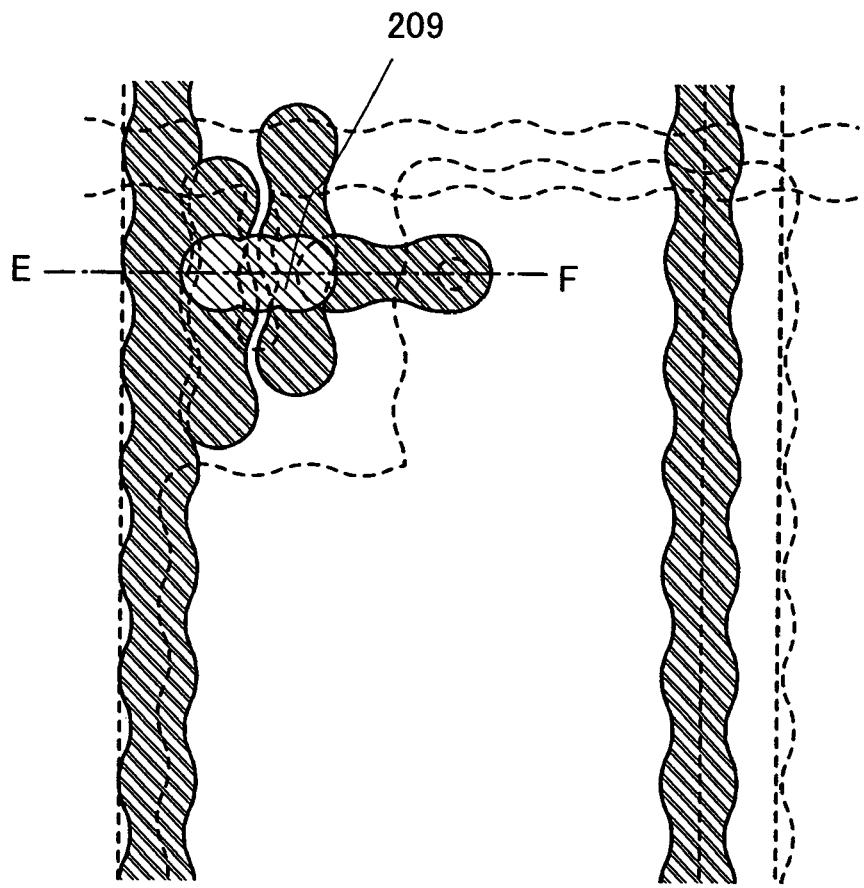
FIGS. 16A and 16B show a method of manufacturing a display device of the present invention.
Figure 16B:
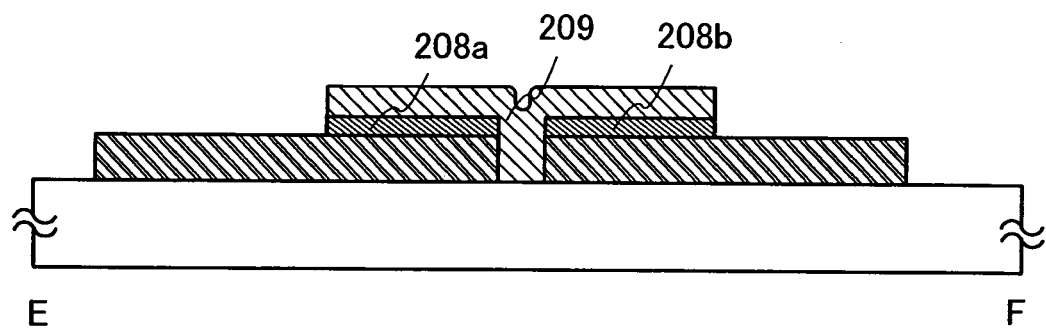

N-type semiconductor layers are formed over the source or drain electrode layers 205 and 206 and etched by using masks made of a resist or the like. The resist may be formed by a droplet discharge method. A semiconductor layer is formed over the n-type semiconductor layers and again processed by using masks or the like. Then, n-type semiconductor layers 208a and 208b and a semiconductor layer 209 are formed (FIGS. 16A and 16B). The n-type semiconductor layers may be formed by sequentially laminating a semiconductor layer containing an impurity element imparting n-type conductivity at higher concentration and a semiconductor layer containing an impurity element imparting n-type conductivity at lower concentration over the source or drain electrode layers.

Next, a gate insulating layer 212 is formed over the source electrode layer, the drain electrode layer, and the semiconductor layer. The gate insulating layer 212 may be formed of a single layer or laminated layers of a material such as a silicon oxide material or a silicon nitride material. In this embodiment mode, a laminate of three layers of a silicon nitride film, a silicon oxide film, and a silicon nitride film is used.

Figure 17A:
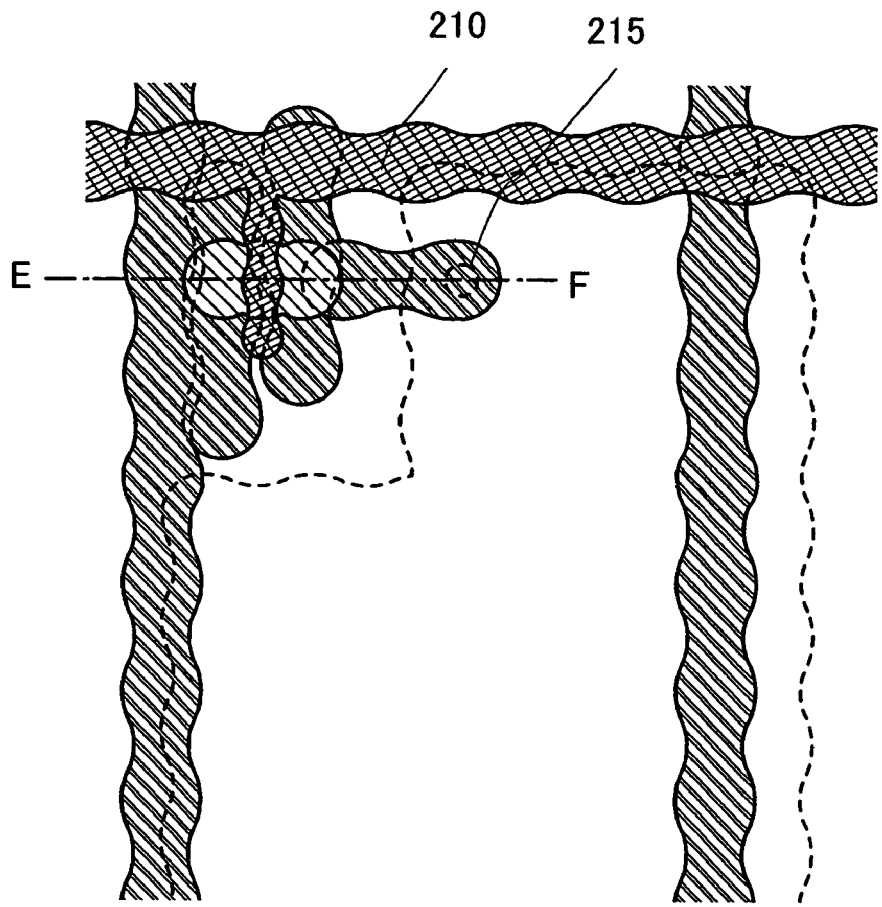
FIGS. 17A and 17B show a method of manufacturing a display device of the present invention.
Figure 17B:
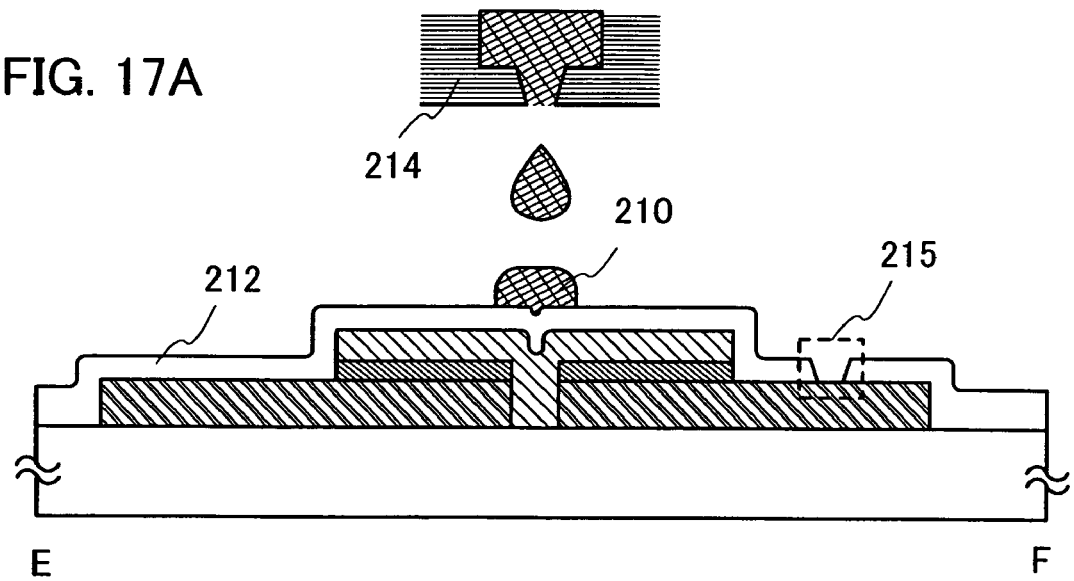

Subsequently, a mask made of a resist or the like is formed over the gate insulating layer 212 and the gate insulating layer 212 is etched to form a through hole 215 (FIGS. 17A and 17B). In this embodiment mode, the mask is selectively formed by a droplet discharge method.

A composition containing a conductive material is discharged over the gate insulating layer 212 with a droplet discharge apparatus 214 to form a gate electrode layer 210. As in the case of forming the source or drain electrode layers, wettability of a formation region of a gate electrode layer may be controlled. In this embodiment mode, wettability of a formation region of the gate electrode layer 210 is controlled, and the gate electrode layer 210 has a continuous shape by a plurality of discharging steps. Therefore, the gate electrode layer 210 also has a shape having knots. Although it is not shown, wettability of the gate electrode layer 210 in forming is controlled in the same manner as that the low wettability substance 202 is formed over the conductive film 201.

A pixel electrode layer 211 is formed by forming a conductive film and processing the conductive film by using a mask layer by a droplet discharge method as in the case of the source or drain electrode layer. Therefore, the pixel electrode layer 211 has a shape having a curvature at the periphery, which reflects the shape of the mask layer formed by a droplet discharge method (FIG. 18A). The pixel electrode layer 211 is electrically connected to the source or drain electrode layer 206 by the through hole 215 formed previously. The pixel electrode layer 211 can be formed by using the same material as that of the first electrode layer 119 in Embodiment Mode 2. In the case of manufacturing a transmissive liquid crystal display panel, a predetermined pattern is formed by using a composition containing indium tin oxide (ITO), indium tin oxide containing silicon oxide (ITSO), zinc oxide (ZnO), tin oxide ($SnO_2$), or the like by baking. In this way, a thin film transistor 250, which is a staggered type thin film transistor of the embodiment mode, is manufactured (FIG. 18B).

In this embodiment mode, an example in which the gate electrode, the semiconductor layer, the source or drain electrode layer, and the pixel electrode layer are directly formed by a plurality of discharging steps or in which the above layers are formed by using a mask layer formed to have a shape having knots by a plurality of discharging steps is described in detail. As shown in FIG. 18A, shapes of the gate electrode layer, the semiconductor layer, the source or drain electrode layer, and the pixel electrode layer reflect shapes of droplets and have non-linear shapes having knots with uneven line width.

Figure 35:
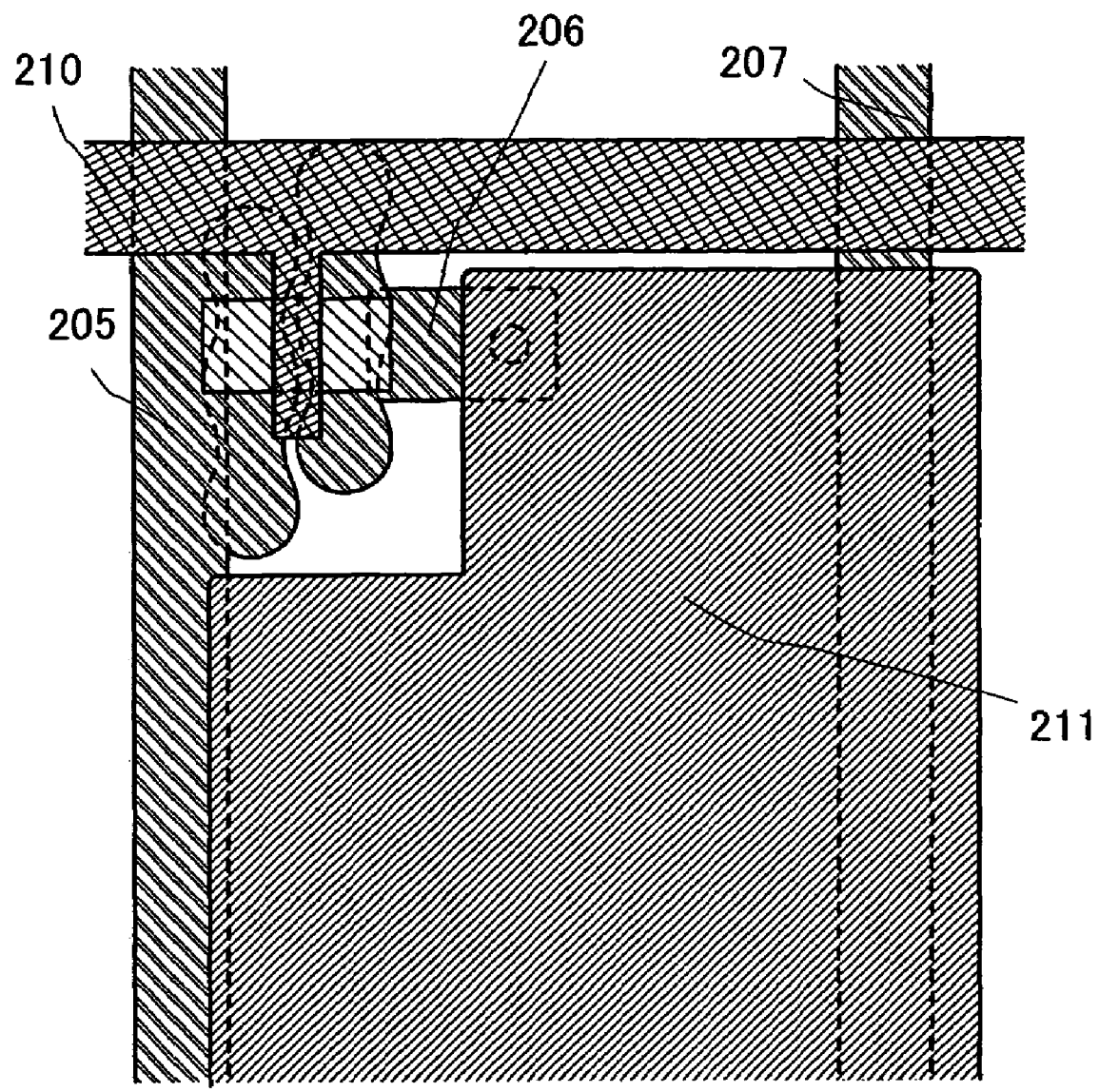
FIG. 35 is a top view of a display device of the present invention.

The present invention may be used specially to form a stable source or drain electrode layer. Other gate electrode layer, a semiconductor layer, and the like may be processed by using a resist mask or the like. An example of such a case is shown in FIG. 35. In FIG. 35, since the present invention is used to form the source or drain electrode layers 205 and 206, the source or drain electrode layers 205 and 206 can be stably formed even when a distance therebetween is short.

Next, an insulating layer 261 called an orientation film is formed by a dispenser method, a printing method, or a spin coating method to cover the pixel electrode layer 211 and the thin film transistor 250. The insulating layer 261 can be selectively formed using a screen printing method or an offset printing method. Then, a rubbing treatment is performed. A sealant 282 is formed at the periphery of the region where a pixel is formed by a droplet discharge method.

Subsequently, an opposite substrate 266 provided with an insulating layer 263 functioning as an orientation film, a colored layer 264 functioning as a color filter, a conductive layer 265 functioning as an opposite electrode, and a polarizing plate 267 is attached to the TFT substrate 200 with a spacer 281 interposed therebetween. By providing a space with a liquid crystal layer 262, a liquid crystal display device can be manufactured (FIGS. 18A to 19B). A polarizing plate 268 is formed on an opposite side to the side of the substrate 200 having a TFT. A sealant may be mixed with a filler, and further, the opposite substrate 266 may be provided with a shielding film (black matrix) or the like. Note that a dispenser method (a dropping method) or a dip method (a pumping method) by which a liquid crystal is injected utilizing a capillary phenomenon after attaching the opposite substrate 266 can be used as a method of forming the liquid crystal layer 262.

Figure 30:
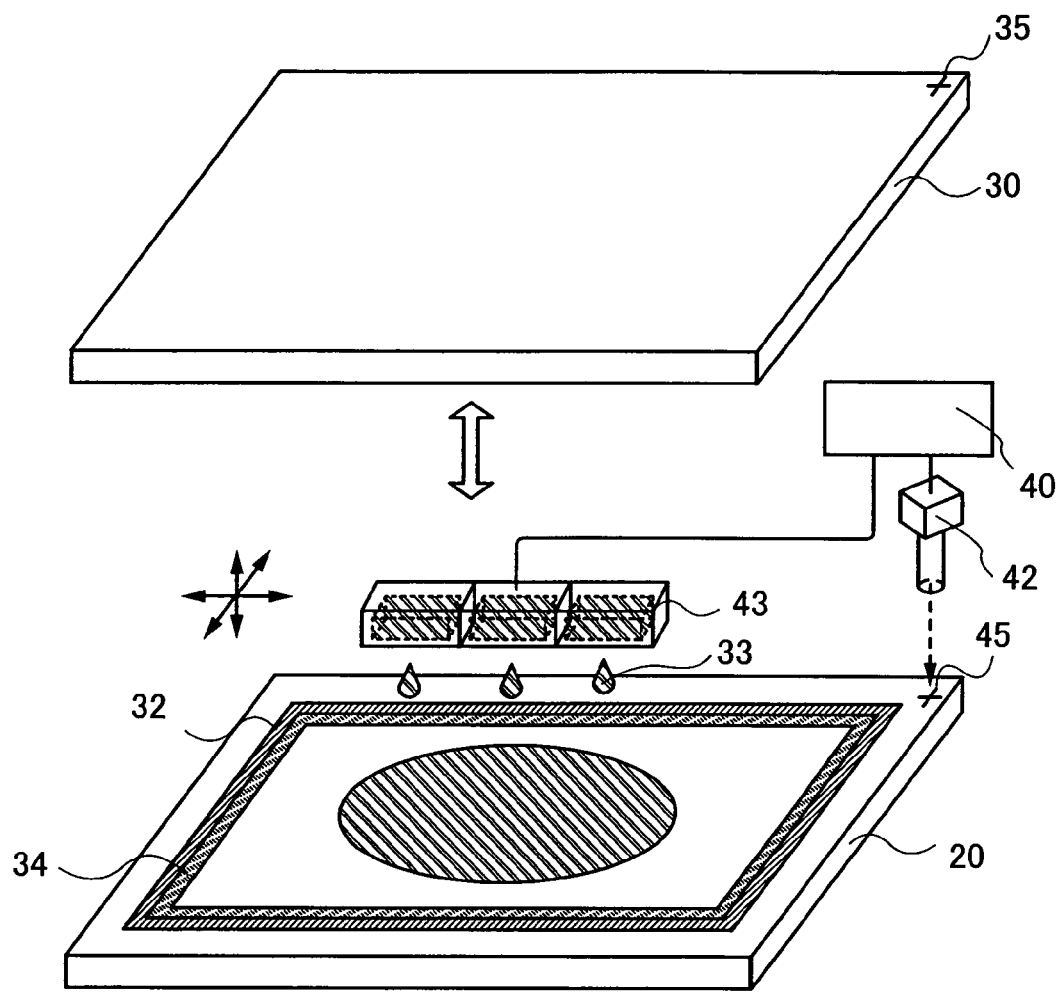
FIG. 30 shows a structure of a droplet discharge apparatus applicable to the present invention.

A liquid crystal drop injection method employing the dispenser method will be described with reference to FIG. 30. In FIG. 30, reference numeral 40 denotes a control device; 42, an imaging device; 43, a head; 33, a liquid crystal; 35 and 45, markers; 34, a barrier layer; 32, a sealant; 30, a TFT substrate; and 20, an opposite substrate. A closed loop is formed with the sealant 32, and the liquid crystal 33 is dropped once or a plurality of times therein from the head 43. Since the head 43 has a plurality of nozzles, it can drop a large amount of liquid crystal material at one time, which improves throughput. When the liquid crystal material has high viscosity, the liquid crystal material is continuously discharged and attached to a liquid crystal formation region without a break. On the other hand, when the liquid crystal material has low viscosity, the liquid crystal material is intermittently discharged to drop a droplet. At this time, the barrier layer 34 is provided to prevent the sealant 32 and the liquid crystal 33 from reacting with each other. Subsequently, the substrates are attached in vacuum, and then, ultraviolet curing is performed to make the space filled with the liquid crystal. Alternatively, a sealant may be formed on a TFT substrate side, and a liquid crystal may be dropped.

The spacer may be provided by dispersing particles of several μm; however, in this embodiment mode, the spacer is provided by forming a resin film over an entire surface of the substrate and processing it into a desired shape. After coating the substrate with such a spacer material using a spinner, the spacer material is formed into a predetermined pattern by light exposure and a developing treatment. Further, the pattern is cured by heating at a temperature of 150° C. to 200° C. with a clean oven. The spacer manufactured in this manner can have different shapes depending on the condition of the light exposure or the developing treatment. It is preferable that the spacer have a pillar shape with a flat top portion since the mechanical strength as a liquid crystal display device can be secured when the opposite substrate is attached to the substrate. The shape of the spacer is not particularly limited, and it may have a shape of a circular cone or a pyramid.

A connection portion is formed to connect the inside of the display device formed through the above steps and an external wiring substrate. The insulating layer of the connection portion is removed by an ashing treatment using an oxygen gas under atmospheric pressure or pressure close to the atmospheric pressure. This treatment is performed by using the oxygen gas and one or more gases of hydrogen, $CF_4$, $NF_3$, $H_2O$, and $CHF_3$. In this process, the ashing treatment is performed after sealing with the opposite substrate to prevent damage or destruction due to static electricity; however, the ashing treatment may be performed at any timing as long as there are few effects of static electricity.

An FPC (flexible printed circuit) 286 which is a wiring substrate for connecting is attached to a terminal electrode layer 287, which electrically connects to a pixel portion, with an anisotropic conductive film 285 interposed therebetween (FIG. 19B). The FPC 286 has a function of transmitting a signal or an electric potential from the external. Through the above-mentioned steps, a liquid crystal display device having a display function can be manufactured.

FIG. 19A is a top view of the liquid crystal display device. As shown in FIG. 19A, a pixel region 290 and a scanning line driver regions 291a and 291b are sealed between the substrate 200 and the opposite substrate 280 with the sealant 282, and a signal line driver circuit 292 formed with an IC driver is provided over the substrate 200. A driver circuit having thin film transistors 283 and 284 is provided in a driver region.

Since the thin film transistors 283 and 284 are n-channel thin film transistors, an NMOS circuit including the thin film transistors 283 and 284 is provided as a peripheral driver circuit in this embodiment mode.

In this embodiment, an NMOS structure is used in a driver circuit region so as to obtain a function of an inverter. In the case of using only a PMOS structure or an NMOS structur as such a case, gate electrode layers of a part of TFTs are connected to each source or drain electrode layer.

In this embodiment mode, although a single gate structure of a switching TFT is shown, a double gate structure or a multi-gate structure may also be employed. In the case where a semiconductor is manufactured using a SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region or a region which is overlapped with a gate electrode layer, and a high concentration impurity region outside thereof.

As described above, the process can be simplified in this embodiment mode. Also, by forming various kinds of components (parts) or a mask layer directly over a substrate using a droplet discharge method, a display panel can be easily manufactured using a glass substrate of the fifth generation or later having a side of 1,000 mm or more.

In accordance with the present invention, a component of a display device can be formed with a desired pattern with good controllability. Further, material loss and cost can be reduced. Hence, a liquid crystal display device with high performance and high reliability can be manufactured with high yield.

Embodiment Mode 4

A thin film transistor can be formed using the present invention, and a display device can be formed using the thin film transistor. When a light emitting element is used and an n-channel transistor is used as a transistor which drives the light emitting element, light emitted from the light emitting element performs any one of bottom emission, top emission, and dual emission. Here, a lamination structure of the light emitting element corresponding to each emission type will be described with reference to FIGS. 12A to 12C.

Further, in this embodiment mode, channel protective thin film transistors 461, 471, and 481 using the present invention are used. The thin film transistor 481 is provided over a light-transmitting substrate 480 and includes a gate electrode layer 493, a gate insulating film 497, a semiconductor layer 494, n-type semiconductor layers 495a and 495b, low wettability substance 482a and 482b, source or drain electrode layers 487a and 487b, and a channel protective layer 496. When the source or drain electrode layers 487a and 487b are formed by the droplet discharge method shown in Embodiment Mode 1, the source and drain electrode layers can be formed in a predetermined position to have a distance therebetween. Therefore, since the channel width is determined depending on the distance between the source and drain electrode layers, even when the distance between the source and drain electrode layers is set short, the source and drain electrode layers can be formed without contacting with each other due to defective formation. The thin film transistor 481 having such source and drain electrode layers can operate at high speed and have a high reliability.

In this embodiment mode, a crystalline semiconductor layer is used as the semiconductor layer, and an n-type semiconductor layer is used as a semiconductor layer having one conductivity type. Instead of forming the n-type semiconductor layer, the semiconductor layer may be provided with conductivity by a plasma treatment using a $PH_3$ gas. The semiconductor layer is not limited to this embodiment mode, and an amorphous semiconductor layer can be used as in Embodiment Mode 1. In the case of using a crystalline semiconductor layer of polysilicon or the like as in this embodiment mode, an impurity region having one conductivity type may be formed by introducing (adding) an impurity into the crystalline semiconductor layer without forming the semiconductor layer having one conductivity type. Further, an organic semiconductor of such as pentacene can be used. When an organic semiconductor is selectively formed by a droplet discharge method or the like, the step of processing into a desired shape can be simplified.

In the embodiment mode, an amorphous semiconductor layer is crystallized to form a crystalline semiconductor layer as the semiconductor layer 494. In the crystallizing step, the amorphous semiconductor layer is doped with an element (also referred to as a catalytic element or a metal element) which promotes crystallization, and a heat treatment (at a temperature of 550° C. to 750° C. for 3 minutes to 24 hours) is performed to crystallize the amorphous semiconductor layer. As the element promoting the crystallization, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment mode, nickel is used.

In order to remove the element which promotes crystallization from the crystalline semiconductor layer or reduce the element, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, an n-type semiconductor layer containing phosphorus (P) which is an impurity element imparting n-type conductivity is formed as the semiconductor layer containing the impurity element which functions as a gettering sink. The n-type semiconductor layer is formed over the crystalline semiconductor layer containing the element which promotes crystallization, and a heat treatment (at a temperature of 550° C. to 750° C. for 3 minutes to 24 hours) is performed. The element promoting crystallization in the crystalline semiconductor layer moves into the n-type semiconductor layer, and the element promoting crystallization in the crystalline semiconductor layer is removed or reduced to form the semiconductor layer 494. On the other hand, the n-type semiconductor layer becomes an n-type semiconductor layer containing the metal element which is the element promoting crystallization, and then processed into a predetermined shape to become n-type semiconductor layers 495a and 495b. The n-type semiconductor layers 495a and 495b function as gettering sinks of the semiconductor layer 494 and also function as source or drain regions directly.

In this embodiment mode, a crystallizing step and a gettering step for the semiconductor layer are performed by a plurality of heat treatments; however, the crystallizing step and gettering step can be performed by one heat treatment. In this case, a heat treatment may be performed after forming an amorphous semiconductor layer, doping with an element promoting crystallization, and forming a semiconductor layer functioning as a gettering sink.

In the embodiment mode, a gate insulating layer is formed by laminating a plurality of layers, and a gate insulating film 497 has a two-layer structure formed by laminating a silicon nitride oxide film and a silicon oxynitride film in this order from a gate electrode layer 493 side. The laminated insulating layers are preferably formed continuously at the same temperature in the same chamber by changing reaction gases while maintaining a vacuum state. When the layers are continuously laminated while maintaining the vacuum state, an interface between the laminated films can be prevented from being contaminated.

The channel protective layer 496 may be formed by a droplet discharge method using polyimide, polyvinyl alcohol, or the like. As a result, a photolithography step can be omitted. The channel protective layer can be a film formed from one or a plurality of an inorganic material (silicon oxide, silicon nitride, silicon oxynitride, silicon nitride oxide, or the like), a photosensitive or non-photosensitive organic material (an organic resin material) (polyimide, acrylic, polyamide, polyimide amide, a resist, benzocyclobutene, or the like), a material which has a low dielectric constant (Low k material), or the like; a laminate of such films; or the like. In addition, a siloxane material may be used. As a manufacturing method, a vapor phase growth method such as plasma CVD or thermal CVD, or sputtering can be used. A droplet discharge method, a printing method (a method of forming a pattern, such as screen printing or offset printing), a dispenser method can also be used. A coating film obtained by a coating method can also be used.

First, the case where light is emitted toward a substrate 480, in other words, the case of bottom emission, will be described with reference to FIG. 12A. In this case, a first electrode layer 484 is formed to be connected to the source or drain electrode layer 487b, and over the first electrode layer 484, an electroluminescent layer 485 and a second electrode layer 486 are sequentially laminated so as to be electrically connected to the thin film transistor 481. The substrate 480 which transmits light is required to have light-transmitting properties at least with respect to visible light. Next, the case where light is emitted to the side opposite to the substrate 460, in other words, the case of top emission, will be described with reference to FIG. 12B. The thin film transistor 461 can be formed in a similar manner to the above described thin film transistor.

A source or drain electrode layer 462 which is electrically connected to the thin film transistor 461 is in contact with a first electrode layer 463 to be electrically connected to each other. The first electrode layer 463, an electroluminescent layer 464, and a second electrode layer 465 are sequentially laminated. The source or drain electrode layer 462 is a reflective metal layer and reflects light, which is emitted from a light emitting element, upward as indicated by an arrow. The source or drain electrode layer 462 and the first electrode layer 463 are laminated, and therefore, when the first electrode layer 463 is formed using a light-transmitting material and transmits light therethrough, the light is reflected by the source or drain electrode layer 462 and is then emitted to the opposite direction of the substrate 460. Naturally, the first electrode layer 463 may be formed using a reflective metal film. Since light generated in the light emitting element is emitted through the second electrode layer 465, the second electrode layer 465 is formed using a material having light transmitting properties at least with respect to visible light. Lastly, the case where light is emitted toward both a substrate 470 side and an opposite side, in other words, the case of dual emission, is described with reference to FIG. 12C. The thin film transistor 471 is also a channel protective thin film transistor. A source or drain electrode layer 475 electrically connecting to a semiconductor layer of the thin film transistor 471 is electrically connected to a first electrode layer 472. The first electrode layer 472, an electroluminescent layer 473, and a second electrode layer 474 are sequentially laminated. When the first electrode layer 472 and the second electrode layer 474 are formed using a material having light transmitting properties at least with respect to visible light or formed to have such thicknesses that can transmit light, the dual emission is realized. In this case, an insulating layer and the substrate 470 through which light passes are also necessarily formed to have light transmitting properties at least with respect to visible light.

Structures of light emitting elements that can be applied to the present embodiment mode are shown in FIGS. 11A to 11D. Each light emitting element has a structure in which an electroluminescent layer 860 is interposed between a first electrode layer 870 and a second electrode layer 850. It is necessary to select materials for the first and second electrode layers in consideration of a work function. Each of the first and second electrode layers can serve as either an anode or a cathode depending on a pixel structure. In this embodiment mode, it is preferable that the first electrode layer serve as a cathode and the second electrode layer serve as an anode, since a polarity of a driving TFT is an n-channel type. In addition, when the polarity of the driving TFT is a p-channel type, it is preferable that the first electrode layer serve as an anode and the second electrode layer serve as a cathode.

Figure 11A:
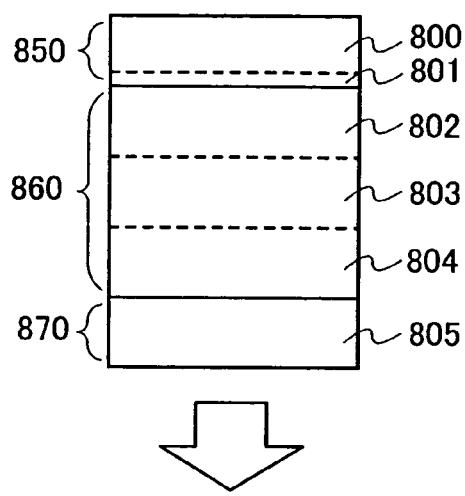
FIGS. 11A to 11D show structures of a light emitting element applicable to the present invention.
Figure 11B:
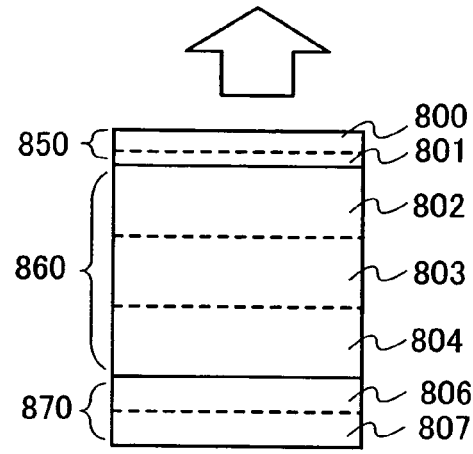

FIGS. 11A and 11B show the case where the first electrode layer 870 is an anode and the second electrode layer 850 is a cathode; therefore, the electroluminescent layer 860 is preferably formed by sequentially laminating a buffer layer 804 formed of a lamination of an HIL (hole injecting layer) and an HTL (hole transporting layer); an EML (light emitting layer) 803; and a buffer layer 802 formed of a lamination of an ETL (electron transporting layer) and EIL (electron injecting layer) over the first electrode layer 870, and the second electrode layer 850 is formed thereover. FIG. 11A shows a structure in which light is emitted through the first electrode layer 870, in which the first electrode layer 870 is formed using an electrode layer 805 that is made from a conductive oxide material having light transmitting properties, and in which the second electrode layer 850 is formed by sequentially laminating an electrode layer 801 containing alkali metal or alkaline earth metal such as LiF or MgAg and an electrode layer 800 made from a metal material such as aluminum over the electroluminescent layer 860. FIG. 11B shows a structure in which light is emitted through the second electrode layer 850, in which the first electrode layer 870 includes an electrode layer 807 made from metal such as aluminum or titanium or a metal material containing the metal and nitrogen at a concentration in stoichiometric proportion or less; and a second electrode layer 806 made from a conductive oxide material that contains 1 atomic % to 15 atomic % silicon oxide. The second electrode layer 850 is formed by sequentially laminating the electrode layer 801 containing the alkali metal or the alkaline earth metal such as LiF or MgAg and the electrode layer 800 made from the metal material such as aluminum over the electroluminescent layer 860. The thicknesses of the electrode layers are set to be 100 nm or less so as to transmit light; therefore, light can be emitted through the second electrode layer 850.

Figure 11C:
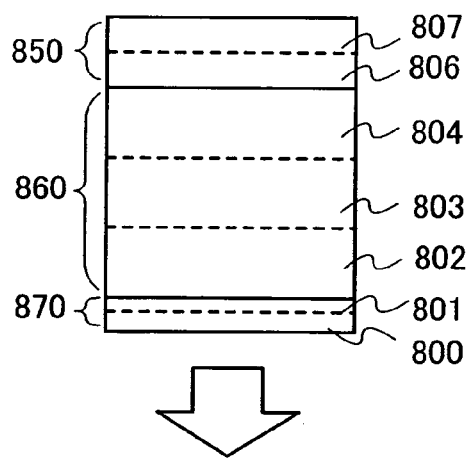
Figure 11D:
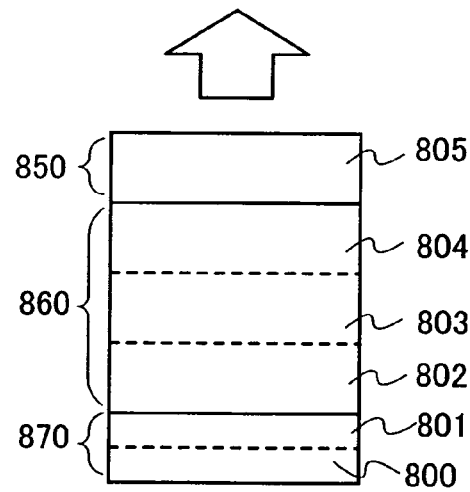

FIGS. 11C and 11D show the case where the first electrode layer 870 is a cathode and the second electrode layer 850 is an anode. The electroluminescent layer 860 is preferably formed by laminating the buffer layer 802 formed of a lamination of an EIL (electron injecting layer) and an ETL (electron transporting layer); the EML (light emitting layer) 803, and the buffer layer 804 formed of a lamination of an HTL (hole transporting layer) and an HIL (hole injecting layer) in this order over the first electrode layer 870 which is a cathode, and the second electrode layer 850 which is an anode is formed thereover. FIG. 11C shows a case where light is emitted through the first electrode layer 870, in which the first electrode layer 870 is formed by sequentially laminating the electrode layer 801 containing alkali metal or alkaline earth metal such as LiF or MgAg and the electrode layer 800 made from a metal material such as aluminum over the electroluminescent layer 860. The thicknesses of the electrode layers are set to be 100 nm or less to transmit light; accordingly, light can be emitted through the first electrode layer 870. The second electrode layer 850 is formed by sequentially laminating an electrode layer 806 made from a conductive oxide material containing 1 atomic % to 15 atomic % silicon oxide and an electrode layer 807 made from metal such as aluminum or titanium or a metal material containing the metal and nitrogen at a concentration in stoichiometric proportion or less over the electroluminescent layer 860. FIG. 11D shows a case where light is emitted through the second electrode layer 850, in which the first electrode layer 870 is formed by sequentially laminating the electrode layer 801 containing alkali metal or alkaline earth metal such as LiF or MgAg and the electrode layer 800 formed from a metal material such as aluminum over the electroluminescent layer 860. The thicknesses of the electrode layers are set to be thick so that light generated in the electroluminescent layer 860 can be reflected by the first electrode layer 870. The second electrode layer 850 is formed using an electrode layer 805 that is made from a conductive oxide material having light transmitting properties at least with respect to visible light. Further, the electroluminescent layer can be formed with a single layer structure or a mixed structure, in addition to the above lamination structure.

As the electroluminescent layer, materials exhibiting light emission of red (R), green (G), and blue (B) are selectively formed by an evaporation method using respective evaporation masks, or the like. The materials exhibiting light emission of red (R), green (G), and blue (B) (low molecular weight materials, high molecular weight materials, and the like) can be formed by a droplet discharge method as in the case of a color filter. The droplet discharge method is preferable since the materials exhibiting R, G, and B light can be separately applied without using a mask.

In the case of the top emission using ITO or ITSO having light transmitting properties for a second electrode layer, BzOS-Li in which benzoxazole derivative (BZOS) is doped with Li, or the like can be used. Also, for instance, as the EML, $Alq_3$ doped with a dopant corresponding to respective luminescent colors of R, G, and B (DCM etc. in the case of R, and DMQD etc. in the case of G) may be used.

Note that the materials of the electroluminescent layer are not limited to the above materials. For example, hole injecting properties can be enhanced by co-evaporation of oxide such as molybdenum oxide ($MoO_x$: x=2 to 3) with α-NPD or rubrene as a substitute for CuPc or PEDOT. In addition, an organic material (including a low molecular weight material or a high molecular weight material) or a composite material of an organic material and an inorganic material can be used as a material for the electroluminescent layer. Materials for forming the light emitting element will be described in more detail below.

As substances having high electron transporting properties among charge injecting/transporting substances, for example, metal complexes having a quinoline skeleton or a benzoquinoline skeleton such as: tris(8-quinolinolato)aluminum ($Alq_3$); tris(4-methyl-8-quinolinolato)aluminum ($Almq_3$); bis(10-hydroxybenzo[h]quinolinato)beryllium ($BeBq_2$); and bis(2-methyl-8-quinolinolato)(4-phenylphenolato)aluminum (BAlq) can be given. As substances having high hole transporting properties, for example, aromatic amine based (i.e., one having a benzene ring-nitrogen bond) compounds such as: 4,4'-bis[N-(1-naphthyl)-N-phenylamino]biphenyl (α-NPD); 4,4'-bis[N-(3-methylphenyl)-N- phenylamino]biphenyl (TPD); 4,4',4"-tris(N,N-diphenylamino)triphenylamine (TDATA); and 4,4',4"-tris[N-(3-methylphenyl)-N-phenylamino]triphenylamine (MTDATA) can be given.

As substances having extremely high electron injecting properties among charge injecting/transporting substances, compounds of alkali metal or alkaline earth metal such as lithium fluoride (LiF), cesium fluoride (CsF), or calcium fluoride ($CaF_2$) can be given. In addition, a mixture of a substance having high electron transporting properties such as $Alq_3$ and alkaline earth metal such as magnesium (Mg) may be used.

As substances having high hole injecting properties among the charge injecting/transporting substances, for example, metal oxide such as molybdenum oxide ($MoO_x$), vanadium oxide ($VO_x$), ruthenium oxide ($RuO_x$), tungsten oxide ($WO_x$) or manganese oxide ($MnO_x$) can be given. Besides, phthalocyanine based compounds such as phthalocyanine ($H_2Pc$) and copper phthalocyanine (CuPc) can be given.

Light emitting layers having different light emission wavelength bands may be each formed in each pixel so as to perform color display. Typically, light emitting layers corresponding to respective luminescent colors of R (red), G (green), and B (blue) are formed. In this case, when a filter that transmits light of a certain light emission wavelength band is provided on a light emission side of the pixels, color purity can be improved and specular reflection (reflection) of a pixel portion can be prevented. By providing the filter, a circular polarizing plate or the like, which has been conventionally thought to be required, can be eliminated, thereby reducing loss of light emitted from the light emitting layers. In addition, change in color tone, which is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-[2-(1,1,7,7-tetramethyljulolidine-9-yl)ethenyl]-4H-pyran (DCJT); 4-dicyanomethylene-2-tert-butyl-6-[2-(1,1,7,7-tetramethyljulolidine-9-yl)ethenyl]-4H-pyran (DCJTB); periflanthene; 2,5-dicyano-1,4-bis[2-(10-methoxy-1,1,7,7-tetramethyljulolidine-9-yl)ethenyl]benzene, N,N'-dimethylquinacridone (DMQd); coumarin 6; coumarin 545T; tris(8-quinolinolato)aluminum ($Alq_3$); 9,9'-bianthryl; 9,10-diphenylanthracene (DPA); 9,10-bis(2-naphthyl)anthracene (DNA); and the like. Also, another substance may be used.

On the other hand, as compared with the low molecular weight organic light emitting materials, the high molecular weight organic light emitting materials have higher physical strength, which means an element is more durable. In addition, since the high molecular weight organic light emitting materials can be formed by coating, an element can be manufactured relatively easily. A structure of a light emitting element formed using the high molecular weight organic light emitting materials is basically similar to that using the low molecular weight organic light emitting materials, and is formed by sequentially laminating a cathode, an organic light emitting layer, and an anode from a cathode side. However, when a light emitting layer is made of the high molecular weight organic light emitting materials, it is difficult to form a lamination structure like the case of using the low molecular weight organic light emitting materials. In many cases, such the light emitting element made from the high molecular weight organic light emitting materials has a two-layer structure. Specifically, it is a lamination structure formed by sequentially laminating a cathode, a light emitting layer, a hole transporting layer, and an anode from the cathode side.

Since the luminescent color is determined by a material of a light emitting layer, a light emitting element that emits a predetermined color of light can be formed by selecting the material. As the high molecular weight electroluminescent materials that can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) (PPV): poly(2,5-dialkoxy-1,4-phenylenevinylene) (RO-PPV); poly(2-(2'-ethyl-hexoxy)-5-methoxy-1,4-phenylenevinylene) (MEH-PPV); poly(2-(dialkoxyphenyl)-1,4-phenylenevinylene) (ROPh-PPV); or the like can be given. As the polyparaphenylene based material, a derivative of polyparaphenylene (PPP): poly(2,5-dialkoxy-1,4-phenylene) (RO-PPP); poly(2,5-dihexoxy-1,4-phenylene); or the like can be given. As the polythiophene based material, a derivative of polythiophene (PT): poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly[3-(4-octylphenyl)-thiophene] (POPT); poly[3-(4-octylphenyl)-2,2 bithiophene] (PTOPT); or the like can be given. As the polyfluorene based material, a derivative of polyfluorene (PF): poly(9,9-dialkylfluorene) (PDAF); poly(9,9-dioctylfluorene) (PDOF); or the like can be given.

When a high molecular weight organic light emitting material having hole transporting properties is interposed between an anode and a high molecular weight organic light emitting material having light emitting properties, hole injecting properties from the anode can be improved. Typically, a solution, in which a high molecular weight organic light emitting material having the hole transporting properties is dissolved in water with an acceptor material, is applied by a spin coating method or the like. Since the high molecular weight organic light emitting material having hole transporting properties is insoluble in an organic solvent, it can be laminated together with the above-mentioned organic light emitting material having light emitting properties. As the high molecular weight organic light emitting material having the hole transporting properties, a mixture of PEDOT and camphor sulfonic acid (CSA) as an acceptor material; a mixture of polyaniline (PANI) and polystyrenesulfonic acid (PSS) as an acceptor material; or the like can be given.

A light emitting layer can emit monochromatic light or white light. In the case of using a white light emitting material, color display can be achieved by providing a filter (colored layer) that transmits light of a certain wavelength on a light emitting side of a pixel.

In order to form a light emitting layer that emits white light, for example, $Alq_3$, $Alq_3$ partially doped with Nile red, which is a red light emitting pigment, $Alq_3$, p-EtTAZ, and TPD (aromatic diamine) are sequentially laminated by an evaporation method. Also, when an EL is formed by a coating method using spin coating, the EL is preferably baked by vacuum heating after coating. For example, an aqueous solution of poly(ethylene dioxythiophene)/poly(styrenesulfonic acid) (PEDOT/PSS), which functions as a hole injecting layer, may be applied over an entire surface and baked. Afterwards, a solution of polyvinyl carbazole (PVK) doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6), which serves as a light emitting layer, may then be applied over the entire surface and baked.

The light emitting layer can be formed to have a single layer. In this case, 1,3,4-oxadiazole derivative (PBD) having electron transporting properties may be dispersed in polyvinyl carbazole (PVK) having hole transporting properties. In addition, white light emission can be obtained by dispersing 30 wt % PBD as an electron transporting agent and dispersing a suitable amount of four kinds of pigments (TPB, coumarin 6, DCM1, and Nile red). As well as the above-mentioned light emitting elements that can emit white light, a light emitting element capable of emitting red light, green light, or blue light can be manufactured by properly selecting materials for the light emitting layer.

Further, a triplet excited light emitting material including a metal complex or the like may be used for a light emitting layer as well as a singlet excited light emitting material. For example, a pixel emitting red light, whose luminance is reduce by half in a relatively short time, is formed by using the triplet excited light emitting material, and the pixels emitting green and blue light are formed of the singlet excited light emitting material. Since the triplet excited light emitting material has an excellent light emitting efficiency, it has a feature of requiring lower power to obtain the same level of luminance as compared with the singlet excited light emitting material. That is, when the pixel for emitting red light is formed of the triplet excited light emitting material, only a small amount of current flowing through the light emitting element is required, thereby improving reliability. To reduce power consumption, the pixels emitting red and green light may be formed of the triplet excited light emitting material, while the pixel emitting blue light may be formed of the singlet excited light emitting material. In the case where light emitting element that emits green light, having high visibility, is also formed of the triplet excited light emitting material, power consumption can be further reduced.

As an example of the triplet excited light emitting material, there is one that uses a metal complex as a dopant. In particular, a metal complex with platinum, which is a third transition element, as its central metal; a metal complex with iridium as its central metal; and the like are known. The triplet excited light emitting material is not limited to these compounds, and it is possible to use a compound having the above mentioned structure and including an element that belongs to group 8 to 10 of the periodic table as its central metal.

Above mentioned substances for forming the light emitting layer are examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer, or a hole blocking layer. In addition, a mixed layer or a mixed junction of these layers may be formed. The layer structure of the light emitting layer can be varied, and the structural change of the light emitting layer may be allowable without departing from the purpose of the invention; for example, an electrode layer is provided or a light emitting material is dispersed, instead of providing a certain electron injecting region or light emitting region.

When a forward bias voltage is applied to a light emitting element formed of the above-mentioned material, the light emitting element can emit light. Each pixel of a display device formed using the light emitting element can be driven by either a simple matrix method or an active matrix method. In either case, each pixel emits light by being applied with a forward bias voltage at a certain timing, whereas each pixel does not emit light in a certain period. In this non-light emitting period, a reverse bias voltage is applied to the light emitting element so that the reliability of the light emitting element can be improved. The light emitting element has a deterioration mode of reducing light intensity under a certain driving condition or apparently reducing luminance due to expansion of a non-light emitting region within the pixel. When the light emitting element is driven by applying alternating current of a forward bias voltage and a reverse bias voltage, deterioration of the light emitting element can be hindered, thereby improving the reliability of the light emitting device. Furthermore, either the digital driving or the analog driving is applicable.

Figure 12A:
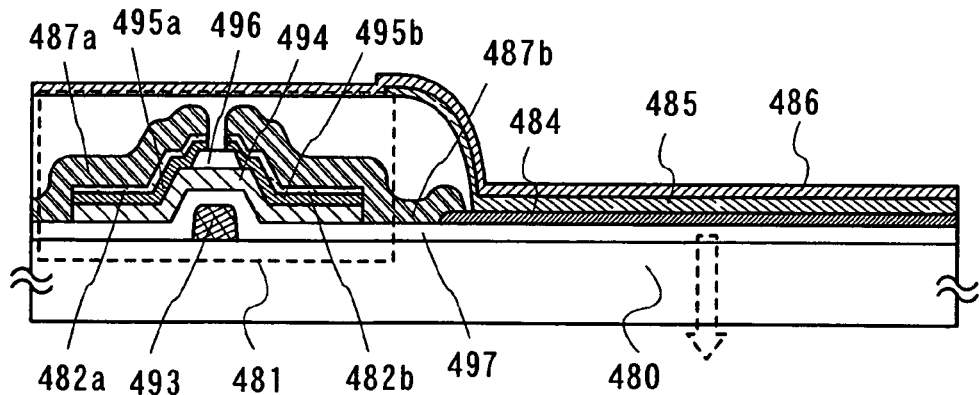
FIGS. 12A to 12C show a method of manufacturing a display device of the present invention.
Figure 12B:
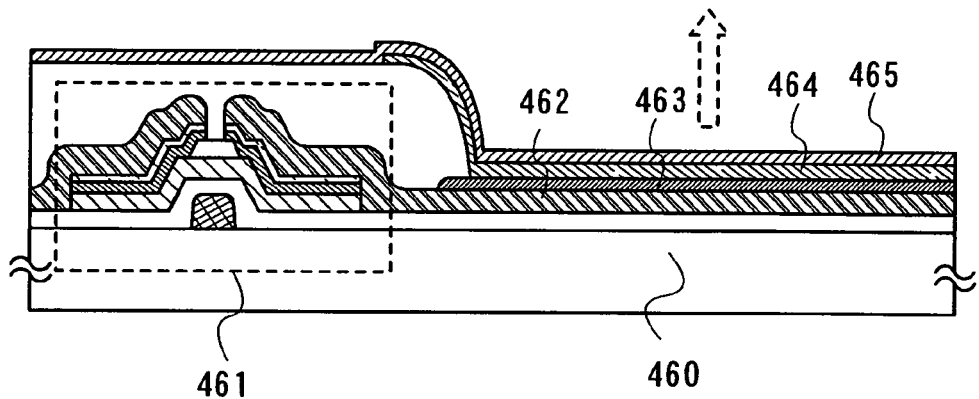
Figure 12C:
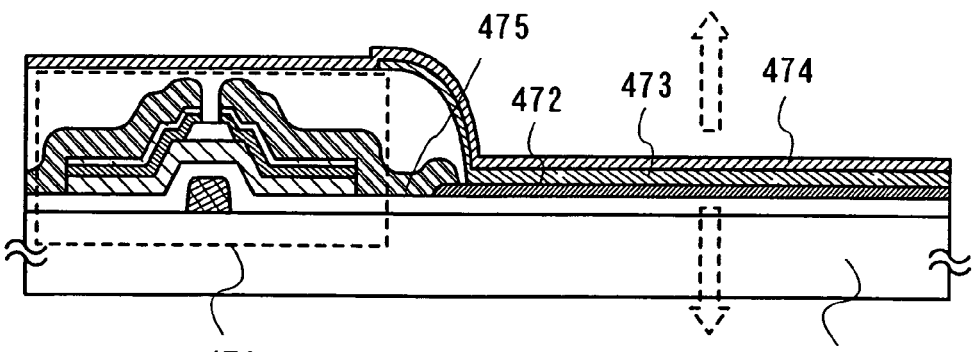

Although not shown in FIGS. 12A to 12C, a color filter (colored layer) may be formed over a sealing substrate facing to a substrate including elements. The color filter (colored layer) can be selectively formed by a droplet discharge method. Since broad peaks of the emission spectra of R, G, and B can be adjusted sharply by the color filter (colored layer), a high-definition image can be displayed by using this color filter (colored layer).

Although the case of forming the material exhibiting light emission of respective R, G, and B is described above, full color display can also be achieved by forming a material exhibiting monochromatic light in combination with a color filter or a color conversion layer. For example, the color filter (colored layer) or the color conversion layer may be formed over the sealing substrate and attached to the substrate. As above described, the material exhibiting monochromatic light, the color filter (colored layer), or the color conversion layer can be formed by a droplet discharge method.

Naturally, monochromatic light emitting display may be performed. For instance, an area color display device using the monochromatic light may be formed. A passive matrix display portion is suitable for the area color display device, and characters and symbols can be mainly displayed thereon.

In the above-mentioned structures, the cathode can be formed of a material having a low work function. For example, the cathode is desirably formed of Ca, Al, $CaF_2$, MgAg, AlLi, or the like. The electroluminescent layer may have any one of a single-layer structure, a lamination structure, and a mixed structure having no interface between layers. Further, the electroluminescent layer may be formed of any material of a singlet material; a triplet material; a material with a combination of the singlet and triplet materials; a charge injecting/transporting substance containing an organic compound or an inorganic compound; or a light emitting material. The electroluminescent layer may include one or plural kinds of layers selected from a low molecular weight organic compound, an intermediate molecular weight organic compound (which indicates an organic compound that does not have sublimation properties, and has 20 or less molecules or a molecular chain length of 10 μm or less), and a high molecular weight organic compound depending on the number of its molecules, and may be combined with an inorganic compound having electron injecting/transporting properties or hole injecting/transporting properties. The first electrode layers 484 and 472 and the second electrode layers 465 and 474 are formed of a transparent conductive film, which transmits light. For example, a transparent conductive film formed by using a target, in which indium oxide is mixed with 2 wt % to 20 wt % zinc oxide (ZnO), is used besides ITO and ITSO. It is preferable that a plasma treatment be carried out in an oxygen atmosphere or a heat treatment be performed in a vacuum atmosphere before forming the first electrode layers 484, 463, and 472. A partition wall is formed of a material including silicon, an organic material, or a compound material. Also, a porous film may be used. It is preferable that the partition wall is formed of a photosensitive or nonphotosensitive material such as acrylic or polyimide, since a curvature radius for each side surface thereof is continuously varied; and accordingly, a thin film formed over each partition wall is not disconnected. The present embodiment mode can be freely combined with Embodiment Mode 1 or Embodiment Mode 2.

Embodiment Mode 5

Next, a mode of mounting a driver circuit for driving on a display panel which is manufactured in accordance with Embodiment Modes 2 to 4 will be described.

First, a display device employing a COG method is described with reference to FIG. 27A. A pixel portion 2701 for displaying information of characters, images, or the like is provided over a substrate 2700. A substrate provided with a plurality of driver circuits is divided into rectangles, and a driver circuit 2751 (hereinafter also referred to as a driver IC) after devision is mounted on the substrate 2700. FIG. 27A shows a mode of mounting a plurality of driver ICs 2751 and FPCs 2750 on the end of the driver ICs 2751. Alternatively, the divided size may be made almost the same as the length of a side of the pixel portion on a signal line side, a single driver IC may be provided, and an FPC 2750 may be attached and mounted on the end of the driver IC.

A TAB method may be adopted. In that case, a plurality of FPCs 2750 may be mounted and driver ICs may be mounted on the FPCs 2750 as shown in FIG. 27B. Similarly to the case of a COG method, a single driver IC may be mounted on a single FPC 2750. In this case, a metal piece or the like for fixing the driver IC may be attached together in terms of strength.

A plurality of the driver ICs to be mounted on a display panel is preferably formed over a rectangular substrate having a side of 300 mm to 1000 mm or more in terms of improving productivity.

In other words, a plurality of circuit patterns each including a driver circuit portion and an input-output terminal as one unit is formed over the substrate, and may be lastly divided to be used. In consideration of a side length of the pixel portion or the pixel pitch, the driver IC may be formed to be a rectangle having a long side length of 15 mm to 80 mm and a short side length of 1 mm to 6 mm. Alternatively, the driver IC may be formed to have the long side length of a side length of the pixel portion, or the long side length of adding a side length of the pixel portion to a side length of each driver circuit.

An advantage of the external dimension of the driver IC over an IC chip is the length of the long side. When the driver IC having a long side of 15 mm to 80 mm is used, the number of the driver ICs necessary for mounting in accordance with the pixel portion is less than that in the case of using an IC chip. Therefore, yield in manufacturing can be improved. When a driver IC is formed over a glass substrate, productivity is not decreased, since there is no limitation due to a shape of a substrate used as a mother body. This is a great advantage compared with the case of taking the IC chip out of a circular silicon wafer.

When a scanning line driver circuit 3702 is integrated with a substrate as shown in FIG. 26B, a driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for an UXGA class. The signal lines formed in such a number are divided into several blocks on an end of the pixel portion 3701, and lead lines are formed. The signal lines are gathered corresponding to the pitches of output terminals of the driver ICs.

The driver IC is preferably made of a crystalline semiconductor formed over the substrate. The crystalline semiconductor is preferably formed by being irradiated with continuous wave laser light. Therefore, a continuous wave solid-state laser or a gas laser is used for an oscillator for generating the laser light. There are few crystal defects when a continuous wave laser is used, and as a result, a transistor can be manufactured by using a polycrystalline semiconductor layer having a large grain size. In addition, high-speed driving is possible since mobility or response speed is favorable, and it is possible to further improve an operating frequency of an element than that of the conventional element. And there are few characteristics variations. Therefore, high reliability can be obtained. The channel-length direction of the transistor and a scanning direction of laser light may be directed in the same direction to further improve the operating frequency. This is because the highest mobility can be obtained when a channel length direction of a transistor and a scanning direction of laser light with respect to a substrate are almost parallel (preferably, $-30°$ to $30°$) in a step of laser crystallization by a continuous wave laser. Note that the channel length direction coincides with the flowing direction of a current, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to extensively narrow the laser light, and a shape of the laser light (beam spot) preferably has the same width as that of a short side of the driver ICs, approximately 1 mm to 3 mm. In addition, in order to secure an enough and effective energy density for an object to be irradiated, an irradiated region with the laser light preferably has a linear shape. The term "linear" used herein refers to not a line in a strict sense but a rectangle or an oblong with a large aspect ratio. For example, the linear shape refers to a rectangle or an oblong with an aspect ratio of 2 or more (preferably 10 to 10000). Thus, it is possible to provide a method of manufacturing a display device in which productivity is improved by making a width of the laser light shape (beam spot) to the same length as a short side of the driver ICs.

As shown in FIGS. 27A and 27B, driver ICs may be mounted as both the scanning line driver circuit and the signal line driver circuit. In this case, it is preferable to use different specifications of the driver ICs between a scanning line side and a signal line side.

In the pixel portion, the signal line and the scanning line intersect to form a matrix, and a transistor is arranged in accordance with each intersection. One feature of the present invention is that a TFT having an amorphous semiconductor or a semiamorphous semiconductor as a channel portion is used as the transistor arranged in the pixel portion. The amorphous semiconductor is formed by a method such as plasma CVD or sputtering. The semiamorphous semiconductor can be formed at a temperature of 300° C. or less by plasma CVD. A film thickness necessary to form the transistor is formed in a short time even in the case of a non-alkaline glass substrate having an external size of, for example, 550 mm×650 mm. The feature of such a manufacturing technique is effective in manufacturing a large-sized display device. In addition, a semiamorphous TFT can obtain field effect mobility of 2 $cm^2/V \cdot sec$ to 10 $cm^2/V \cdot sec$ by forming a channel formation region using a SAS. When the present invention is applied, a fine wiring having a short channel width can be stably formed without a fault such as a short circuit since a pattern having a predetermined shape can be formed with good controllability. Accordingly, a TFT having electric characteristics required to operate pixels sufficiently can be formed. Therefore, this TFT can be used as a switching element of the pixels or as an element included in the scanning line driver circuit. Thus, a display panel in which system-on-panel is realized can be manufactured.

The scanning line driver circuit can also be integrated with the substrate by using a TFT having a semiconductor layer formed of a SAS. In the case of using a TFT having a semiconductor layer formed of an AS, the driver ICs may be mounted on both the scanning line driver circuit and the signal line driver circuit.

In that case, it is preferable to use different specifications of the driver ICs between the scanning line side and the signal line side. For example, a transistor included in the scanning line driver IC is required to withstand a voltage of approximately 30 V; however, a drive frequency is 100 kHz or less, and high-speed operation is not comparatively required. Therefore, it is preferable to set a channel-length (L) of the transistor included in the scanning line driver sufficiently long. On the other hand, a transistor of the signal line driver IC is required to withstand a voltage of only approximately 12 V; however, a drive frequency is around 65 MHz at 3 V, and high-speed operation is required. Therefore, it is preferable to set a channel-length or the like of the transistor included in a driver with a micron rule. By using the present invention, a fine pattern can be formed with good controllability. Therefore, the present invention can handle such a micron rule sufficiently.

A method of mounting the driver IC is not particularly limited, and a COG method, a wire bonding method, or a TAB method can be employed.

The thicknesses of the driver IC and the opposite substrate are set to have the same thickness, which contributes to thinning of a display device as a whole. When both substrates are formed of the same material, thermal stress is not generated and characteristics of a circuit formed of a TFT are not damaged even when temperature change is generated in the display device. Furthermore, the number of the driver ICs to be mounted on one pixel portion can be reduced by mounting longer driver ICs than IC chips on a driver circuit as described in this embodiment mode.

As the above described, a driver circuit can be incorporated in a display panel.

Embodiment Mode 6

An example of a protective circuit included in a display device of the present invention will be described.

Figure 24A:
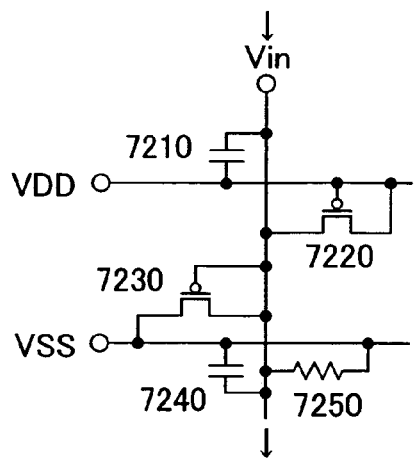
FIGS. 24A to 24E show protective circuits using the present invention.

As shown in FIG. 27B, a protective circuit 2713 can be formed between an external circuit and an internal circuit. The protective circuit is constructed with one or a plurality of elements selected from a TFT, a diode, a resistor element, a capacitor element, and the like. Described below are several structures of the protective circuit and the operation thereof. First, the structure of an equivalent circuit of a protective circuit which is disposed between an external circuit and an internal circuit and which corresponds to one input terminal is described with reference to FIGS. 24A to 24E. The protective circuit shown in FIG. 24A includes p-channel thin film transistors 7220 and 7230, capacitor elements 7210 and 7240, and a resistor element 7250. The resistor element 7250 has two terminals; one of which is supplied with an input voltage Vin (hereinafter referred to as Vin), and the other of which is supplied with a low-potential voltage VSS (hereinafter referred to as VSS).

Figure 24B:
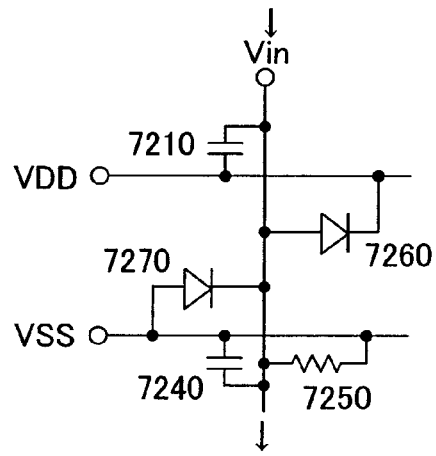
Figure 24C:
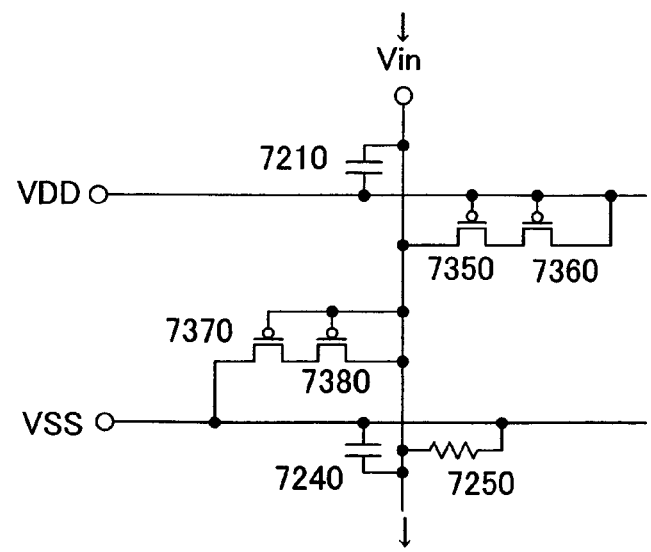
Figure 24D:
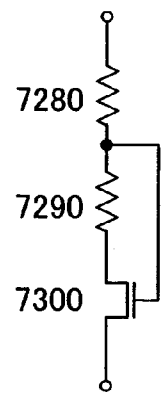
Figure 24E:
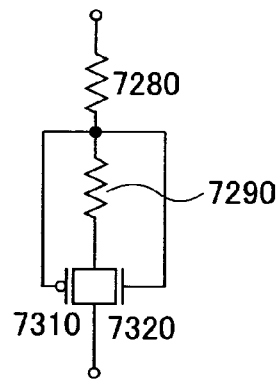

FIG. 24B is an equivalent circuit diagram showing a protective circuit in which rectifying diodes 7260 and 7270 are substituted for the p-channel thin film transistors 7220 and 7230. FIG. 24C is an equivalent circuit diagram showing a protective circuit in which TFTs 7350, 7360, 7370, and 7380 are substituted for the p-channel thin film transistors 7220 and 7230. In addition, as a protective circuit having a different structure from the above structure, FIG. 24D shows a protective circuit which includes resistors 7280 and 7290 and an n-channel thin film transistor 7300. A protective circuit shown in FIG. 24E includes resistors 7280 and 7290, a p-channel thin film transistor 7310, and an n-channel thin film transistor 7320. By providing the protective circuit, a sudden surge in potential can be prevented, thereby element breakdown or damage can be prevented, which improves reliability. Note that an element having the aforementioned protective circuit is preferably formed using an amorphous semiconductor that can withstand high voltage. This embodiment mode can be freely combined with the aforementioned embodiment mode.

This embodiment mode can be combined with any one of Embodiment Modes 1 to 5.

Embodiment Mode 7

A structure of a pixel of a display panel shown in this embodiment mode is described with reference to equivalent circuit diagrams shown in FIGS. 10A to 10F. In the embodiment mode, an example in which a light emitting element (EL element) is used as a display element of the pixel is described.

Figure 10A:
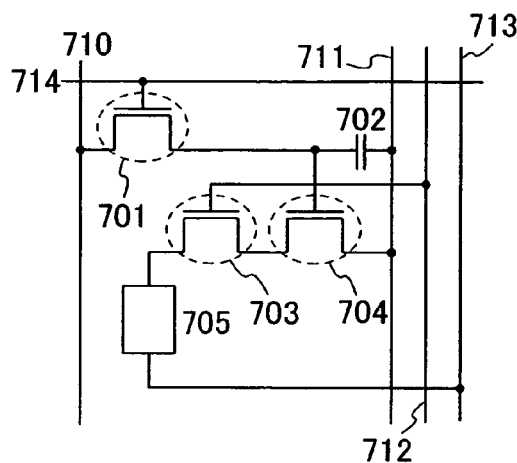
FIGS. 10A to 10F are circuit diagrams showing structures of a pixel applicable to an EL display panel of the present invention.

In a pixel shown in FIG. 10A, a signal line 710 and power supply lines 711, 712, and 713 are arranged in columns, and a scanning line 714 is arranged in a row. The pixel also includes a TFT 701 that is a switching TFT, a TFT 703 that is a driving TFT, a TFT 704 that is a current control TFT, a capacitor element 702, and a light emitting element 705.

Figure 10B:
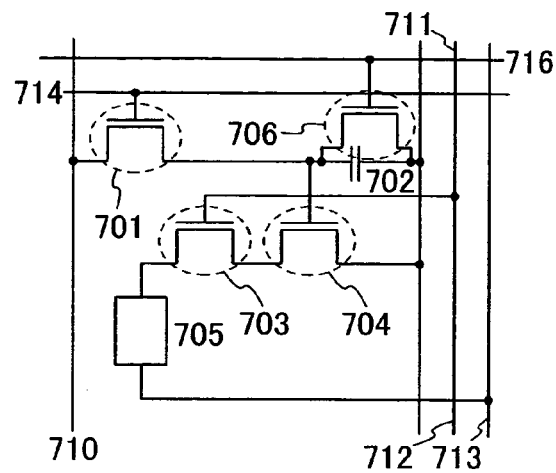
Figure 10C:
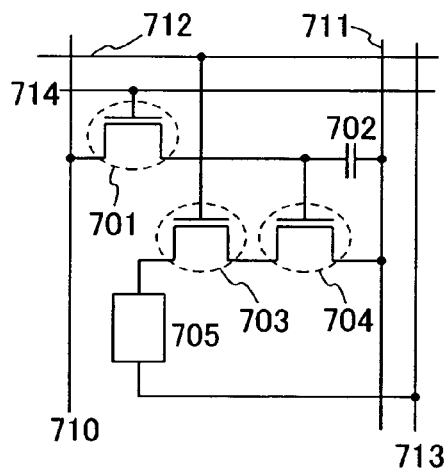
Figure 10D:
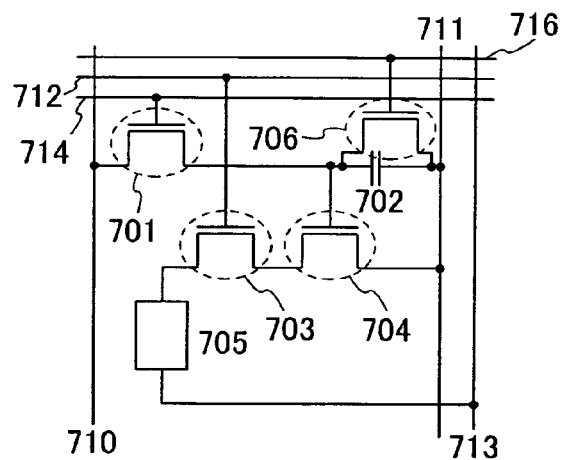

A pixel shown in FIG. 10C has the same structure as that shown in FIG. 10A, except that a gate electrode of the driving TFT 703 is connected to the power supply line 712 arranged in a row. Both pixels in FIGS. 10A and 10C show the same equivalent circuit diagrams. However, each power supply line is formed of conductive layers having different layers in between the cases where the power supply line 712 is arranged in a column (FIG. 10A) and where the power supply line 712 is arranged in a row (FIG. 10C). The two pixels are separately shown in FIGS. 10A and 10C in order to show that layers, from which a wiring connected to the gate electrode of the TFT 703 is formed, are different between FIGS. 10A and 10C.

In both FIGS. 10A and 10C, the TFTs 703 and 704 are connected in series in the pixel, and a ratio of the channel length $L_3$/the channel width $W_3$ of the TFT 703 to the channel length $L_4$/the channel width $W_4$ of the TFT 704 is set as $L_3/W_3:L_4/W_4=5$ to 6000:1. For example, when $L_3$, $W_3$, $L_4$, and $W_4$ are respectively 500 μm, 3 μm, 3 μm, and 100 μm, the ratio 6000:1 can be obtained.

The TFT 703 is operated in a saturation region and controls the amount of current flowing into the light emitting element 705, whereas the TFT 704 is operated in a linear region and controls a current supplied to the light emitting element 705. The TFTs 703 and 704 preferably have the same conductivity in view of the manufacturing step. For the TFT 703, a depletion type TFT may be used instead of an enhancement type TFT. In the present invention having the above structure, slight variations in $V_{GS}$ of the TFT 704 does not affect the amount of current flowing into the light emitting element 705, since the TFT 704 is operated in a linear region. In other words, the amount of current flowing into the light emitting element 705 is determined by the TFT 703 operated in the saturation region. Accordingly, it is possible to provide a display device in which image quality is enhanced by reducing variations in luminance of the light emitting element due to the variation of the TFT characteristics.

The TFT 701 of each pixel shown in FIGS. 10A to 10D controls a video signal input to the pixel. When the TFT 701 is turned on and a video signal is input to the pixel, the video signal is held at the capacitor element 702. Although the structure, in which the capacitor element 702 is provided, is shown in FIGS. 10A and 10C, the present invention is not limited thereto. When gate capacitor or the like can serve as capacitor holding a video signal, the capacitor element 702 is not necessarily provided.

The light emitting element 705 has a structure in which an electroluminescent layer is interposed between a pair of electrodes. A pixel electrode and an opposite electrode (an anode and a cathode) have a potential difference therebetween so that a forward bias voltage is applied. The electroluminescent layer is formed of wide range of materials such as an organic material, and an inorganic material. The luminescence in the electroluminescent layer includes luminescence that is generated when a singlet excited state returns to a ground state (fluorescence) and luminescence that is generated when a triplet exited state returns to a ground state (phosphorescence).

A pixel shown in FIG. 10B has the same structure as that shown in FIG. 10A, except that a TFT 706 and a scanning line 716 are added. Similarly, a pixel shown in FIG. 10D has the same structure as the one shown in FIG. 10C, except that a TFT 706 and a scanning line 716 are added.

The TFT 706 is controlled to be on or off by the added scanning line 716. When the TFT 706 is turned on, charges held in the capacitor element 702 are discharged, thereby turning the TFT 704 off. In other words, supply of a current to the light emitting element 705 can be forcibly stopped by providing the TFT 706. Therefore, by adopting the structures shown in FIGS. 10B and 10D, a lighting period can start simultaneously with or shortly after start of a writing period without waiting until signals are written into all the pixels; thus, a duty ratio can be improved.

Figure 10E:
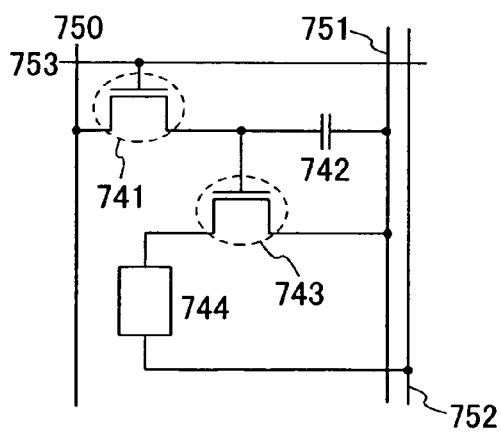
Figure 10F:
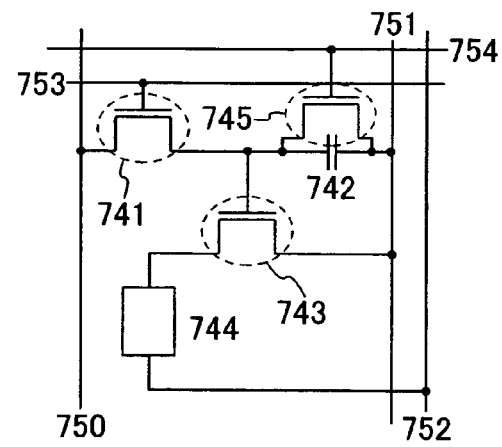

In a pixel shown in FIG. 10E, a signal line 750 and power supply lines 751 and 752 are arranged in columns, and a scanning line 753 is arranged in a row. The pixel further includes a TFT 741 that is a switching TFT, a TFT 743 that is a driving TFT, a capacitor element 742, and a light emitting element 744. A pixel shown in FIG. 10F has the same structure as the one shown in FIG. 10E, except that a TFT 745 and a scanning line 754 are added. The structure of FIG. 10F also enables a duty ratio to be improved by providing the TFT 745.

As described above, in accordance with the present invention, a pattern of a wiring or the like can be precisely and stably formed without defective formation. Therefore, a TFT can be provided with high electric characteristics and reliability, and the present invention can be satisfactorily used for an applied technique for improving display capability of a pixel in accordance with the intended use.

The present embodiment mode can be combined with any one of Embodiment Modes 1, 2, and 4 to 6.

Embodiment Mode 8

Figure 9:
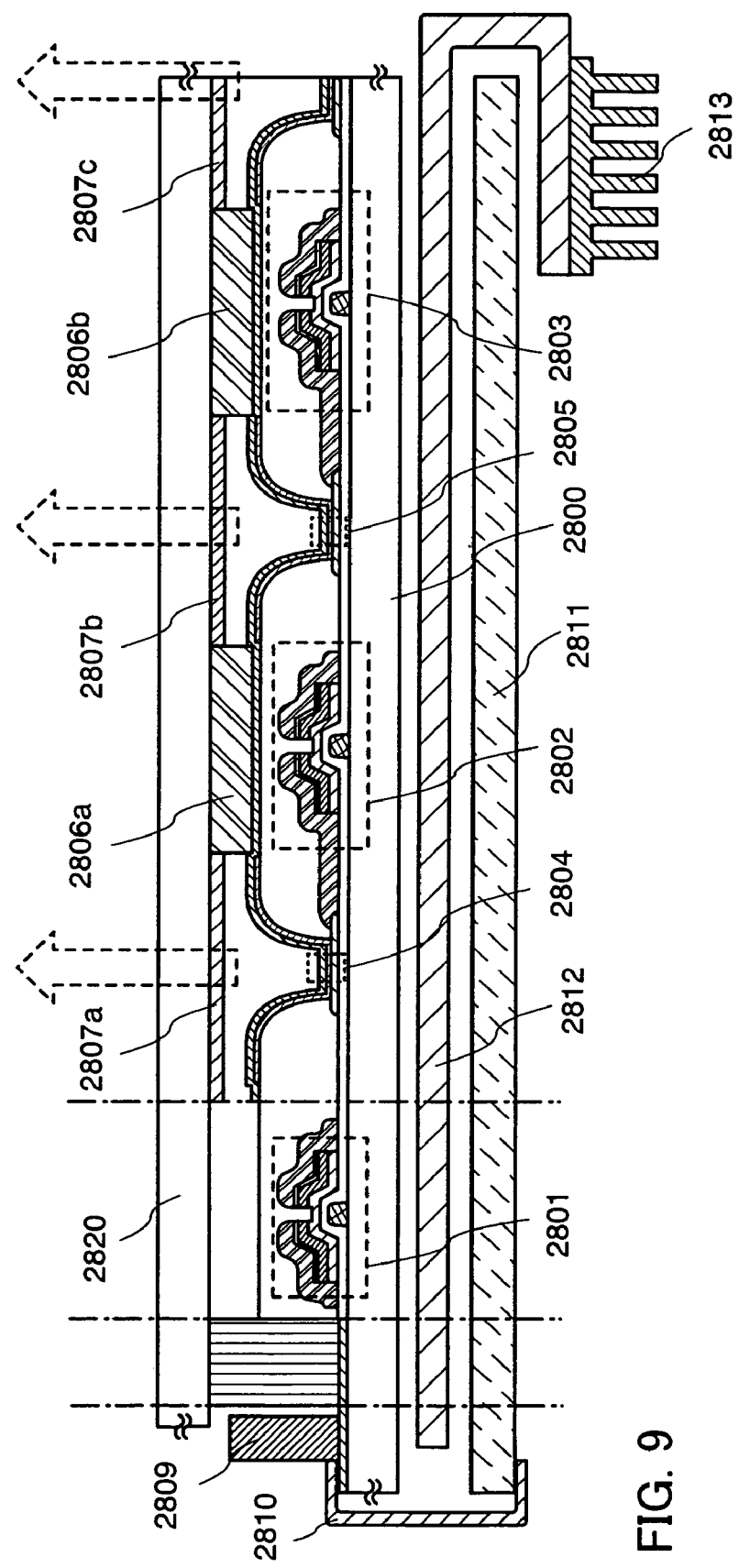
FIG. 9 is a sectional view showing a structural example of an EL display module of the present invention.

Embodiment Mode 8 is described with reference to FIG. 9. FIG. 9 shows an example of forming an EL display module using a TFT substrate 2800 manufactured in accordance with the present invention. In FIG. 9, a pixel portion including pixels is formed over the TFT substrate 2800.

In FIG. 9, a TFT which has the same structure as that formed in a pixel, or a protective circuit portion 2801 operated in the same manner as a diode by connecting a gate to either a source or a drain of the TFT is provided between a driver circuit and the pixel, which is the outside of the pixel portion. A driver IC formed of a single crystalline semiconductor, a stick driver IC formed of a polycrystalline semiconductor film over a glass substrate, or a driver circuit formed of a SAS is applied to a driver circuit 2809.

The TFT substrate 2800 is bonded to a sealing substrate 2820 by interposing spacers 2806a and 2806b formed by a droplet discharge method therebetween. The spacer is preferably provided to keep a space between two substrates constantly even when a substrate is thin or an area of the pixel portion is enlarged. A space between the TFT substrate 2800 and the sealing substrate 2820 over light emitting elements 2804 and 2805 connected to TFTs 2802 and 2803 respectively may be filled with a light-transmitting resin material at least with respect to visible light and solidified, or may be filled with anhydrous nitrogen or an inert gas.

FIG. 9 shows a case in which the light emitting elements 2804, 2805, and 2815 have a structure of a top emission type and has a structure in which light is emitted in the direction of the arrow shown in the drawing. Multicolor display can be carried out by having different luminescent colors of red, green, or blue in each pixel. At this time, color purity of the luminescence emitted outside can be improved by forming colored layers 2807a, 2807b, and 2807c corresponding to each color on a sealing substrate 2820 side. Moreover, the colored layers 2807a, 2807b, and 2807c may be combined with each other to use the pixel as a white light emitting element.

The driver circuit 2809, which is an outside circuit, is in contact with a scanning line or signal line connecting terminal which is provided over one end of an external circuit substrate 2811 through a wiring substrate 2810. In addition, a heat pipe 2813, which is a high-effective thermal conduction device with a pipe shape used to conduct heat to the outside of the device, and a heat sink 2812 may be provided to be in contact with or close to the TFT substrate 2800 to have a structure increasing a heat dissipation effect.

FIG. 9 shows the top emission type EL module; however, it may be a bottom emission structure by changing the structure of the light emitting element or the disposition of the external circuit substrate. Naturally, a dual emission structure in which light is emitted from both sides of the top and bottom surfaces may be used. In the case of the top emission structure, an insulating layer which is to be a partition wall may be colored to be used as a black matrix. This partition wall can be formed by a droplet discharge method and it may be formed by mixing a black resin of a pigment material, carbon black, or the like into a resin material such as polyimide. A lamination thereof may also be used.

In addition, reflected light of light entering from outside may be shielded by using a retardation film or a polarizing plate in the EL display module. In the case of a top emission type display device, an insulating layer to be a partition wall may be colored to be used as a black matrix. The partition wall can be formed by a droplet discharge method or the like. Carbon black or the like may be mixed into a black resin of a pigment material or a resin material such as polyimide, and a lamination thereof may also be used. By a droplet discharge method, different materials may be discharged on the same region plural times to form the partition wall. A quarter wave plate and a half wave plate may be used as the retardation films and may be designed to control light. As the structure, the light emitting element, the sealing substrate (sealant), the retardation film (quarter wave plate), the retardation film (half wave plate), the polarizing plate are sequentially laminated over a TFT element substrate, in which light emitted from the light emitting element is transmitted therethrough and emitted outside from a polarizing plate side. The retardation films or polarizing plate may be provided on a side where light is emitted outside or may be provided on both sides in the case of a dual emission type display device in which light is emitted from both surfaces. In addition, an anti-reflective film may be provided on the outer side of the polarizing plate. Accordingly, a higher definition and more accurate image can be displayed.

In the TFT substrate 2800, a sealing structure may be formed by attaching a resin film to the side where the pixel portion is formed with the use of a sealant or an adhesive resin. In this embodiment mode, glass sealing using a glass substrate is described; however, various sealing methods such as resin sealing using a resin, plastic sealing using plastic, and film sealing using a film can be used. A gas barrier film which prevents moisture from penetrating into the resin film is preferably provided on the surface of the resin film. By applying a film sealing structure, a further thinner and lighter EL display module can be realized.

The present embodiment mode can be combined with any one of Embodiment Modes 1, 2, and 4 to 7.

Embodiment Mode 9

Embodiment Mode 9 will be described with reference to FIGS. 20A and 20B. FIGS. 20A and 20B show examples of forming liquid crystal display modules by using TFT substrates 2600 manufactured in accordance with the present invention.

FIG. 20A shows an example of a liquid crystal display module, in which a TFT substrate 2600 and an opposite substrate 2601 are firmly attached to each other with a sealant 2602, and a pixel portion 2603 and a liquid crystal layer 2604 are provided between the substrates to form a display region. A colored layer 2605 is necessary to perform color display. In the case of the RGB system, colored layers corresponding to respective colors of red, green, and blue are provided in relation to respective pixels. The outsides of the TFT substrate 2600 and the opposite substrate 2601 are provided with polarizing plates 2606 and 2607, respectively. Also, a lens film 2613 is provided to the outside of the polarizing plate 2607. A light source includes a cold-cathode tube 2610 and a reflecting plate 2611. A circuit substrate 2612 is connected to a wiring circuit 2608 and the TFT substrate 2600 by a flexible wiring substrate 2609. External circuits such as a control circuit and a power supply circuit are incorporated in the circuit substrate 2612. The liquid crystal display module can employ a TN (twisted nematic) mode, an IPS (in-plane-switching) mode, an MVA (multi-domain vertical alignment) mode, an ASM (axially symmetric aligned micro-cell) mode, an OCB mode, or the like.

Especially, performance of a display device manufactured in accordance with the present invention can be improved by using the OCB mode that can respond at high speed. FIG. 20B shows an example in which the OCB mode is applied to the liquid crystal display module of FIG. 20A, so that this liquid crystal display module becomes an FS-LCD (field sequential-LCD). The FS-LCD performs each of red, green, and blue light emissions in one frame period. An image is produced by using time division so that color display can be performed. Also, emission of respective colors is performed using a light emitting diode, a cold-cathode tube, or the like; hence, a color filter is not required. Therefore, since the arrangement of color filters of red, green, and blue is not required, nine times as many pixels can be provided in the same area as the case of using the color filters. On the other hand, light emission of three colors is performed in one frame period; thereby a high speed response of liquid crystal is required. When an FS system or an OCB mode is applied to the display device of the present invention, a high-definition display device or a high-definition liquid crystal television device having higher performance can be completed.

A liquid crystal layer of the OCB mode includes, what is called, a λ cell structure. In the λ cell structure, liquid crystal molecules are oriented such that pretilt angles of the molecules are symmetrical along the center plane between the active matrix substrate and the opposite substrate. The orientation in the π cell structure is a splay orientation when a voltage is not applied to the substrates, and shifts into a bend orientation when the voltage is applied. Further application of the voltage brings the liquid crystal molecules in the bend orientation to an orientation perpendicular to the substrates, which allows light to pass therethrough. Note that approximately ten times as high response speed than a conventional TN mode can be achieved by using the OCB mode.

Further, as a mode corresponding to the FS system, an HV-FLC, an SS-FLC, or the like using a ferroelectric liquid crystal (FLC), that can be operated at high speed, can also be used. A nematic liquid crystal that has relatively low viscosity is used for the OCB mode. A smectic liquid crystal is used for the HV-FLC or the SS-FLC. As a liquid crystal material, an FLC, a nematic liquid crystal, a smectic liquid crystal, or the like can be used.

An optical response speed of the liquid crystal display module is increased by narrowing a cell gap of the liquid crystal display module. Alternatively, the optical response speed can be increased by lowering the viscosity of the liquid crystal material. The above method of increasing the response speed is more effective in the case where a pixel (dot) pitch of a pixel region of a TN mode liquid crystal display module is 30 µm or less.

The liquid crystal display module of FIG. 20B is of a light-transmitting type, in which a red light source 2910a, a green light source 2910b, and a blue light source 2910c are provided as light sources. A controlling portion 2912 is provided in the liquid crystal display module to control switch-on or switch-off of the red light source 2910a, the green light source 2910b, and the blue light source 2910c. The light emission of respective colors is controlled by the controlling portion 2912, and light enters the liquid crystal to produce an image using the time division, thereby performing color display.

As the above described, a high-definition and highly reliable liquid crystal display module can be manufactured by using the present invention.

The present embodiment mode can be combined with any one of Embodiment Modes 1, 3, 5, and 6.

Embodiment Mode 10

Figure 21:
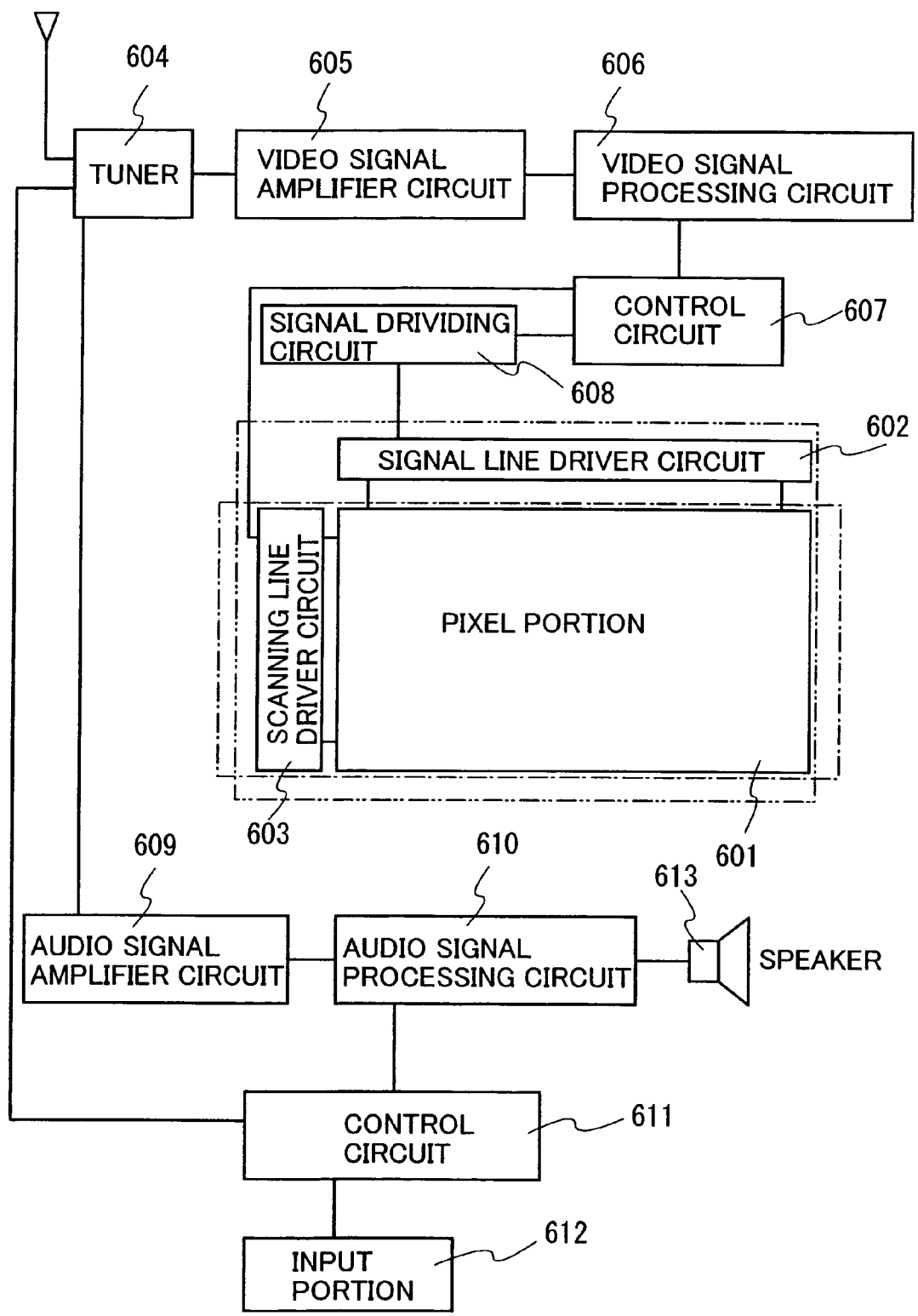
FIG. 21 is a block diagram showing a main structure of an electronic device using the present invention.

A television device can be completed by using a display device manufactured in accordance with the invention. FIG. 21 is a block diagram showing a main structure of the television device. As the structure shown in FIG. 26A, there are a case in which only a pixel portion 601 is formed and a scanning line driver circuit 603 and a signal line driver circuit 602 are mounted by the TAB method like FIG. 27B; a case in which only a pixel portion 601 is formed over a substrate and the scanning line driver circuit 603 and the signal line driver circuit 602 are mounted by the COG method like FIG. 27A; a case in which a TFT is formed as shown in FIG. 26B, the pixel portion 601 and the scanning line driver circuit 603 are also integrated with the substrate, and the signal line driver circuit 602 is independently mounted as a driver IC; and a case in which the pixel portion 601, the signal line driver circuit 602, and the scanning line driver circuit 603 are integrally formed over a substrate as shown in FIG. 26C; and the like. Any structure of the display panels may be used.

In addition, as another external circuit, a display device may include, in an input side of the video signal, a video signal amplifier circuit 605 which amplifies a video signal among signals received by a tuner 604, a video signal processing circuit 606 which converts the signals output from the video signal amplifier circuit 605 into chrominance signals corresponding to respective colors of red, green, and blue, a control circuit 607 which converts the video signal into an input specification of a driver IC, or the like. The control circuit 607 outputs signals to both a scanning line side and a signal line side. In the case of digital driving, a signal dividing circuit 608 may be provided on the signal line side and an input digital signal may be divided into m pieces to be supplied.

An audio signal among the signals received by the tuner 604 is sent to an audio signal amplifier circuit 609 and is supplied to a speaker 613 through an audio signal processing circuit 610. A control circuit 611 receives control information of a receiving station (reception frequency) or sound volume from an input portion 612 and transmits signals to the tuner 604 or the audio signal processing circuit 610.

Figure 23A:
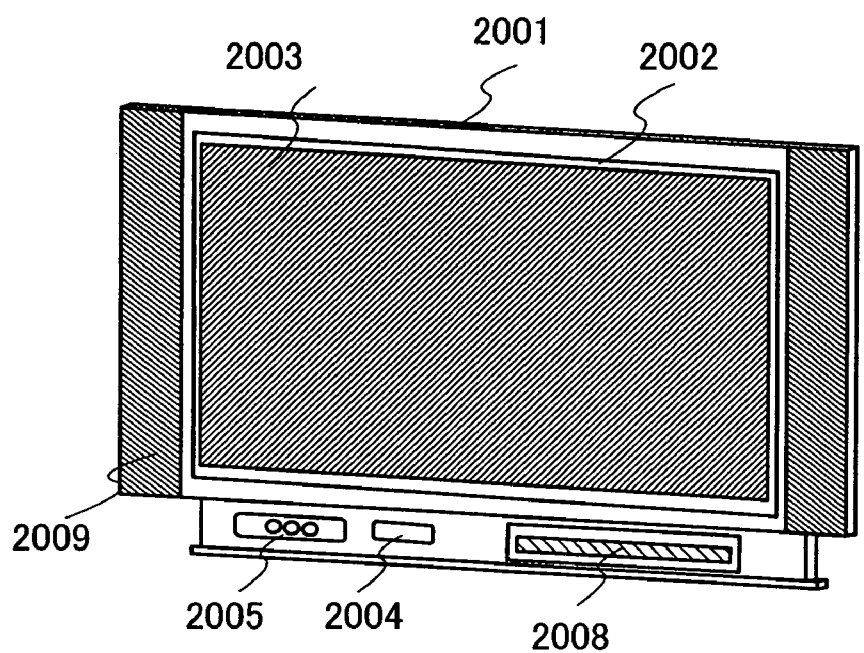
FIGS. 23A and 23B show electronic devices using the present invention.
Figure 23B:
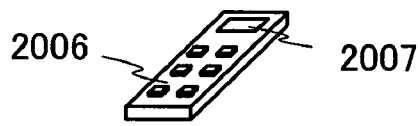
Figure 23B:
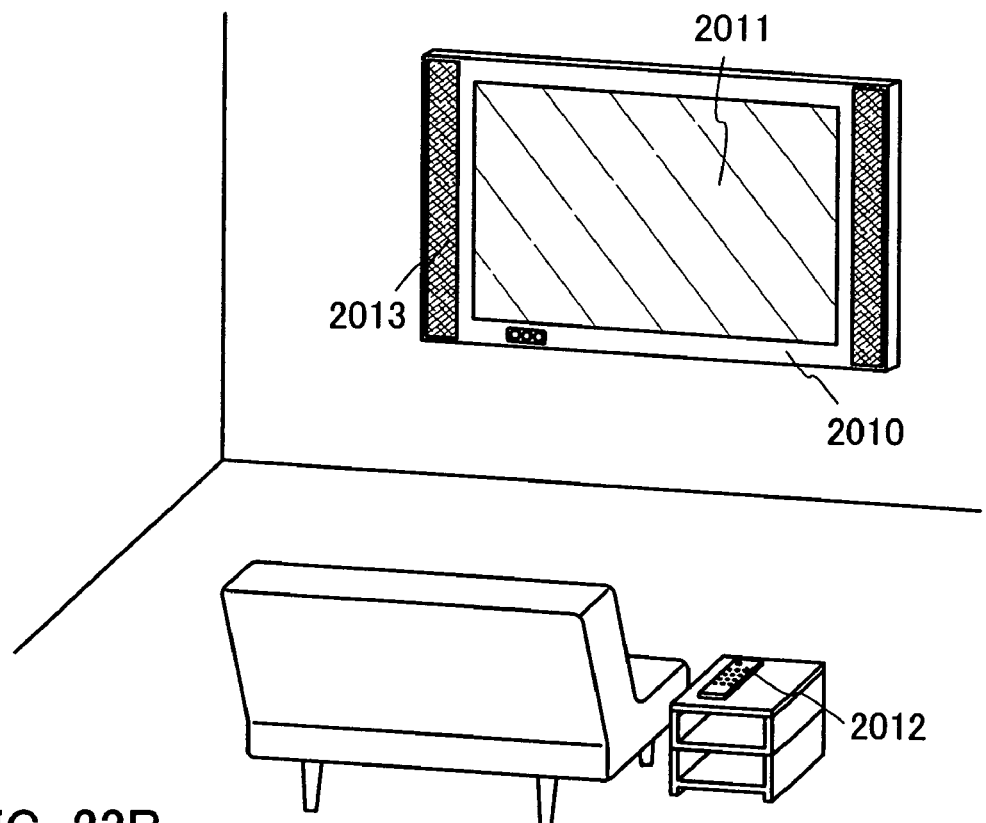

A television device can be completed by incorporating such a liquid crystal display module or an EL display module into a chassis as shown in FIGS. 23A and 23B. When the EL display module as shown in FIG. 9 is used, an EL television device can be obtained. When using a liquid crystal display module as shown in FIG. 20A or FIG. 20B, a liquid crystal television device can be obtained. A main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. By connecting to a communication network by wired or wireless connections via a modem 2004, one-way (from a sender to a receiver) or two-way (between a sender and a receiver or between receivers) information communication can be carried out. The television device can be operated by using a switch built in the chassis 2001 or a remote control unit 2006. Also, a display portion 2007 for displaying output information may also be provided in the remote control unit 2006.

Further, the television device may include a sub screen 2008 formed using a second display panel to display channels, volume, or the like, in addition to the main screen 2003. In this structure, the main screen 2003 may be formed by using an EL display panel having wide viewing angle, and the sub screen 2008 may be formed by using a liquid crystal display panel capable of displaying images with lower power consumption. In order to reduce the power consumption preferentially, the main screen 2003 may be formed by using a liquid crystal display panel, and the sub screen may be formed by using an EL display panel, which can be switched on and off. In accordance with the present invention, a highly reliable display device can be formed even when a large-sized substrate is used and a large number of TFTs or electronic parts are used.

FIG. 23B shows a television device having a large display portion, for example, with a size of 20 inches to 80 inches. The television device includes a chassis 2010, a display portion 2011, a remote control unit 2012 that is an operation portion, a speaker portion 2013, and the like. The present invention is applied to manufacturing of the display portion 2011. Since the television device in FIG. 23B is a wall-hanging type, it does not require a large installation space.

Naturally, the invention is not limited to the television device, and can be applied to various use applications; e.g., a large-sized display medium such as an information display board in a train station, an airport, or the like, or an advertisement display board on the street, as well as a monitor of a personal computer.

Embodiment Mode 11

Following the invention, various kinds of display devices can be manufactured. In other words, various kinds of electronic devices can be manufactured by incorporating such display devices of the invention in display portions of the electronic devices.

As examples of the electronic devices, a video camera; a digital camera; a projector; a head-mounted display (a goggle type display); a car navigation system; a mobile stereo; a personal computer; a game machine; a portable information terminal (such as a mobile computer, a cellular phone, or an electronic book); an image reproducing device provided with a recording medium (concretely, a device which can reproduce the recording medium such as a digital versatile disc (DVD) and includes a display portion capable of displaying images thereof); and the like can be given. Specific examples thereof are shown in FIGS. 22A to 22D.

Figure 22A:
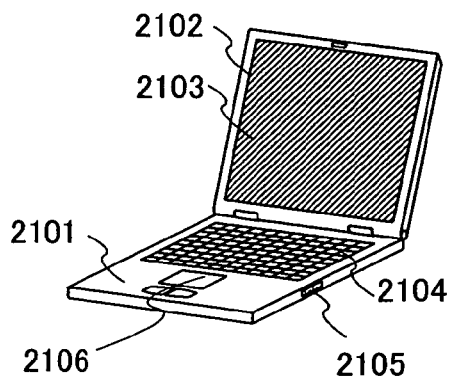
FIGS. 22A to 22D show electronic devices using the present invention.

FIG. 22A shows a personal computer, which includes a main body 2101, a chassis 2102, a display portion 2103, a keyboard 2104, an external connection port 2105, a pointing mouse 2106, or the like. The display portion 2103 can be manufactured using the invention. In accordance with the invention, a highly reliable personal computer in which a high-quality image can be displayed on the display portion 2103 can be manufactured even if the personal computer is miniaturized and a wiring or the like is formed precisely.

Figure 22B:
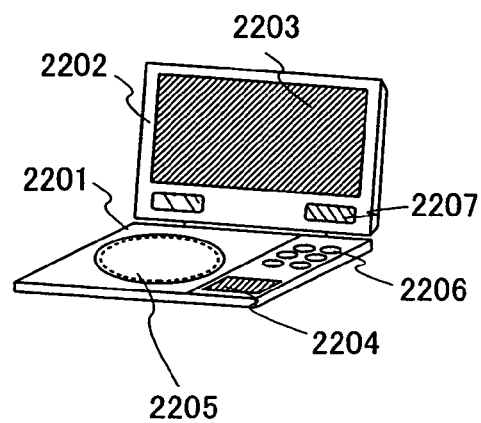

FIG. 22B shows an image reproducing device (specifically, a DVD reproducing device) including a recording medium, which includes a main body 2201, a chassis 2202, a display portion A 2203, a display portion B 2204, a recording medium (a DVD or the like) reading portion 2205, an operation key 2206, a speaker portion 2207, or the like. The display portion A 2203 mainly displays image information, while the display portion B 2204 mainly displays character information. These display portion A 2203 and display portion B 2204 can be manufactured using the invention. In accordance with the invention, a highly reliable image reproducing device in which a high-quality image can be displayed on the display portions can be manufactured even if the image reproducing device is miniaturized and a wiring or the like is formed precisely.

Figure 22C:
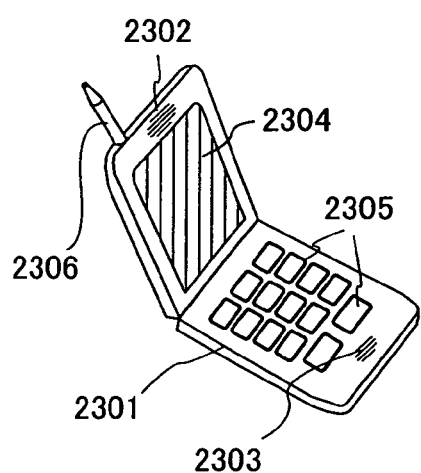

FIG. 22C shows a cellular phone, which includes a main body 2301, an audio output portion 2302, an audio input portion 2303, a display portion 2304, operation switches 2305, an antenna 2306, or the like. By applying the display device manufactured using the present invention to the display portion 2304, a highly reliable cellular phone in which a high-quality image can be displayed on the display portion 2304 can be manufactured even if the cellular phone is miniaturized and a wiring or the like is formed precisely.

Figure 22D:
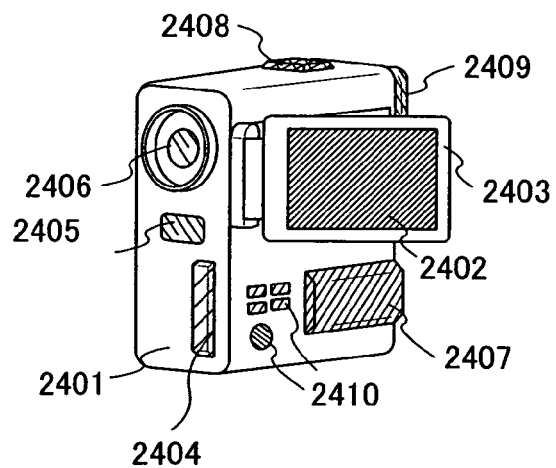

FIG. 22D shows a video camera, which includes a main body 2401, a display portion 2402, a chassis 2403, an external connection port 2404, a remote control receiver 2405, an image receiving portion 2406, a battery 2407, an audio input portion 2408, an eye piece portion 2409, operation keys 2410, or the like. The display portion 2402 can be manufactured using the invention. By applying the display device manufactured using the invention to the display portion 2402, a highly reliable video camera in which a high-quality image can be displayed on the display portion 2402 can be manufactured even if the video camera is miniaturized and a wiring or the like is formed precisely. The present embodiment mode can be freely combined with the above described embodiment mode.

Embodiment Mode 12

In accordance with the present invention, a semiconductor device functioning as a chip having a processing circuit (also referred to as a wireless chip, a wireless processor, a wireless memory, and a wireless tag) can be formed. The usage of the semiconductor device of the present invention is wide-ranging. For example, the semiconductor device of the present invention can be used by providing to paper money, coins, securities, certificates, bearer bonds, packing containers, documents, recording media, personal belongings, vehicles, foods, garments, health articles, commodities, medicines, electronic devices, or the like.

Figure 28A:
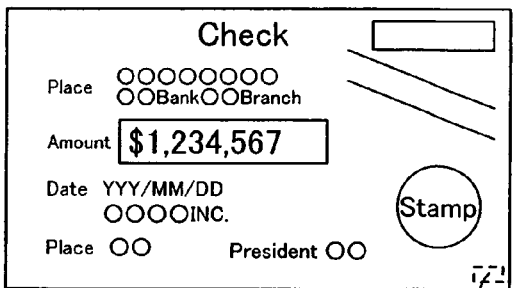
FIGS. 28A to 28G show semiconductor devices using the present invention.
Figure 28B:
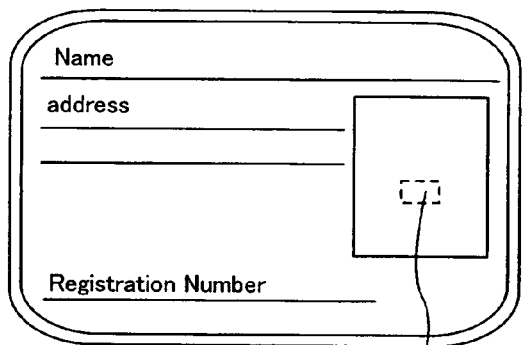
Figure 28C:
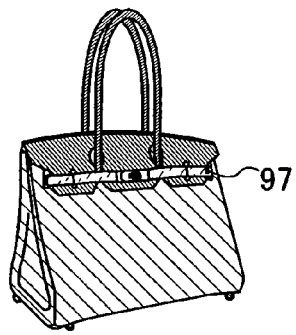
Figure 28D:
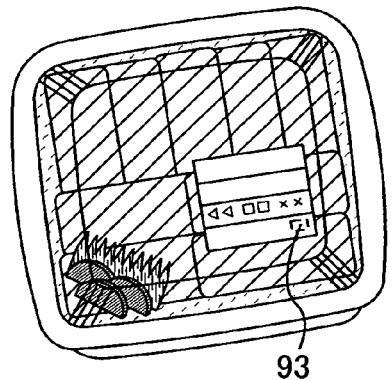
Figure 28E:
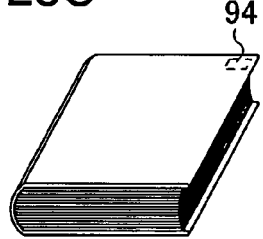
Figure 28F:
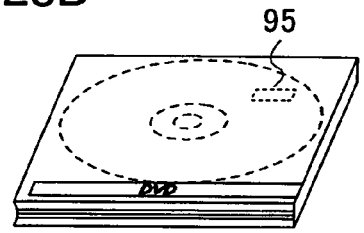
Figure 28G:
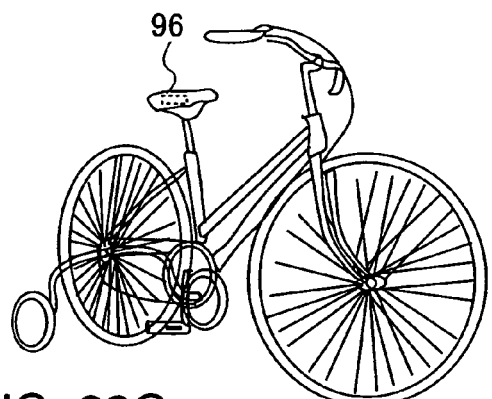

The paper money or the coins are money distributed in the market and include currency such as cash vouchers available in a certain area or memorial coins. The securities refer to checks, certificates, promissory notes, or the like, and a chip 90 having a processing circuit can be provided therein (FIG. 28A). The certificates refer to a driver's license, a certificate of residence, or the like, and a chip 91 having a processing circuit can be provided therein (FIG. 28B). The personal belongings refer to bags, glasses, or the like, and a chip 97 having a processing circuit can be provided therein (FIG. 28C). The bearer bonds refer to stamps, rice coupons, various merchandise coupons, or the like. The packing containers refer to wrapping paper for lunch boxes, plastic bottles, or the like, and a chip 93 having a processing circuit can be provided therein (FIG. 28D). The documents refer to books or the like, and a chip 94 having a processing circuit can be provided therein (FIG. 28E). The recording media refer to DVD software, a video tape, or the like, and a chip 95 having a processing circuit can be provided therein (FIG. 28F). The vehicles refer to wheeled vehicles such as bicycles, ships, or the like, and a chip 96 having a processing circuit can be provided therein (FIG. 28G). The foods refer to food articles, drinks, or the like. The garments refer to clothes, footwear, or the like. The health articles refer to medical appliances, health appliances, and the like. The commodities refer to furniture, lighting equipment, or the like. The medicines refer to medical products, pesticides, or the like. The electronic devices refer to a liquid crystal display device, an EL display device, a television device (TV sets or flat-screen TV sets), a cellular phone, or the like.

Forgery can be prevented by providing a chip having a processing circuit to each of the paper money, coins, securities, certificates, bearer bonds, and the like. The efficiency of an inspection system or a system used in a rental shop can be promoted by providing a chip having a processing circuit to each of the packing containers, documents, recording media, personal belongings, foods, commodities, electronic devices, and the like. By providing a chip having a processing circuit to each of the vehicles, health articles, medicines, and the like, counterfeits or theft can be prevented; further, medicines can be prevented from being taken mistakenly. The chip having a processing circuit is provided to the foregoing articles by attaching to their surfaces or embedding thereinto. For example, in the case of a book, the chip having a processing circuit may be embedded in a piece of paper; or in the case of a package made from an organic resin, the chip having a processing circuit may be embedded in the organic resin.

The system can have high functionality by applying the chip having a processing circuit formed in accordance with the present invention to management system or a distribution system of articles. For example, information that is recorded in a chip having a processing circuit provided in a tag is read by a reader/writer provided on the side of a conveyor belt, then information about a distribution process or a delivery destination is read out, and inspection of merchandise or distribution of goods can be easily carried out.

Figure 29:
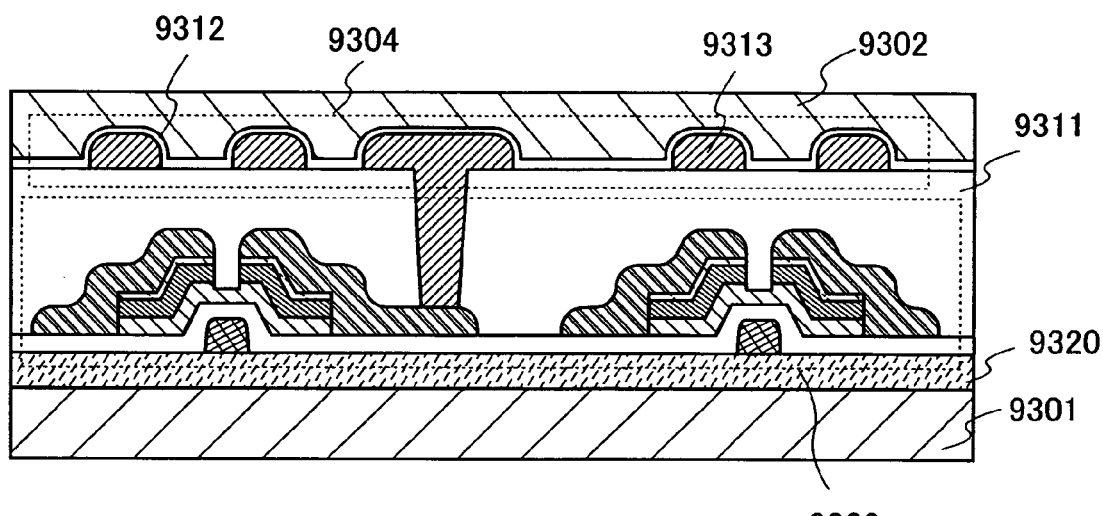
FIG. 29 shows a semiconductor device using the present invention.

FIG. 29 shows a structure of a chip having a processing circuit capable of being formed in accordance with the present invention. The chip having a processing circuit is formed of a thin film integrated circuit 9303 and an antenna 9304 connected to the thin film integrated circuit 9303. The thin film integrated circuit 9303 and the antenna 9304 are interposed between cover materials 9301 and 9302. The thin film integrated circuit 9303 may be attached to the cover material 9301 using an adhesive. In FIG. 29, one side of the thin film integrated circuit 9303 is attached to the cover material 9301 with an adhesive 9320 interposed therebetween.

The thin film integrated circuit 9303 is formed in the same manner as the TFT described in any one of the above Embodiment Modes, then, it is peeled in a peeling step, and is provided on a cover material. When source and drain electrode layers of a TFT of the thin film integrated circuit 9303 are formed by using a droplet discharge method as shown in Embodiment Mode 1, the source and drain electrode layers can be formed in predetermined position to have a distance therebetween. Since a channel width is determined depending on the distance between the source and drain electrode layers, even when the distance between the source and drain electrode layers is set short, the source and drain electrode layers can be formed without contacting with each other due to defective formation. A thin film transistor having such source and drain electrode layers can operate at high speed and have high reliability. A semiconductor element used in the thin film integrated circuit 9303 is not limited to the foregoing semiconductor element. For example, a memory element, a diode, a photoelectric conversion element, a resistor element, a coil, a capacitor element, an inductor, or the like can be used as well as a TFT.

As shown in FIG. 29, an interlayer insulating film 9311 is formed over a TFT of the thin film integrated circuit 9303, and the antenna 9304 connecting to the TFT is formed with the interlayer insulating film 9311 interposed therebetween. Further, a conductive film 9313 is formed over the interlayer insulating film 9311 and, a barrier film 9312 made of a silicon nitride film or the like is formed over the interlayer insulating film 9311 and the conductive film 9313.

The antenna 9304 is formed by discharging a droplet including a conductor of gold, silver, copper, or the like by a droplet discharge method, drying, and baking. By forming the antenna by a droplet discharge method, the number of steps can be reduced and cost can also be reduced due to the decrease in the steps.

For the cover materials 9301 and 9302, it is preferable to use a film (made of polypropylene, polyester, vinyl, polyvinyl fluoride, vinyl chloride, or the like), paper made of a fibrous material, a laminated film of a base material film (polyester, polyamide, an inorganic vapor deposition film, a variety of paper, or the like) and an adhesive synthetic resin film (an acrylic-based synthetic resin, an epoxy-based synthetic resin, or the like), or the like. The film is the one on which a sealing treatment is performed with an object by thermocompression bonding. In the case of performing a sealing treatment, an adhesion layer provided on a top surface of the film or a layer provided in an outmost layer (not the adhesion layer) is melted by a heat treatment and attached to the object by applying pressure.

By using a pollution-free material which can be incinerated such as paper, a fiber, carbon graphite, or the like for the cover material, the used chip having a processing circuit can be burned out or cut out. The chip having a processing circuiut using the foregoing material is pollution-free since it does not generate a poisonous gas when it is burned.

In FIG. 29, the chip having a processing circuit is provided over the cover material 9301 with the adhesive 9320 interposed therebetween; however, the chip having a processing circuit may be attached to an article instead of to the cover material 9301.

Embodiment 1

In Embodiment 1, an example in which a mask layer is formed by using the present invention over a substrate having a surface whose wettability is controlled is described.

Two conductive films to be processed into desired shapes are laminated over a substrate, and mask layers are formed thereover. The mask layers are formed to have a desired shape of conductive layers in consideration of forming the two parallel conductive layers by processing the conductive films.

Figure 31A:
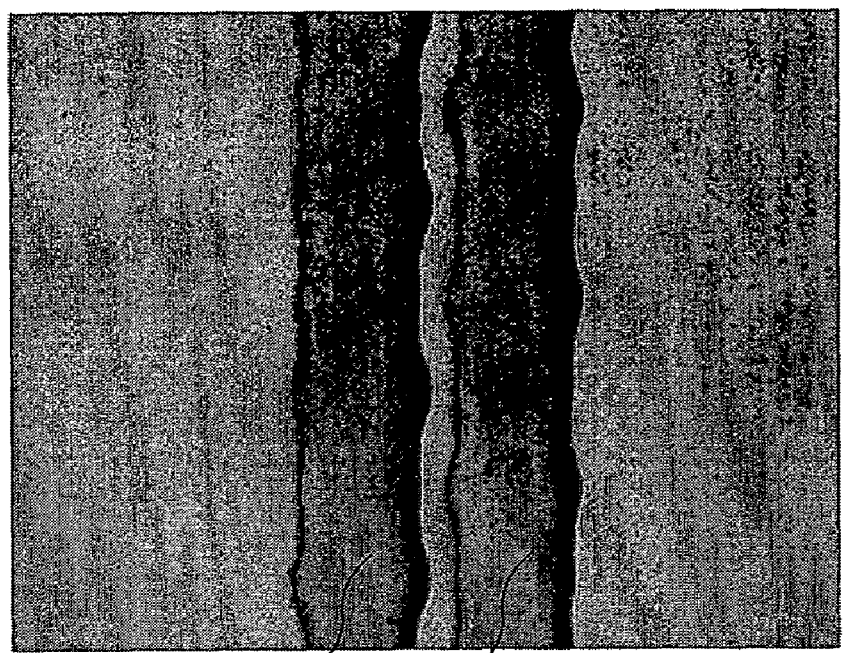
FIGS. 31A and 31B show experimental data of a sample manufactured in Embodiment 1.

A glass substrate is used as the substrate, and a first conductive film made of TaN and a second conductive film made of W are laminated. FAS is formed over the second conductive film by a coating method, and wettability of the formation region of a mask layer is controlled. A liquid composition containing a mask layer forming material is discharged, by using a droplet discharge method, to a surface of the second conductive film where the wettability is controlled. The substrate is heated at a temperature of 45° C. A main constituent of the composition containing the mask layer forming material is polyimide, and surflon and ethylene glycol-n-monobutyl ether are mixed thereto. The diameter of a droplet right after attachment of the droplet to the formation region is 70 μm. The length of an overlap of the droplets is 20 μm. FIG. 31A is an optical microscope photograph of the manufactured mask layer. As shown in FIG. 31A, mask layers 83 and 84 are formed adjacently.

Figure 31B:
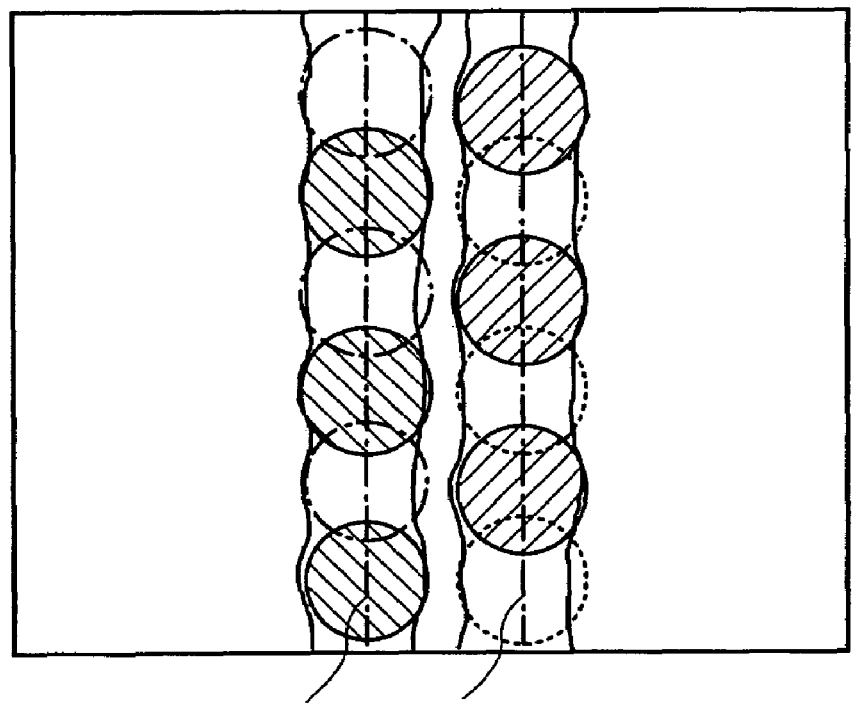
Figure 31B:
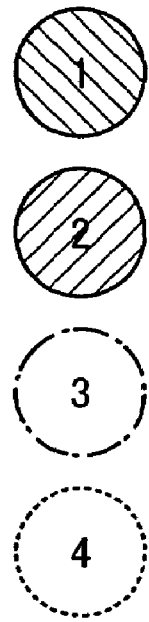

A droplet discharge method is described in detail with reference to FIG. 31B. FIG. 31B is a schematic view showing formed mask layers and the shape of droplets right after attachment of the droplets to the formation region. The droplet discharging is mainly divided into four steps, and each droplet attached in each discharging step is shown by different circles as shown aside the schematic view. A droplet discharged in a first discharging step is represented by a circle with left diagonal lines, a droplet discharged in a second discharging step is represented by a circle with right diagonal lines, a droplet discharged in a third discharging step is represented by a circle shown with a dashed line, and a droplet discharged in a fourth discharging step is represented by a circle shown with a dotted line. A centerline 85 is formed by joining centers of the droplets discharged to form the mask layer 83. Similarly, a centerline 86 is formed by joining centers of the droplets discharged to form the mask layer 84.

In each step, the droplets to be discharged in the same step are discharged so as not to connect to each other in the same step. In this embodiment, the distance between the droplets discharged in the same step is 100 μm. A droplet discharged in the third step overlaps a droplet discharged in the first step by 20 μm over the centerline 85, and a droplet discharged in the fourth step overlaps a droplet discharged in the second step by 20 μm over the centerline 86. Further, droplets in a next step are discharged so that centers of the droplets are over each of the centerlines 85 and 86 and are 50 μm away from the centers of the droplets discharged in the previous step.

The continuous mask layers 83 and 84 are not formed by one-time discharging, but they are formed by two-time dischargings. Accordingly, a liquid composition discharged previously starts solidifying by evaporation of a solvent contained in the composition as the time passes. Since a liquid composition to be discharged to overlap the composition discharged previously has higher fluidity, it flows toward the composition discharged previously and does not keep a shape at the time when it is attached to the formation region. Therefore, as shown in FIG. 31A, the mask layers 83 and 84 having knots, which has large line width at a region of the composition discharged previously and small line width at a region of the composition discharged later, are formed.

In this embodiment, in forming mask layers adjacent to each other, droplets to be discharged in the second step are discharged so that centers of the droplets are over each of the centerlines 85 and 86 and are away from centers of droplets discharged in the first step. Therefore, the widest line width positions of knots included in each of the mask layers 83 and 84 are different from each other, the mask layers 83 and 84 are formed without contact with each other and with distance therebetween. Accordingly, it is confirmed in this embodiment that mask layers and conductive layers having desired shapes can be manufactured without a problem of electric characteristics or the like due to defective formation or the like.

When such mask layers 83 and 84 are used to process the first and second conductive films, conductive layers having desired shapes with a short distance therebetween can be formed without defective formation. Since the distance between the conductive layers can be reduced, a channel width can be reduced by using the conductive layers as source and drain electrode layers. Therefore, a highly reliable semiconductor device, which can operate at high speed with high performance, can be manufactured. Since the number of faults due to defective formation is decreased in a manufacturing process, there are effects of improving yield and increasing productivity.

Embodiment 2

In Embodiment 2, an example of a thin film transistor in which source and drain electrode layers are formed by using the mask layers formed in Embodiment 1 is described.

Figure 32A:
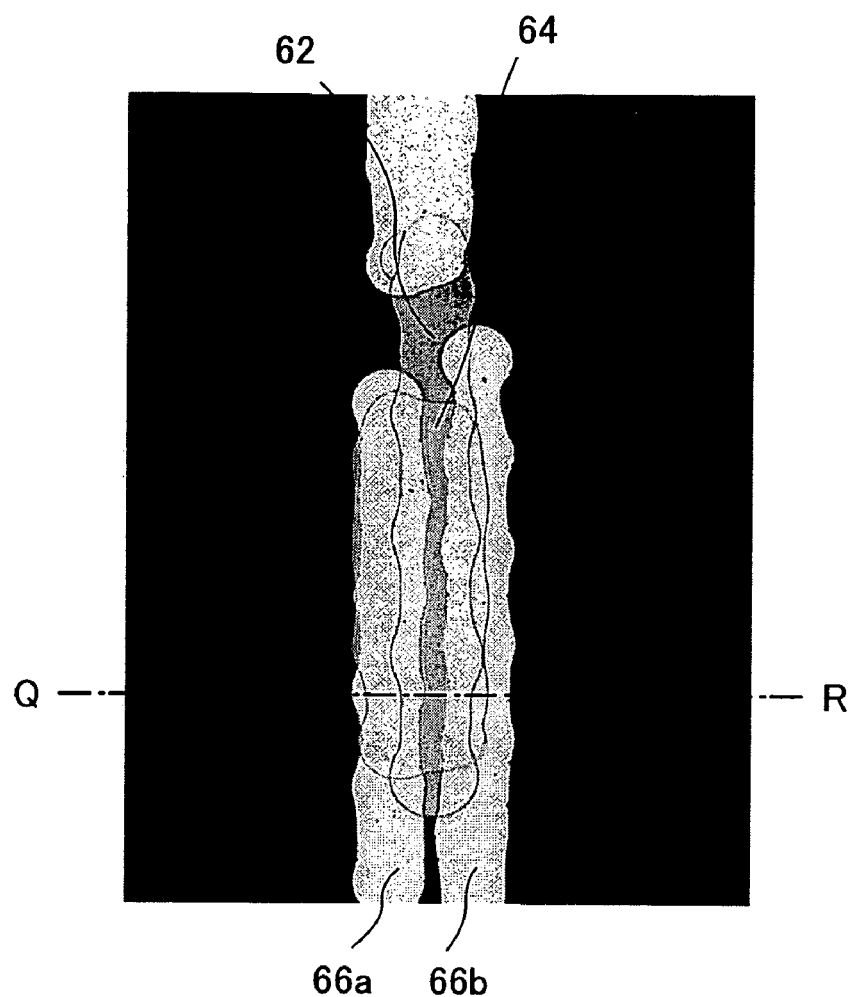
FIGS. 32A and 32B show experimental data of a sample manufactured in Embodiment 1.
Figure 32B:
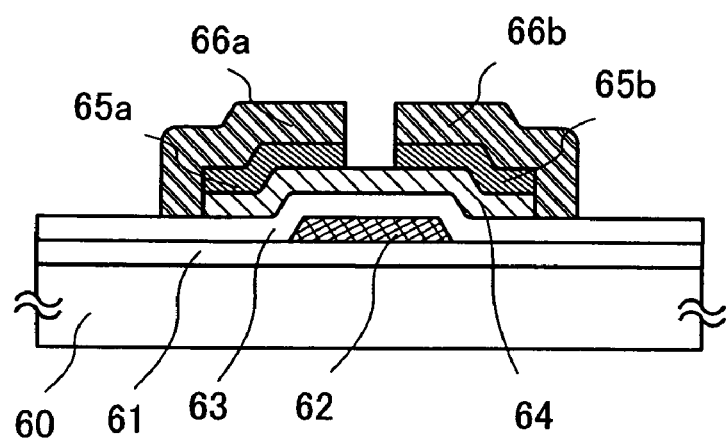

FIGS. 32A and 32B show the thin film transistor formed in this embodiment. FIG. 32A is a photograph of the thin film transistor taken with an optical microscope, and FIG. 32B is a schematic view of a section taken along line Q-R in FIG. 32A. The thin film transistor manufactured in this embodiment is formed over an insulating layer 61, which is formed over a substrate 60 made of a glass substrate, and includes a gate electrode layer 62, a gate insulating layer 63, a semiconductor layer 64, semiconductor layers having one conductivity type 65a and 65b, and source or drain electrode layers 66a and 66b.

Figure 33:
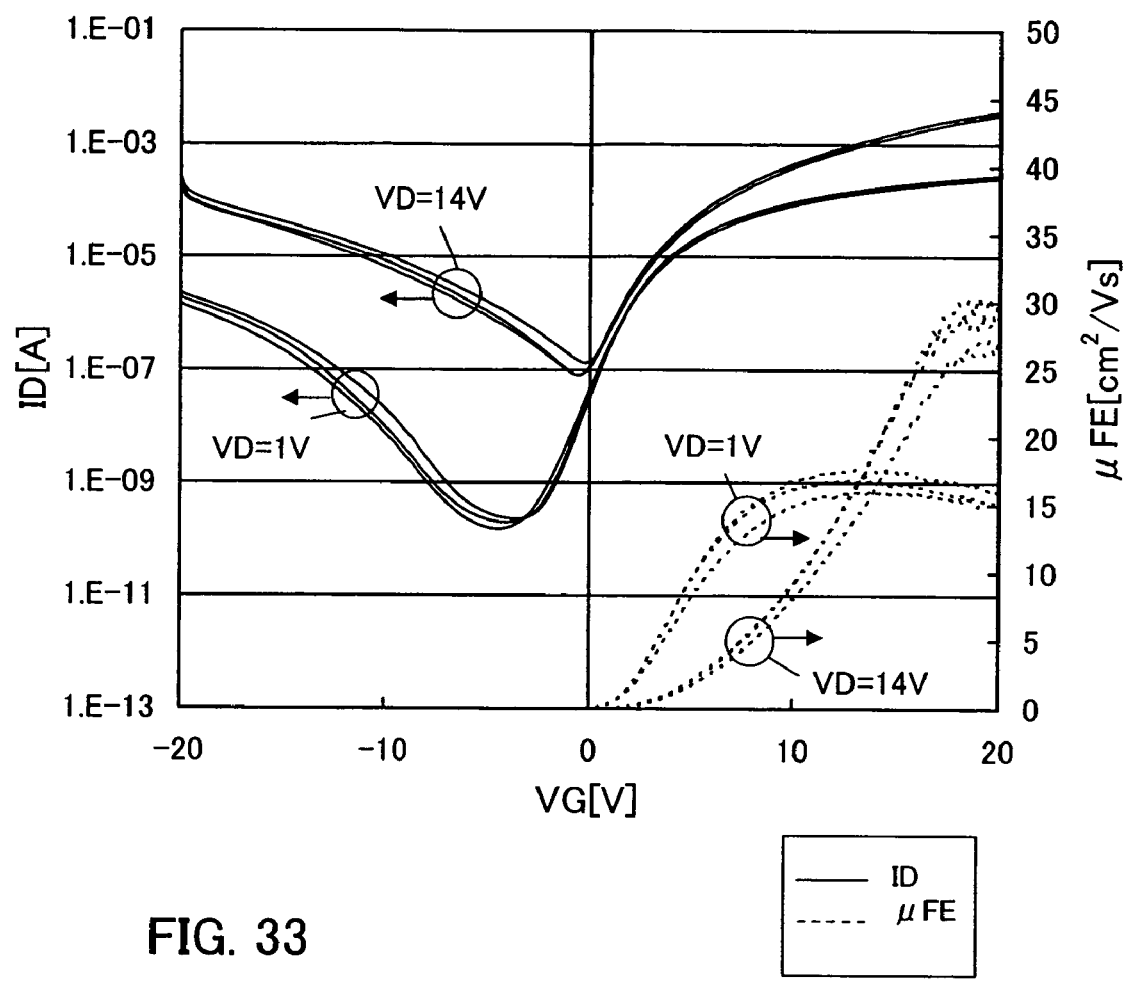
FIG. 33 shows experimental data of a sample manufactured in Embodiment 1.

In addition, characteristics shown in FIG. 33 can be obtained from the thin film transistor manufactured in this embodiment. Three samples are used in the measurement. A solid line in FIG. 33 shows variation of a drain current (hereinafter also referred to as ID) value with respect to a gate voltage (hereinafter also referred to as VG) at drain voltage (hereinafter also referred to as VD) values of 1V and 14V.

Meanwhile, a dotted line in FIG. 33 shows variation of field effect mobility (hereinafter also referred to as μFE) with respect to the VG value at the VD values of 1V and 14V.

The insulating layer 61 is formed with a thickness of 100 nm by using silicon oxynitride (SiON), the gate electrode layer 62 is formed with a thickness of 100 nm by using tungsten, and the semiconductor layer 64 is formed with a thickness of 100 nm by using an amorphous silicon film. The semiconductor layers 65a and 65b having one conductivity type is formed with a thickness of 100 nm by using an n-type semiconductor layer. The source or drain electrode layers 66a and 66b are formed by laminating 100 nm of a molybdenum film and 100 nm of an aluminum film.

In this embodiment, the source or drain electrode layers 66a and 66b are processed by using the mask layers having desired shapes, which are arranged with a short distance therebetween as shown in Embodiment 1 and do not cause defective formation. Thus, the distance between the source or drain electrode layers 66a and 66b can be reduced, and a channel width can be reduced accordingly. Therefore, a highly reliable semiconductor device, which can operate at high speed with high performance, can be manufactured. Since the number of faults due to defective formation is decreased in a manufacturing process, there are effects of improving yield and increasing productivity.

What is claimed is:

1. A semiconductor device comprising:
   a source electrode layer having a plurality of widths and curving in at least one portion, and
   a drain electrode layer having a plurality of widths and curving in at least one portion,
   wherein the source electrode layer is symmetrical along a centerline of the source electrode layer,
   wherein the drain electrode layer is symmetrical along a centerline of the drain electrode layer, and
   wherein side surfaces of the source electrode layer and the drain electrode layer provided adjacent to each other have curvatures in a same direction.

2. An semiconductor device according to claim 1, wherein the semiconductor device is incorporated into a display device, a video camera, a digital camera, a personal computer, or a portable information terminal.

3. A semiconductor device according to claim 1, wherein a distance between the source electrode layer and the drain electrode layer is uniform.

4. A semiconductor device comprising:
   a source electrode layer in which width is continuously varied, and
   a drain electrode layer in which width is continuously varied,
   wherein side portions of the source electrode layer and the drain electrode layer each have a continuous wave shape, and
   wherein side surfaces of the source electrode layer and the drain electrode layer provided adjacent to each other have curvatures in a same direction.

5. An semiconductor device according to claim 4, wherein the semiconductor device is incorporated into a display device, a video camera, a digital camera, a personal computer, or a portable information terminal.

6. A semiconductor device according to claim 4, wherein a distance between the source electrode layer and the drain electrode layer is uniform.

7. A semiconductor device comprising:
   a source electrode layer in which width is continuously varied, and
   a drain electrode layer in which width is continuously varied,
   wherein side portions of the source electrode layer and the drain electrode layer each have a continuous wave shape,
   wherein portions of the source electrode layer having widest widths are aligned with portions of the drain electrode layer having narrowest widths in a width direction of the source electrode layer and the drain electrode layer, and
   wherein side surfaces of the source electrode layer and the drain electrode layer provided adjacent to each other have curvatures in a same direction.

8. A semiconductor device according to claim 7 wherein portions of the source electrode layer having narrowest widths are aligned with portions of the drain electrode layer having widest widths in a width direction of the source electrode layer and the drain electrode layer.

9. An semiconductor device according to claim 7, wherein the semiconductor device is incorporated into a display device, a video camera, a digital camera, a personal computer, or a portable information terminal.

10. A semiconductor device comprising:
    a gate electrode layer;
    a gate insulating layer;
    a semiconductor layer;
    a source electrode layer; and
    a drain electrode layer,
    wherein the source and the drain electrode layers have a plurality of widths and curve in at least one portion,
    wherein the source electrode layer is symmetrical along a centerline,
    wherein the drain electrode layer is symmetrical along a centerline, and
    wherein side surfaces of the source and drain electrode layers provided adjacent to each other have curvatures in a same direction.

11. An semiconductor device according to claim 10, wherein the semiconductor device is incorporated into a display device, a video camera, a digital camera, a personal computer, or a portable information terminal.

12. A semiconductor device according to claim 10, wherein a distance between the source and the drain electrode layers is uniform.

13. A semiconductor device comprising:
    a gate electrode layer;
    a gate insulating layer;
    a semiconductor layer;
    a source electrode layer; and
    a drain electrode layer,
    wherein widths of the source and the drain electrode layers are continuously varied, and
    wherein side surfaces of the source and drain electrode layers provided adjacent to each other have curvatures in a same direction.

14. An semiconductor device according to claim 13, wherein the semiconductor device is incorporated into a display device, a video camera, a digital camera, a personal computer, or a portable information terminal.

15. A semiconductor device according to claim 13, wherein a distance between the source and the drain electrode layers is uniform.

* * * * *

UNITED STATES PATENT AND TRADEMARK OFFICE
CERTIFICATE OF CORRECTION

PATENT NO.       : 7,635,889 B2                                         Page 1 of 1
APPLICATION NO.  : 11/333701
DATED            : December 22, 2009
INVENTOR(S)      : Isa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 801 days.

Signed and Sealed this

Ninth Day of November, 2010

David J. Kappos
*Director of the United States Patent and Trademark Office*